United States Patent
Chui et al.

(10) Patent No.: US 7,612,932 B2
(45) Date of Patent: Nov. 3, 2009

(54) MICROELECTROMECHANICAL DEVICE WITH OPTICAL FUNCTION SEPARATED FROM MECHANICAL AND ELECTRICAL FUNCTION

(75) Inventors: Clarence Chui, San Jose, CA (US); Denis Endisch, Cupertino, CA (US); Lior Kogut, Haifa (IL); Ming-Hau Tung, San Francisco, CA (US); Yeh-Jiun Tung, Santa Clara, CA (US); Chih-Wei Chiang, Hsin-Chu (TW)

(73) Assignee: IDC, LLC, San Francisco, CA (US)

( * ) Notice: Subject to any disclaimer, the term of this patent is extended or adjusted under 35 U.S.C. 154(b) by 63 days.

(21) Appl. No.: 11/772,730

(22) Filed: Jul. 2, 2007

(65) Prior Publication Data
US 2008/0013144 A1    Jan. 17, 2008

Related U.S. Application Data

(63) Continuation-in-part of application No. 11/057,045, filed on Feb. 11, 2005, now Pat. No. 7,289,259.

(60) Provisional application No. 60/613,372, filed on Sep. 27, 2004.

(51) Int. Cl.
*G02B 26/00* (2006.01)
*G02B 26/08* (2006.01)

(52) U.S. Cl. .................. 359/290; 359/198; 359/224

(58) Field of Classification Search .......... 359/198, 359/224, 290, 295
See application file for complete search history.

(56) References Cited

U.S. PATENT DOCUMENTS

| | | | |
|---|---|---|---|
| 3,728,030 A | 4/1973 | Hawes | |
| 3,955,190 A | 5/1976 | Teraishi | |
| 3,955,880 A | 5/1976 | Lierke | |
| 4,403,248 A | 9/1983 | te Velde | |
| 4,441,791 A | 4/1984 | Hornbeck | |
| 4,786,128 A | 11/1988 | Birnbach | |
| 4,859,060 A | 8/1989 | Katagiri et al. | |
| 4,954,789 A | 9/1990 | Sampsell | |
| 4,956,619 A | 9/1990 | Hornbeck | |
| 4,982,184 A | 1/1991 | Kirkwood | |
| 5,022,745 A | 6/1991 | Zahowski et al. | |
| 5,028,939 A | 7/1991 | Hornbeck et al. | |
| 5,091,983 A | 2/1992 | Lukosz | |

(Continued)

FOREIGN PATENT DOCUMENTS

EP          1 122 577          8/2001

(Continued)

OTHER PUBLICATIONS

European Search Report for EP 05 25 5637.

(Continued)

*Primary Examiner*—William C Choi
(74) *Attorney, Agent, or Firm*—Knobbe Martens Olson & Bear, LLP

(57) ABSTRACT

A microelectromechanical (MEMS) device includes a first reflective layer, a movable element, and an actuation electrode. The movable element is over the first reflective layer. The movable element includes a deformable layer and a reflective element. The actuation electrode is between the deformable layer and the reflective element.

36 Claims, 38 Drawing Sheets

U.S. PATENT DOCUMENTS

| | | |
|---|---|---|
| 5,096,279 A | 3/1992 | Hornbeck et al. |
| 5,315,370 A | 5/1994 | Bulow |
| 5,381,232 A | 1/1995 | Van Wijk |
| 5,471,341 A | 11/1995 | Warde et al. |
| 5,526,172 A | 6/1996 | Kanack |
| 5,559,358 A | 9/1996 | Burns et al. |
| 5,636,052 A | 6/1997 | Arney et al. |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,710,656 A | 1/1998 | Goosen |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 5,986,796 A | 11/1999 | Miles |
| 6,028,689 A | 2/2000 | Michalicek et al. |
| 6,040,937 A | 3/2000 | Miles |
| 6,055,090 A | 4/2000 | Miles |
| 6,097,145 A | 8/2000 | Kastalsky et al. |
| 6,195,196 B1 | 2/2001 | Kimura et al. |
| 6,262,697 B1 | 7/2001 | Stephenson |
| 6,327,071 B1 | 12/2001 | Kimura |
| 6,356,378 B1 | 3/2002 | Huibers |
| 6,384,952 B1 | 5/2002 | Clark et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,791,735 B2 * | 9/2004 | Stappaerts .................. 359/245 |
| 6,794,119 B2 | 9/2004 | Miles |
| 6,841,081 B2 | 1/2005 | Chang et al. |
| 6,844,959 B2 | 1/2005 | Huibers et al. |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 6,983,135 B1 | 1/2006 | Tsai et al. |
| 7,006,272 B2 | 2/2006 | Tsai |
| 7,008,812 B1 | 3/2006 | Carley |
| 7,053,737 B2 | 5/2006 | Schwartz et al. |
| 7,075,700 B2 | 7/2006 | Muenter |
| 7,119,945 B2 | 10/2006 | Kothari et al. |
| 7,123,216 B1 | 10/2006 | Miles |
| 7,126,738 B2 | 10/2006 | Miles |
| 7,126,741 B2 | 10/2006 | Wagner et al. |
| 7,130,104 B2 | 10/2006 | Cummings |
| 7,184,202 B2 | 2/2007 | Miles et al. |
| 7,198,873 B2 | 4/2007 | Geh et al. |
| 7,221,495 B2 | 5/2007 | Miles et al. |
| 7,236,284 B2 | 6/2007 | Miles |
| 7,289,259 B2 | 10/2007 | Chui et al. |
| 7,372,613 B2 | 5/2008 | Chui et al. |
| 7,372,619 B2 | 5/2008 | Miles |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0015215 A1 | 2/2002 | Miles |
| 2002/0024711 A1 | 2/2002 | Miles |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2003/0016428 A1 | 1/2003 | Kato et al. |
| 2003/0029705 A1 | 2/2003 | Qiu et al. |
| 2003/0035196 A1 | 2/2003 | Walker |
| 2003/0043157 A1 | 3/2003 | Miles |
| 2003/0053078 A1 | 3/2003 | Missey et al. |
| 2003/0072070 A1 | 4/2003 | Miles |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0051929 A1 | 3/2004 | Sampsell et al. |
| 2004/0058532 A1 | 3/2004 | Miles et al. |
| 2004/0075967 A1 | 4/2004 | Lynch et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin et al. |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0207897 A1 | 10/2004 | Lin |
| 2004/0209195 A1 | 10/2004 | Lin |
| 2004/0217919 A1 | 11/2004 | Piehl et al. |
| 2004/0218251 A1 | 11/2004 | Piehl et al. |
| 2004/0240032 A1 | 12/2004 | Miles |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0078348 A1 | 4/2005 | Lin |
| 2005/0168849 A1 | 8/2005 | Lin |
| 2005/0195462 A1 | 9/2005 | Lin |
| 2005/0249966 A1 | 11/2005 | Tung et al. |
| 2006/0007517 A1 | 1/2006 | Tsai |
| 2006/0024880 A1 | 2/2006 | Chui et al. |
| 2006/0065940 A1 | 3/2006 | Kothari |
| 2006/0066935 A1 | 3/2006 | Cummings et al. |
| 2006/0066937 A1 | | |
| 2006/0067633 A1 | 3/2006 | Gally et al. |
| 2006/0067651 A1 | 3/2006 | Chui et al. |
| 2006/0076311 A1 | 4/2006 | Tung et al. |
| 2006/0077155 A1 | 4/2006 | Chui et al. |
| 2006/0077507 A1 | 4/2006 | Chui et al. |
| 2006/0077508 A1 | 4/2006 | Chui et al. |
| 2006/0220160 A1 | 10/2006 | Miles |
| 2006/0262380 A1 | 11/2006 | Miles |
| 2006/0268388 A1 | 11/2006 | Miles |
| 2006/0274074 A1 | 12/2006 | Miles |
| 2007/0040777 A1 | 2/2007 | Cummings |
| 2007/0177247 A1 | 8/2007 | Miles |
| 2008/0013145 A1 | 1/2008 | Chui et al. |

| | | | |
|---|---|---|---|
| 2008/0037093 | A1 | 2/2008 | Miles |
| 2008/0080043 | A1 | 4/2008 | Chui et al. |
| 2008/0088904 | A1 | 4/2008 | Miles |
| 2008/0088910 | A1 | 4/2008 | Miles |
| 2008/0088911 | A1 | 4/2008 | Miles |
| 2008/0088912 | A1 | 4/2008 | Miles |
| 2008/0106782 | A1 | 5/2008 | Miles |
| 2008/0247028 | A1 | 10/2008 | Chui et al. |
| 2009/0009845 | A1 | 1/2009 | Endisch et al. |

FOREIGN PATENT DOCUMENTS

| | | |
|---|---|---|
| EP | 1 275 997 | 1/2003 |
| EP | 1 640 763 | 3/2006 |
| FR | 2 824 643 A | 11/2002 |
| JP | 04-276721 | 10/1992 |
| JP | 211999 | 11/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2003 195201 | 7/2003 |
| JP | 2004-212638 | 7/2004 |
| JP | 2004-212680 | 7/2004 |
| WO | WO 99/52006 | 10/1999 |
| WO | WO 99/52006 A2 | 10/1999 |
| WO | WO 99/52006 A3 | 10/1999 |
| WO | WO 03/014789 A2 | 2/2003 |
| WO | WO 03/069413 A1 | 8/2003 |
| WO | WO 2004/026757 A2 | 4/2004 |
| WO | WO 2005/006364 A1 | 1/2005 |
| WO | WO 2006/036386 | 4/2006 |
| WO | WO 2008/057228 | 5/2008 |

OTHER PUBLICATIONS

Jerman, J.H. et al., "Miniature Fabry-Perot Interferometers Micromachined in Silicon for Use in Optical Fiber WDM Systems" Transcucers, San Francisco, Jun. 24-27, 1991,, Proceedings of the International Conference on Solid State Sensors and Actuators, New York, IEEE, US, vol. Conf. 6, Jun. 24, 1991, pp. 372-375, XP000608532.
Office Action for U.S. Appl. No. 11/057,045, dated Jul. 27, 2006.
Office Action for U.S. Appl. No. 11/057,045, dated Feb. 27, 2006.
Office Action for U.S. Appl. No. 11/112,734, dated Apr. 20, 2007.
Office Action dated May 9, 2008 in Chinese App. No. 200510103445.3.
Conner, "Hybrid Color Display Using Optical Interference Filter Array," SID Digest, pp. 577-580 (1993).
Jerman et al., "A Miniature Fabry-Perot Interferometer with a Corrugated Silicon Diaphragm Support", (1988).
Miles, Mark, W., "A New Reflective FPD Technology Using Interferometric Modulation", The Proceedings of the Society for Information Display (May 11-16, 1997).
Notice of Reasons for Rejection in Japanese App. No. 2005-233651, dated Aug. 19, 2008.
ISR and WO for PCT/US08/068062, filed Jun. 24, 2008.
Pape et al., Characteristics of the deformable mirror device for optical information processing, Optical Engineering, 22(6):676-681, Nov.-Dec. 1983.
Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.
Miles, Interferometric modulation: MOEMS as an enabling technology for high performance reflective displays, Proceedings of SPIE, vol. 4985, pp. 131-139, 2003.
Office Action dated Dec. 26, 2008, 2008 in Chinese App. No. 200510103445.3.
International Search Report and Written Opinion for PCT Application No. PCT/US2008/068061, dated Mar. 24, 2009.
International Search Report and Written Opinion for PCT Application No. PCT/US2008/068062, dated Sep. 19, 2008.
International Search Report and Written Opinion for PCT Application No. PCT/US2008/068063, dated Sep. 19, 2008.
Miles, "A mems based interferometric modulator (IMOD) for display applications" *Proceedings of Sensors Expo*, Oct. 21, 1997 (281-284).
Office Action for U.S. Appl. No. 11/772,751, dated Jan. 15, 2009.
Search Report for European Patent Application No. 08153252.5, dated Mar. 25, 2009.
Extended European Search Report for European Patent Application No. 05255648.7, dated May 4, 2009.

* cited by examiner

US 7,612,932 B2

MICROELECTROMECHANICAL DEVICE WITH OPTICAL FUNCTION SEPARATED FROM MECHANICAL AND ELECTRICAL FUNCTION

CROSS-REFERENCE TO RELATED APPLICATIONS

This application is a continuation-in-part of U.S. patent application Ser. No. 11/057,045, filed Feb. 11, 2005, which claims the benefit of U.S. Provisional Application No. 60/613,372, filed Sep. 27, 2004, which are incorporated herein by reference in their entirety.

BACKGROUND

Microelectromechanical systems (MEMS) include micromechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be partially transparent and capable of relative motion upon application of an appropriate electrical signal. In a particular embodiment, one plate may comprise a stationary layer deposited on a substrate, the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In certain embodiments, a microelectromechanical (MEMS) device comprises a first reflective layer, a movable element, and an actuation electrode. The movable element is over the first reflective layer. The movable element comprises a deformable layer and a reflective element. The actuation electrode is between the deformable layer and the reflective element.

In certain embodiments, a microelectromechanical (MEMS) device comprises means for moving a portion of the device, second means for reflecting light, and means for actuating the moving means. The moving means comprises means for deforming and first means for reflecting light. The actuating means is between the deforming means and the first reflecting means.

In certain embodiments, a method of manufacturing a microelectromechanical (MEMS) device comprises forming a first sacrificial layer over a reflective layer, forming a reflective element over the first sacrificial layer, forming a second sacrificial layer over the reflective element, forming an actuation electrode over the second sacrificial layer, forming a third sacrificial layer over the actuation electrode, forming a deformable layer over the third sacrificial layer, and removing the first, second, and third sacrificial layers. The deformable layer is mechanically coupled to the reflective element.

In certain embodiments, a method of modulating light comprises providing a display element comprising a reflective layer, a movable element over the reflective layer, and an actuation electrode. The movable element comprises a deformable layer and a reflective element. The actuation electrode is between the deformable layer and the reflective element. The method further comprises applying a voltage to the actuation electrode. The voltage generates a first attractive force in a first direction on a first portion of the movable element and generates a second attractive force in a second direction on a second portion of the movable element. The second direction is substantially opposite to the first direction. The first attractive force is greater than the second attractive force, which thereby causes the movable element to move generally in the first direction.

DETAILED DESCRIPTION OF CERTAIN EMBODIMENTS

Figure 1:
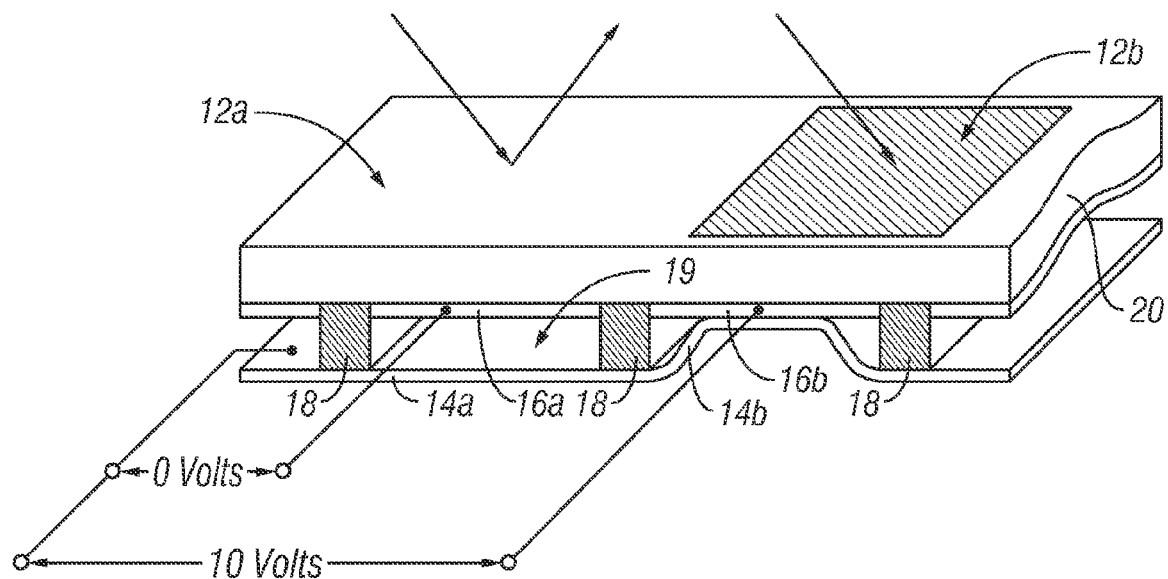
FIG. 1 is an isometric view depicting a portion of one embodiment of an interferometric modulator display in which a movable reflective layer of a first interferometric modulator is in a released position and a movable reflective layer of a second interferometric modulator is in an actuated position.

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices. Moreover, all figures herein have been drawn to depict the relationships between certain elements, and therefore are highly diagrammatic and should not be considered to be to scale.

In certain embodiments, an actuation electrode disposed between the reflective surface and the deformable layer of a movable element is provided. The actuation electrode is not in the optical path, which allows it to comprise a non-transparent conductor and to be thicker, thereby improving power consumption. The actuation electrode acts on the deformable layer or the reflective element depending on the distance between the actuation electrode and the deformable layer and the distance between the actuation electrode and the deformable layer or shielding between the actuation electrode and either the reflective element or the deformable layer. In some embodiments, the deformable layer, rather than the reflective surface, contacts a stationary portion of the MEMS device upon actuation, which reduces, in turn, stiction, spring constant, electrostatic force, and capacitor area, thus enabling fast and low power operation. In some embodiments, surface roughening and other anti-stiction features may be formed between the actuation electrode and the deformable layer or between the actuation electrode and an upper surface of the reflective element without impacting optical performance because the features are not in the optical path. In some embodiments, the reflective surface does not contact anything upon actuation, allowing it to be substantially smooth and flat without the danger of stiction. In some embodiments, a second actuation electrode is provided above or below the deformable layer and/or the reflective surface such that the reflective surface is stable in at least three states.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as the optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more layers of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the deformable metal layers 14a, 14b are separated from the optical stacks 16a, 16b by a defined air gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
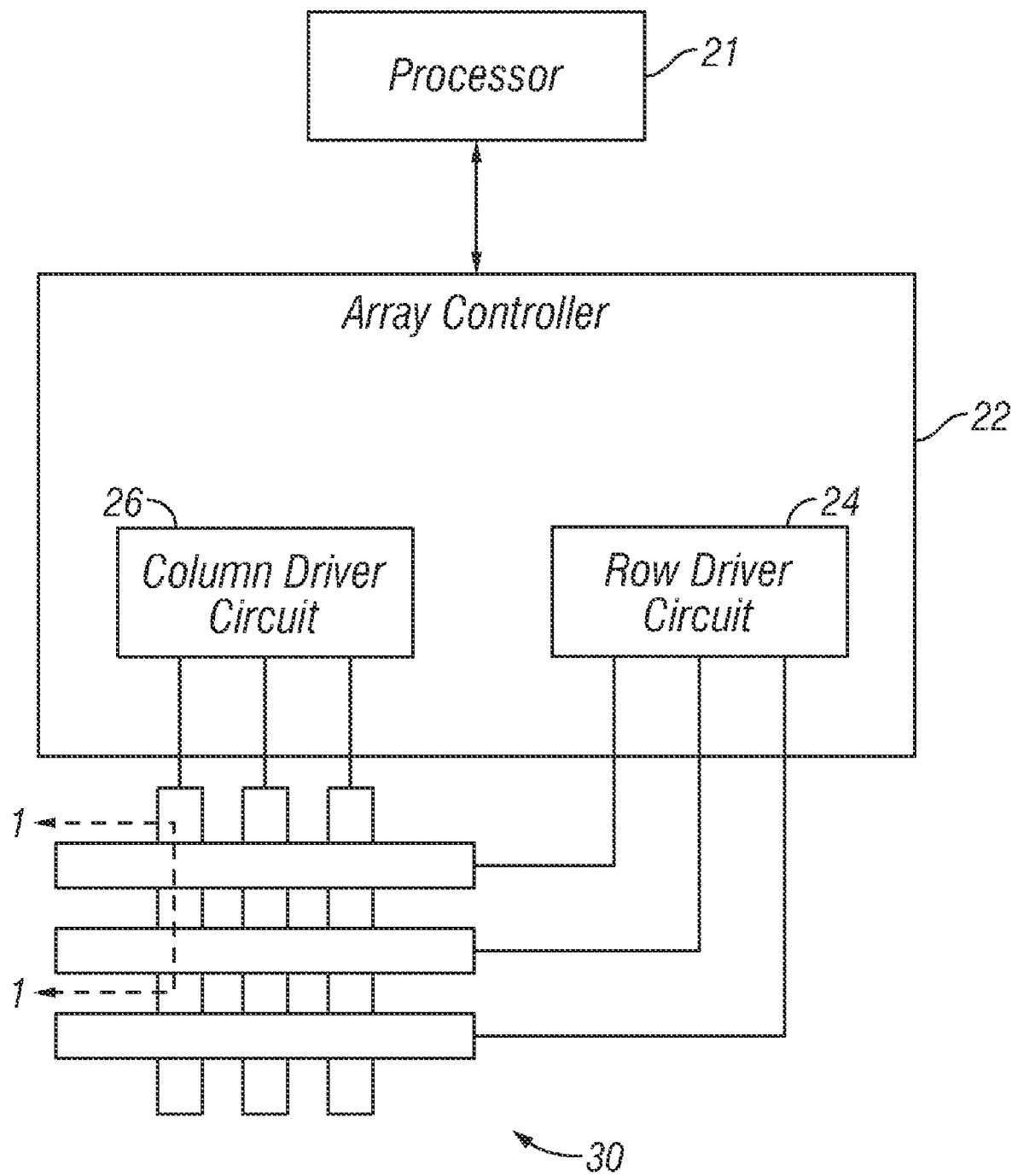
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
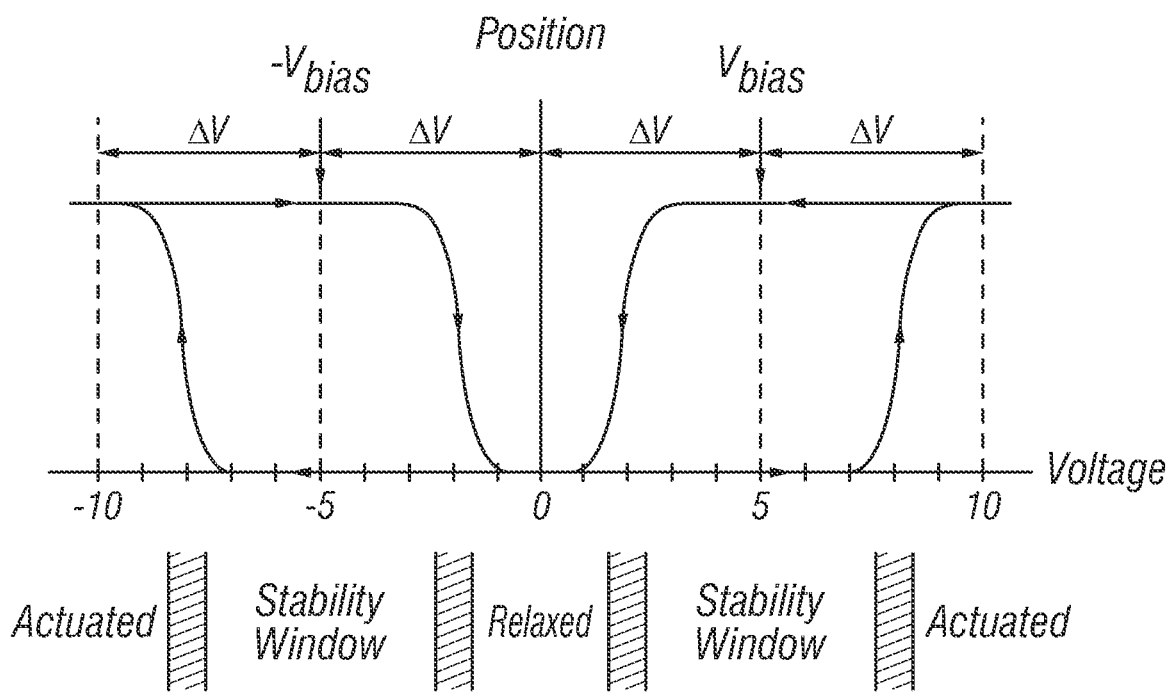
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
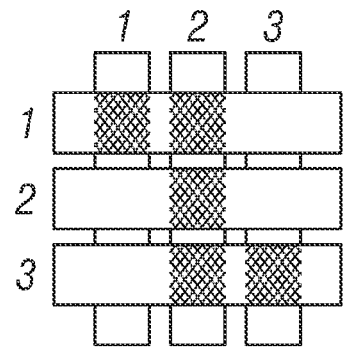
FIGS. 5A and 5B illustrate one exemplary timing diagram for row and column signals that may be used to write a frame of display data to the 3×3 interferometric modulator display of FIG. 3.
Figure 5B:
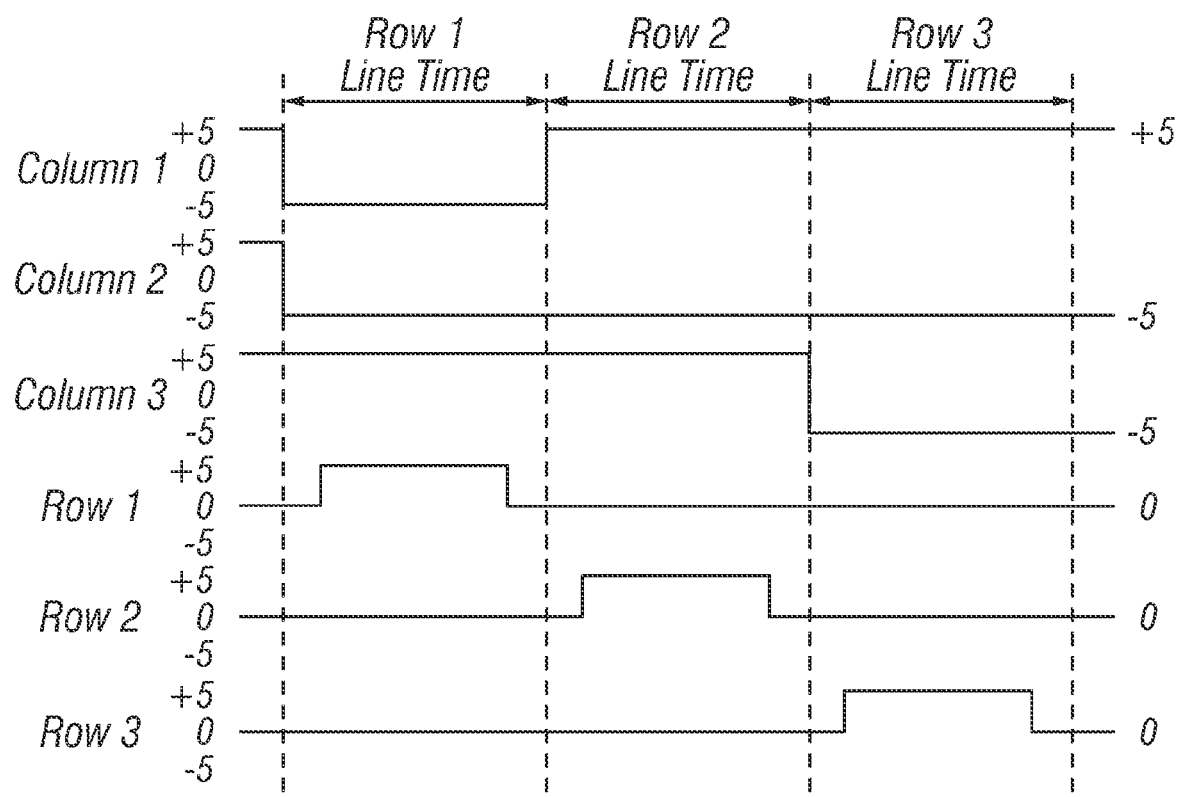

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively. Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
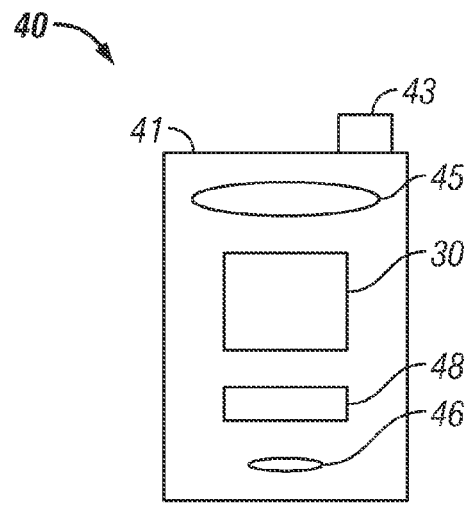
FIGS. 6A and 6B are system block diagrams illustrating an embodiment of a visual display device comprising a plurality of interferometric modulators.
Figure 6B:
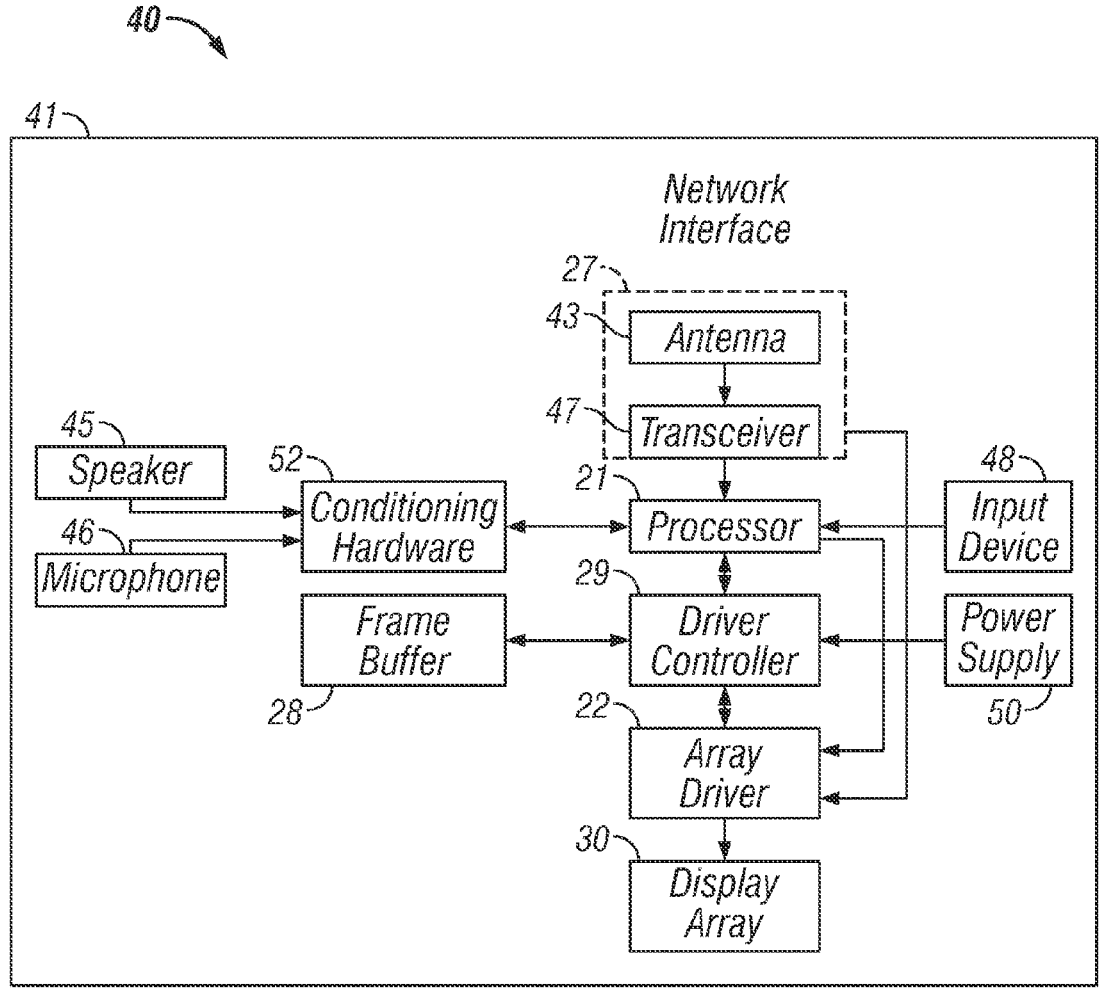

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and grayscale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
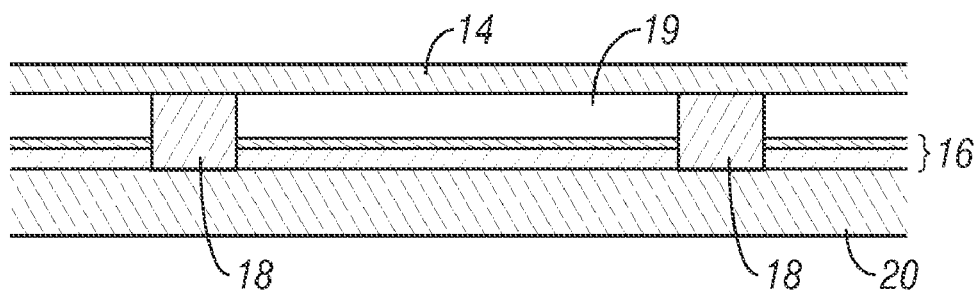
FIG. 7A is a cross section of the device of FIG. 1.
Figure 7B:
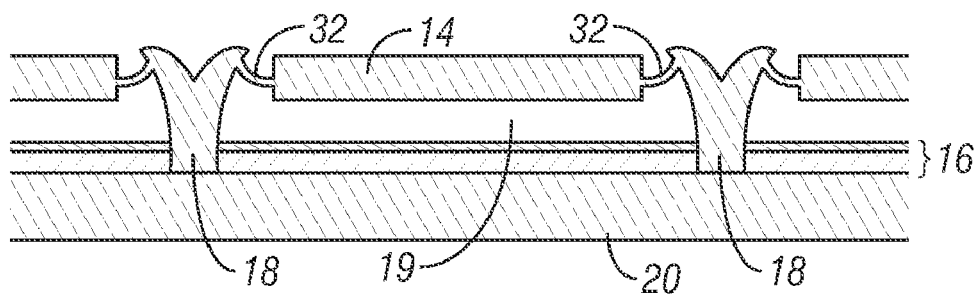
FIG. 7B is a cross section of an alternative embodiment of an interferometric modulator.
Figure 7C:
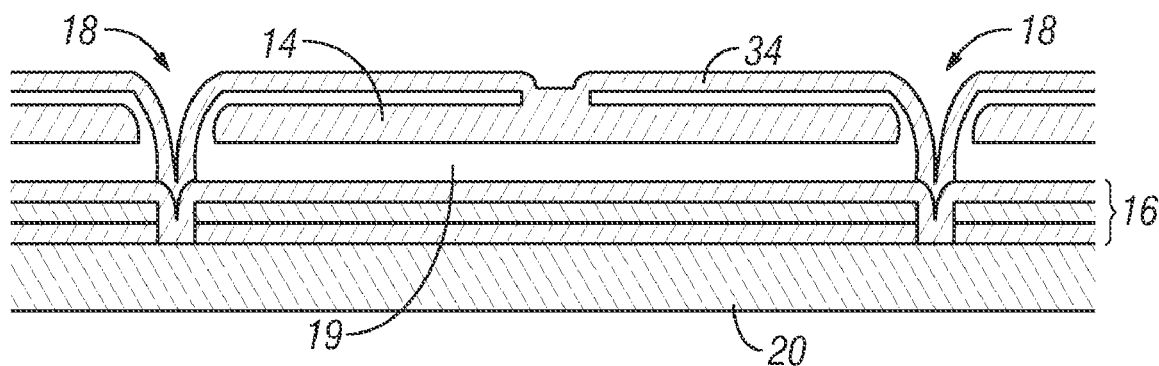
FIG. 7C is a cross section of another alternative embodiment of an interferometric modulator.
Figure 7D:
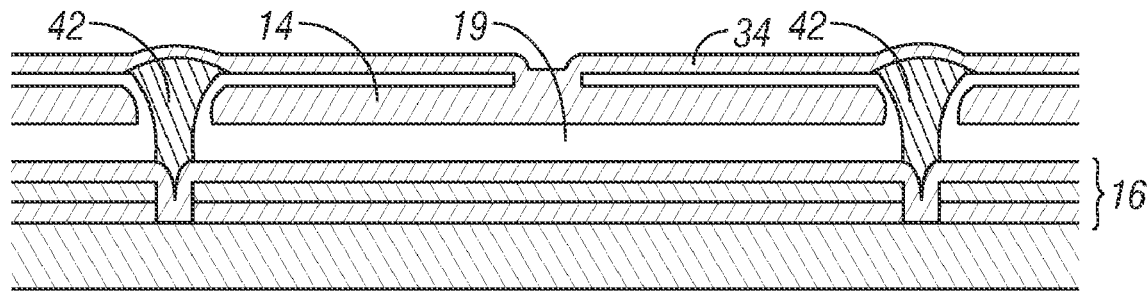
FIG. 7D is a cross section of yet another alternative embodiment of an interferometric modulator.
Figure 7E:
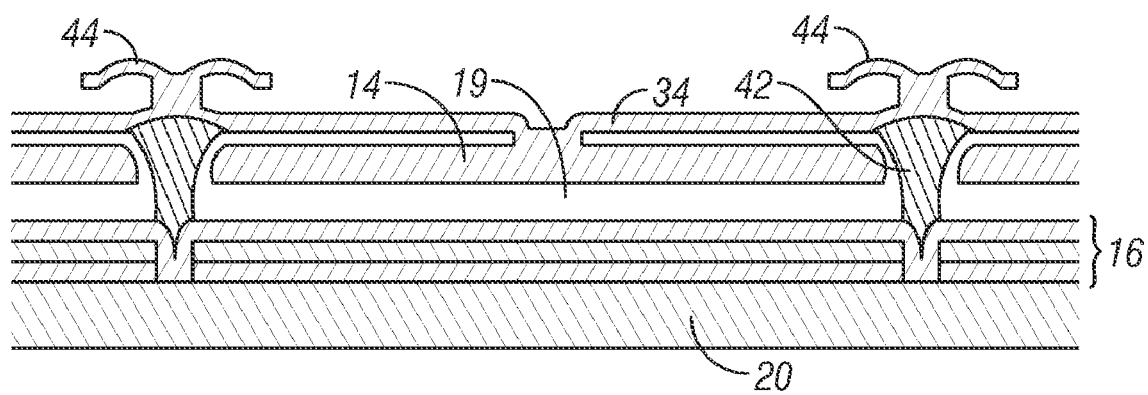
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the moving mirror structure. FIG. 7A is a cross section of the embodiment of FIG. 1, where a strip of metal material 14 is deposited on orthogonally extending supports 18. In FIG. 7B, the movable reflective material 14 is attached to supports at the corners only, on tethers 32. In FIG. 7C, the movable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective material 14 can be optimized with respect to the optical properties, and the structural design and materials used for the deformable layer 34 can be optimized with respect to desired mechanical properties.

The response time for discharging and charging an interferometric modulator is dependent in part on an RC (resistance-capacitance) time constant for the voltage circuit connected to the interferometric modulator. This response time of the interferometric modulator has an effect on the display quality of the interferometric modulator array. When the time between incoming scan pulses received by a given interferometric modulator is shorter than the response time of the interferometric modulator, the moving layer is unable to synchronize with the incoming scan pulses. Under such conditions, the state of the interferometric modulator does not respond to each and every scan pulse, thereby resulting in a degraded displayed image. It is therefore desirable to provide an interferometric modulator with a reduced response time to allow for faster scan and refresh rates.

The voltage circuit connected to an interferometric modulator comprises the electrodes of the interferometric modulator, as well as the contacts, conductors, and other conductive elements which provide electrical connections between the electrodes and the row/column driver electronics. In certain embodiments, the materials and geometries of the electrodes of the interferometric modulator impact the RC time constant for the voltage circuit. In certain array configurations, the electrodes of adjacent interferometric modulators are coupled together in series to connect adjacent interferometric modulators with the driver electronics, resulting in higher RC time constants. For other array configurations, wires or other electrical connectors may be utilized for the electrical connections between the row and column drivers and the electrodes of the interferometric modulators, with these wires contributing to the RC time constants of the interferometric modulators.

Figure 8A:
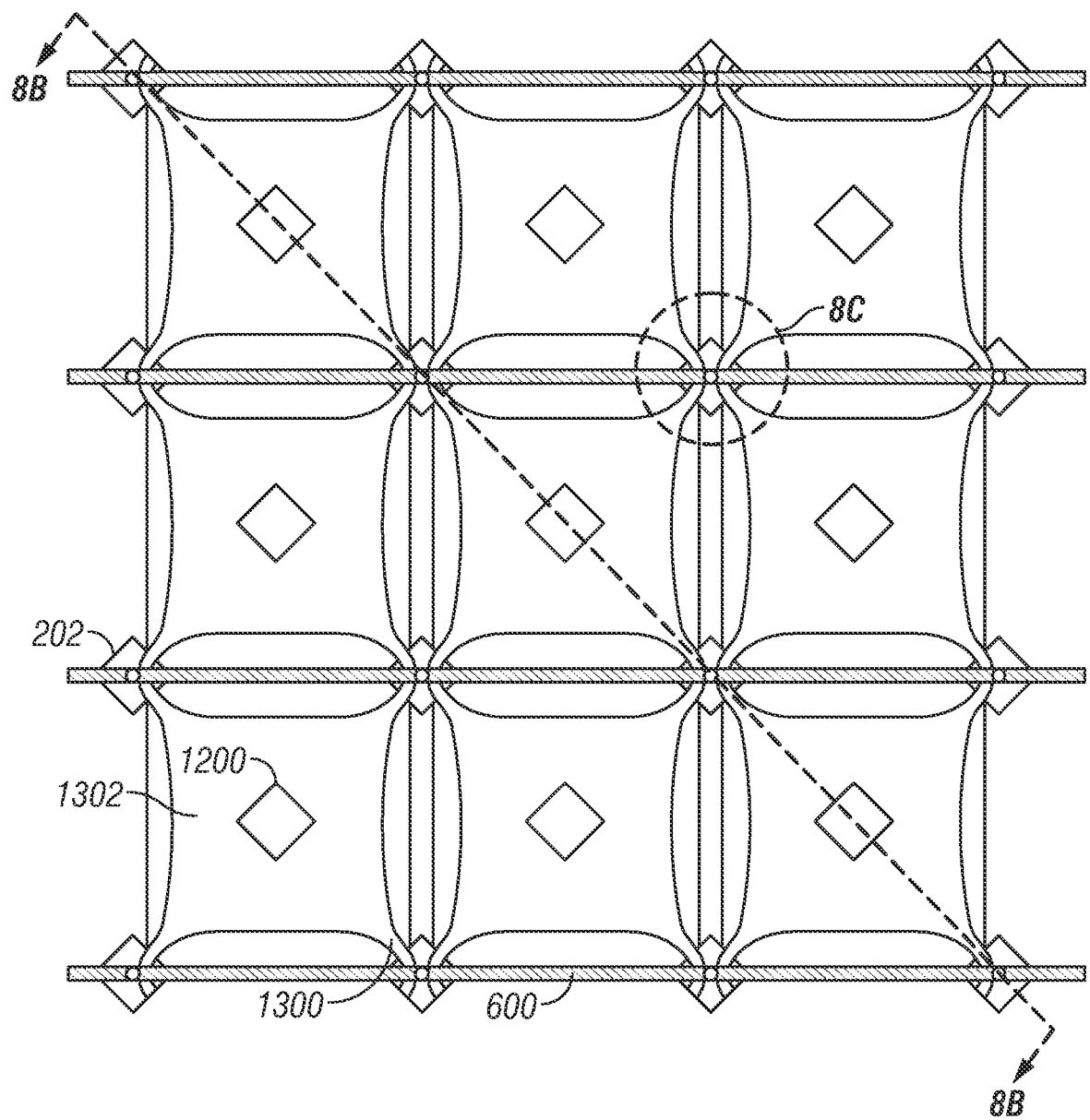
FIG. 8A schematically illustrates an example 3×3 interferometric modulator display having a conductive bus located above the second electrode layer and electrically coupled to the first electrode layer.
Figure 8B:
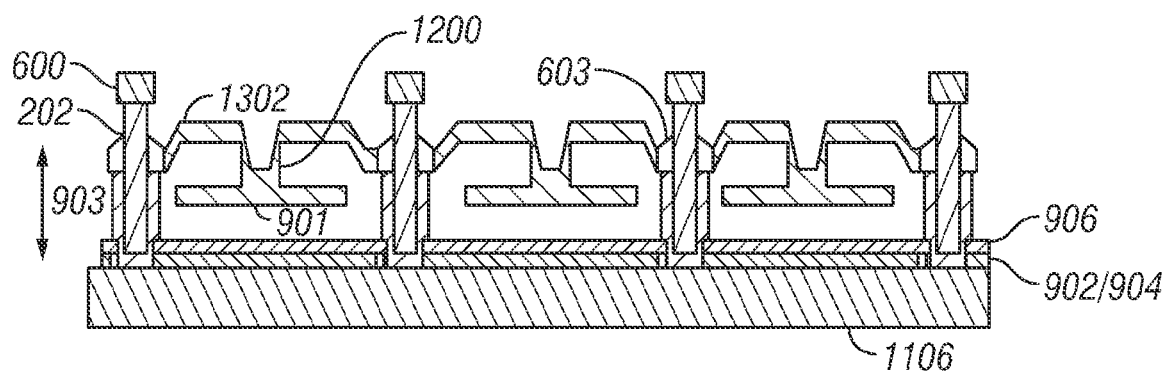
FIG. 8B shows a cross-sectional view of the 3×3 interferometric modulator display of FIG. 8A taken along line 8B-8B.
Figure 8C:
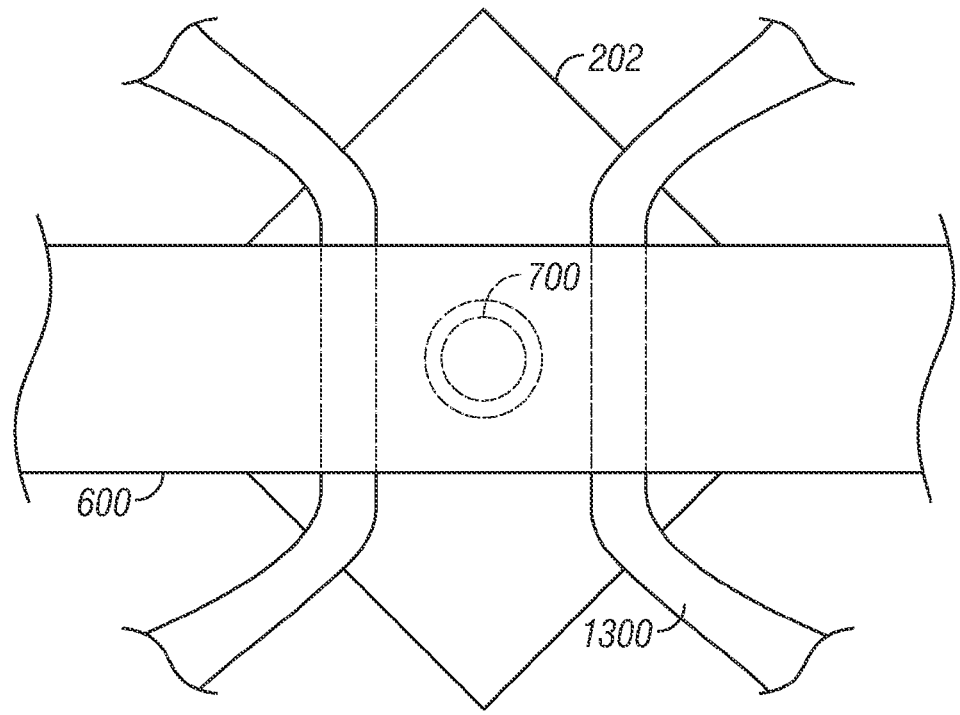
FIG. 8C is a blown up view of a single post support from the 3×3 interferometric modulator display of FIG. 8A with the conductive bus to second electrode layer connection shown in circular dashed lines.

FIGS. 8A, 8B, and 8C schematically illustrate an exemplary 3×3 portion of an interferometric modulator display in accordance with embodiments described herein. Display portions which are larger or smaller than the 3×3 portion illustrated in FIG. 8A are also compatible with embodiments described herein. As shown in the cross-sectional view of FIG. 8B taken along line 8B-8B of FIG. 8A, each modulator comprises a substrate 1106, a first electrode layer (or "actuation electrode") 902 over the substrate 1106, and a layer 1302 over the substrate 1106. In certain embodiments (e.g., as shown in FIG. 8B), the layer 1302 is used as an electrode, and can be referred to as a "second electrode layer" 1302. However, in certain other embodiments, the layer 1302 comprises a deformable layer 1302 that does not act as an electrode. For example, the reflective surface 901 or other portions of the MEMS device may act as the second electrode. The modulator of certain embodiments further comprises a reflective surface 901 which is substantially parallel to the first electrode layer 902 and which is coupled to the second electrode layer 1302. The reflective surface 901 is movable between a first position and a second position. The first position of the reflective surface 901 is a first distance from the first electrode layer 902. The second position of the reflective surface 901 is a second distance from the first electrode layer 902.

In certain embodiments, as shown in FIG. 8B, the first electrode layer 902 of each modulator is fixed, and is positioned in proximity to the substrate 1106. The first electrode layers 902 of the array are arranged in rows. These rows are not shown in FIG. 8A, but correspond to the three rows of modulators shown in FIG. 8A. The first electrode layers 902 of each row are electrically connected to one another, but are electrically insulated from the first electrode layers 902 of the other rows.

In certain embodiments, the second electrode layer 1302 of each modulator comprises at least a portion of the moving layer above the first electrode layer 902. In the embodiment schematically illustrated by FIG. 8A, the second electrode layer 1302 comprises the whole moving layer. In certain embodiments, the second electrode layers 1302 of the array are patterned so as to separate the second electrode layers 1302 of each column of modulators from the second electrode layers 1302 of adjacent columns of modulators. Thus, the second electrode layers 1302 of the array are arranged in columns. For example, in the embodiment schematically illustrated by FIG. 8A, the second electrode layers 1302 have straps or tethers 1300 at the four corners of the second electrode layer 1302 of each modulator. The tethers 1300 mechanically couple the second electrode layer 1302 to the support posts 202 at the corners of the modulators. The tethers 1300 also electrically couple the second electrode layers 1302 of adjacent modulators within a column, while the second electrode layers 1302 of each column of modulators are electrically insulated from the second electrode layers 1302 of the other columns of modulators. Other second electrode layers 1302 compatible with embodiments described herein have spring structures rather than the tethers 1300 of FIG. 8A.

In certain embodiments, as schematically illustrated by FIGS. 8A and 8B, the reflective surface 901 of each modulator is mechanically coupled to the second electrode layer 1302 of the corresponding modulator by a support member 1200. Certain other embodiments comprise a plurality of support members 1200, which mechanically couple the reflective surface 901 to the second electrode layer 1302. Thus, when the modulator is activated, the reflective surface 901 is moved between the first position and the second position relative to the first electrode layer 902 along a direction 903 substantially perpendicular to the reflective surface 901.

In certain embodiments, each modulator of the array further comprises a conductive bus layer. At least a portion of the conductive bus layer is electrically coupled to at least one of the first electrode layer 902 and the second electrode layer 1302. The reflective surface 901 moves between the first position and the second position in response to a voltage applied to the conductive bus layer.

The conductive bus layer 600 of certain embodiments comprises a conductive material, including but not limited to, metals, composites, and alloys. Exemplary conductive materials for the conductive bus layer 600 include, but are not limited to, titanium, chromium, nickel, and aluminum. In certain embodiments, the thickness of the conductive bus layer 600 is in a range between about 0.1 micron and about 2 microns (μm) measured in a direction that is parallel to the direction 903 in FIG. 8B. Other thicknesses are also compatible with embodiments described herein.

In certain embodiments, as shown in FIG. 8B, the conductive bus layer 600 is positioned above the second electrode layer 1302. The conductive bus layers 600 of the modulators form a plurality of conductive bars 600, which in the exemplary embodiment illustrated in FIG. 8B, are located above the second electrode layers 1302. The conductive bars 600 of each row are electrically connected to one another and electrically insulated from the conductive bars 600 of the other rows, as shown in FIG. 8A. In certain embodiments, each conductive bar 600 provides electrical connections between a row driver and the first electrode layers 902 of a corresponding row of modulators. In certain embodiments, the width of the conductive bars 600 running along the rows is in a range between about 4 microns and about 10 microns measured in a direction that is perpendicular to the direction 903 in FIG. 8B. Other widths are also compatible with embodiments described herein.

In the exemplary embodiment illustrated in FIGS. 8A-8C, the conductive bus layer 600 of a modulator is electrically coupled to the first electrode layer 902 of the modulator by a conductive portion of one or more of the support posts 202 of the modulator. The support posts 202 provide structural support for the moving layer and the second electrode layer 1302. In certain embodiments, the conductive portions of the support posts 202 are electrically coupled to both the conductive bus layer 600 and the first electrode layer 902, but are electrically insulated from the second electrode layer 1302 by insulating material 603, as shown in FIG. 8B.

FIG. 8C schematically illustrates a support post 202 of the 3×3 portion of the interferometric modulator display of FIG. 8A compatible with embodiments described herein. The tethers 1300 are mechanically coupled to the support post 202, but are electrically insulated from the conductive bus layer 600 and from the electrically conductive portion 700 of the support post 200. The electrically conductive portion 700 of the support post 200 electrically couples the conductive bus layer 600 to the first electrode layer 902. As shown in FIG. 8C, the electrically conductive portion 700 of the support post 200 has a generally circular shape, as illustrated by the concentric dashed lines. In certain other embodiments, the conductive portion 700 has other cross-sectional shapes (e.g., square). In certain embodiments, the conductive portion 700 is tubular, cylindrical, or solid. Embodiments of the conductive portion 700 may have a uniform or non-uniform cross-section between the conductive bus layers 600 and the first electrode layers 902.

Advantageously, for the embodiments schematically illustrated by FIGS. 8A, 8B, and 8C, the conductive bus layer 600 is positioned over the second electrode layer 1302 and away from the optical path of light entering or being reflected from the interferometric modulator. Thus, the conductive bus layer 600 of such embodiments does not interfere with the optical properties of the interferometric modulator. Furthermore, the conductive bus layer 600 advantageously provides an electrical path between the row driver electronics of the interferometric modulator array and the first electrode layer 902 which has significantly lower electrical resistance than do other electrical paths of other configurations (e.g., the first electrode layers 902 of a row of interferometric modulators connected in series with one another), thereby advantageously reducing the RC time constant as compared to these other configurations.

The conductive bus layer 600 of certain embodiments is positioned at various locations relative to the other portions of the display of interferometric modulators. In certain embodiments, as schematically illustrated by FIG. 8B, the conductive bus layer 600 is over the second electrode layer 1302. As described below, in certain other embodiments, the conductive bus layer 600 is positioned within or adjacent to the first electrode layer 902, or between the first electrode layer 902 and the second electrode layer 1302. The conductive bus layer 600 can also be located below the first electrode layer 902, or in substantially the same plane as the second electrode layer 1302. Other configurations of the conductive bus layer 600 are also compatible with embodiments described herein.

Figure 9A:
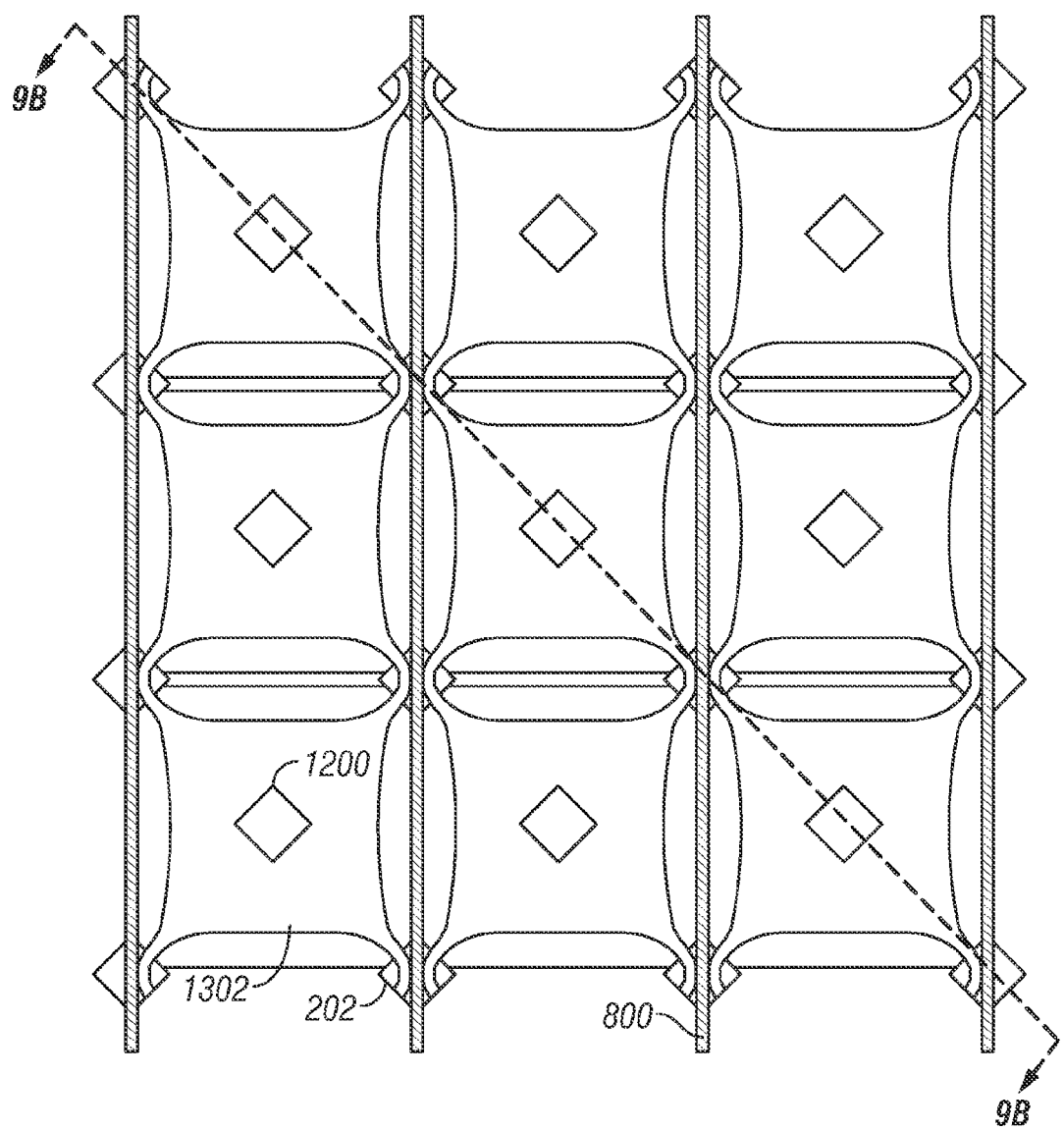
FIG. 9A schematically illustrates an example 3×3 interferometric modulator display having a conductive bus located above the second electrode layer and electrically coupled to the second electrode layer.
Figure 9B:
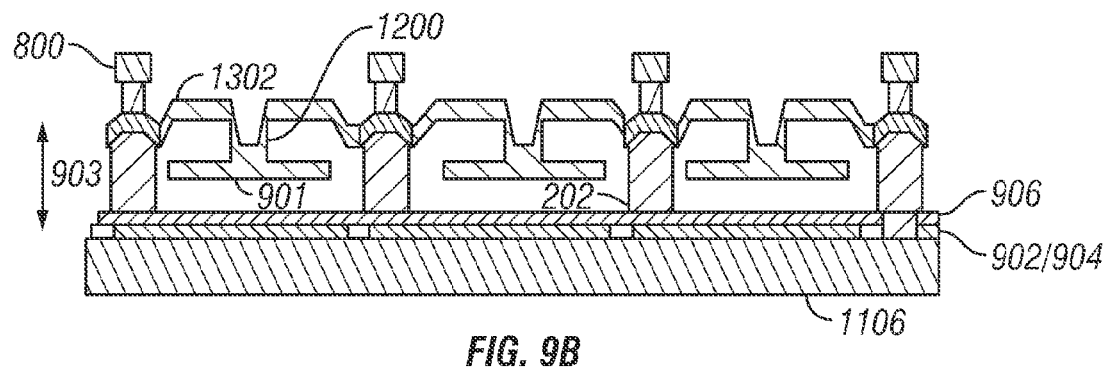
FIG. 9B shows a cross-sectional view of the 3×3 interferometric modulator display of FIG. 9A taken along line 9B-9B.

FIG. 9A schematically illustrates an exemplary 3×3 portion of an interferometric modulator display having interferometric modulators in which the conductive bus layer 800 is located above the second electrode layer 1302 and is electrically coupled to the second electrode layer 1302. FIG. 9B shows a cross-sectional view of the 3×3 portion of the interferometric modulator display of FIG. 9A taken along line 9B-9B. In certain embodiments, as shown in FIG. 9A, the conductive bus layers 800 of a column of modulators of the display are coupled together to form a plurality of conductive bars 800. The conductive bar 800 of each column electrically connects the second electrode layers 1302 of the column to one another, and the conductive bar 800 of each column is electrically insulated from the conductive bars 800 of the other columns.

In certain embodiments, each conductive bar 800 provides electrical connections between a column driver and the second electrode layers 1302 of the corresponding column of modulators. In certain embodiments, each conductive bus layer 800 is electrically connected to the corresponding second electrode layers 1302 at one or more locations. As illustrated in FIG. 9B, the conductive bus layer 800 is connected to the second electrode layer 1302 over the support posts 202. In certain embodiments, the width of the conductive bars 800 running along the columns is in a range between about 4 microns and about 10 microns measured in a direction that is perpendicular to the direction 903 in FIG. 9B. Other widths are also compatible with embodiments described herein. Advantageously, the conductive bus layer 800 provides an electrical path between the column driver electronics of the interferometric modulator array, which has significantly lower electrical resistance than do other electrical paths of other configurations (e.g., the second electrode layers 1302 of a column of interferometric modulators connected in series with one another), thereby advantageously reducing the RC time constant as compared to other configurations.

Figure 10A:
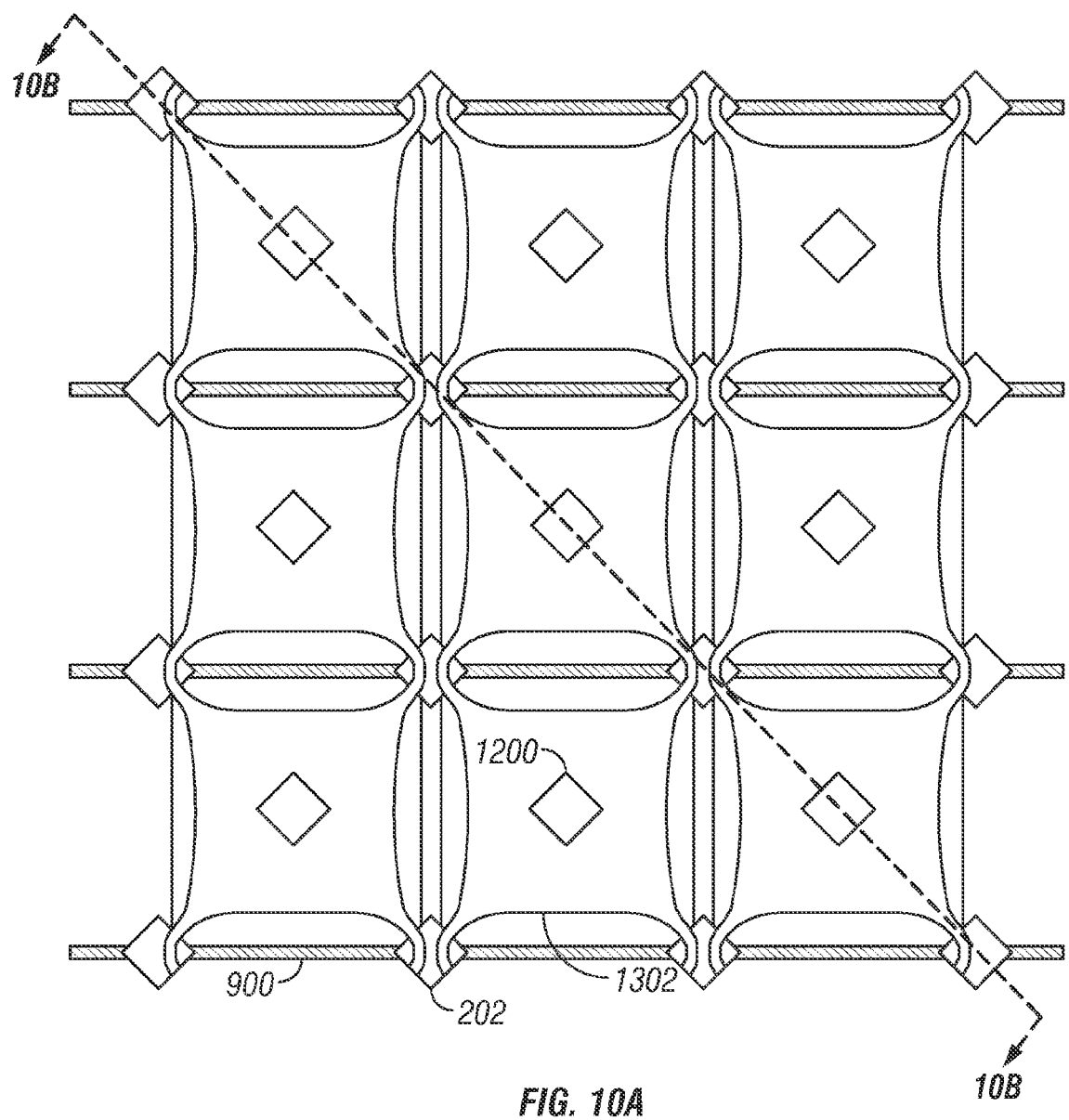
FIG. 10A schematically illustrates an example 3×3 interferometric modulator display having a conductive bus located between the second electrode layer and the first electrode layer and electrically coupled to the first electrode layer.
Figure 10B:
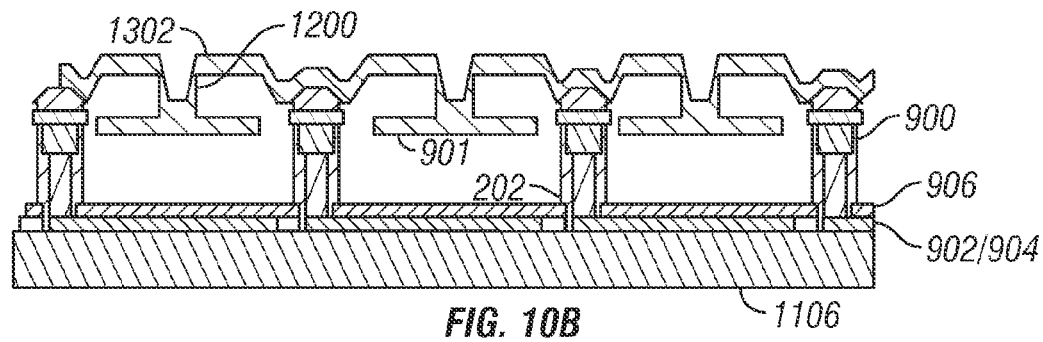
FIG. 10B shows a cross-sectional view of the 3×3 interferometric modulator display of FIG. 10A taken along line 10B-10B.

FIG. 10A schematically illustrates an exemplary 3×3 portion of an interferometric modulator display having interferometric modulators in which the conductive bus layer 900 is located between the first electrode layer 902 and the second electrode layer 1302. FIG. 10B shows a cross-sectional view of the 3×3 portion of the interferometric modulator display of FIG. 10A taken along line 10B-10B. In the exemplary embodiment illustrated in FIG. 10B, the conductive bus layer 900 is located below the second electrode layer 1302 and is a conductive portion of the support posts 202. In the embodiment schematically illustrated by FIG. 10B, each conductive bus layer 900 is electrically coupled to each first electrode layer 902 of a row of interferometric modulators and is electrically isolated from the first electrode layers 902 of the other rows of interferometric modulators.

The conductive bus layer 900 of certain such embodiments electrically connects a row driver and the first electrode layers 902 of a corresponding row of interferometric modulators. The row driver selectively applies voltages through the conductive bus layer 900 to the first electrode layers 902 of the interferometric modulators of a row of the display. The conductive bus layer 900 provides an electrical path that has significantly lower electrical resistance than configurations which electrically connect rows of interferometric modulators only through the first electrode layers 902.

Figure 10C:
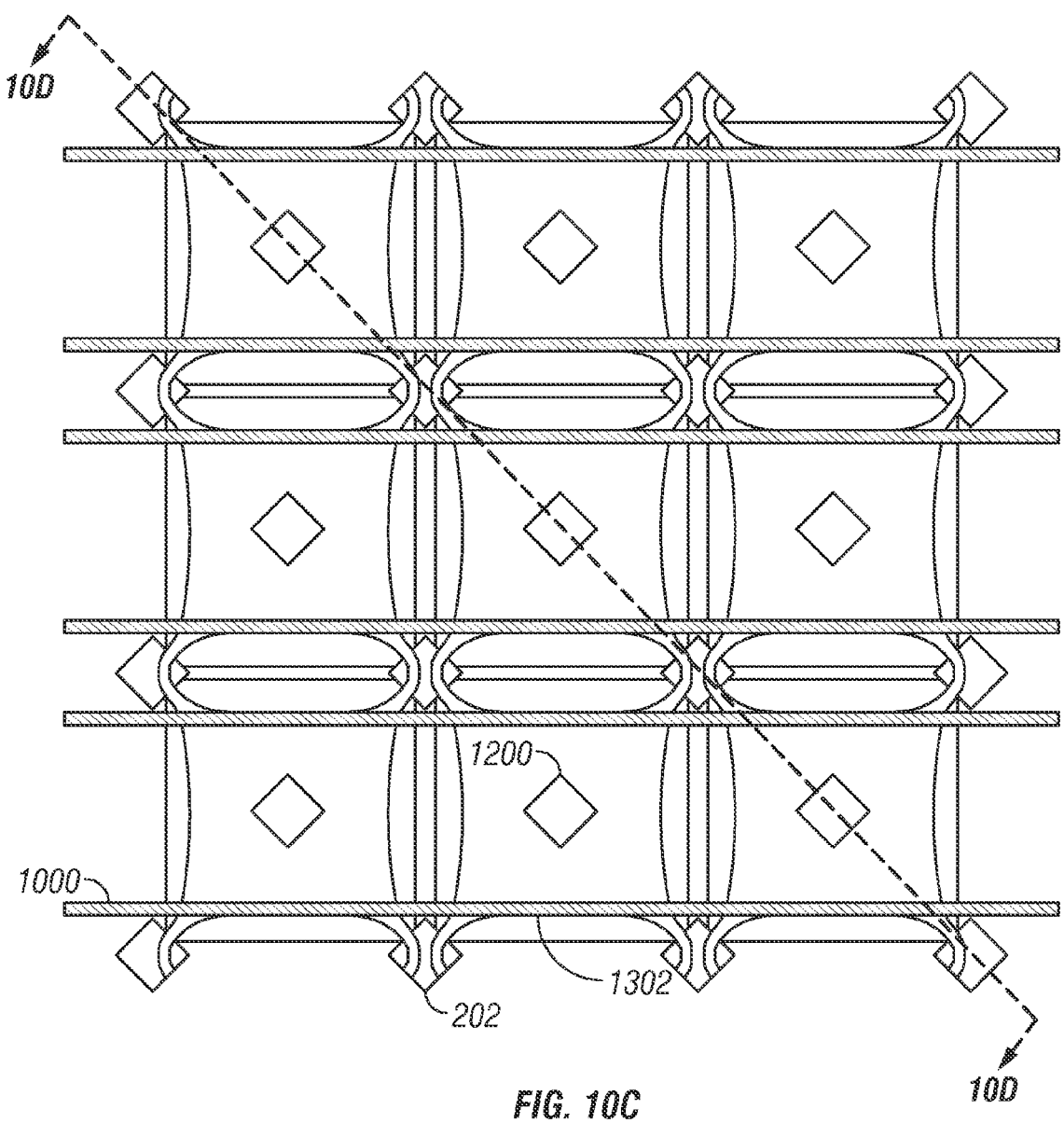
FIG. 10C schematically illustrates an example 3×3 interferometric modulator display having a conductive bus located on and electrically coupled to the first electrode layer.
Figure 10D:
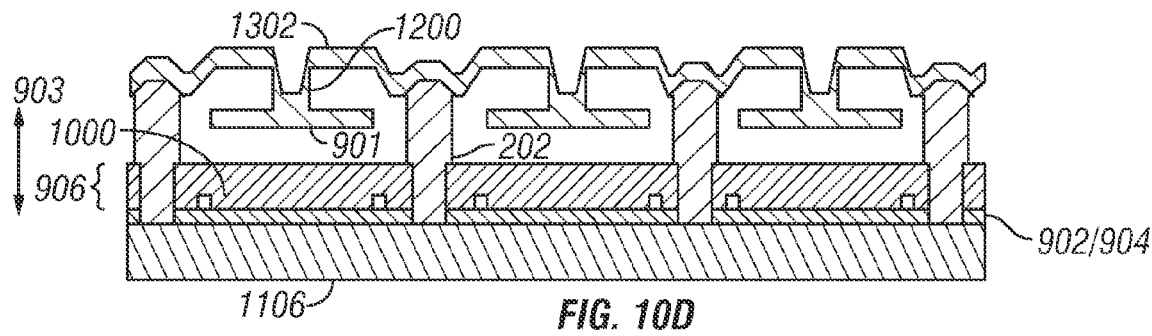
FIG. 10D shows a cross-sectional view of the 3×3 interferometric modulator display of FIG. 10C taken along line 10D-10D.

FIG. 10C schematically illustrates an exemplary 3×3 portion of an interferometric modulator display having interferometric modulators with a conductive bus layer 1000 located adjacent to and electrically coupled to the first electrode layers 902 of a corresponding row of interferometric modulators. FIG. 10D shows a cross-sectional view of the 3×3 portion of the interferometric modulator display of FIG. 10C taken along line 10D-10D. The conductive bus layer 1000 of certain such embodiments electrically connects a row driver and the first electrode layers 902 of a corresponding row of interferometric modulators, thereby providing an electrical path between the row driver and the interferometric modulator that has significantly lower electrical resistance than other configurations which electrically connect rows of interferometric modulators only through the first electrode layers 902. In the exemplary embodiment illustrated in FIG. 10D, the conductive bus layer 1000 is positioned between the support posts 202 and near the periphery of an underlying first electrode layer 902. The conductive bus layer 1000 is electrically coupled to the underlying first electrode layer 902.

The material for the conductive bus layer 1000 is selected to enhance the conductivity across the first electrode layers 902. In certain embodiments, the conductive bus layer 1000 comprises aluminum or other conductive material. Unlike the first electrode layers 902 of certain embodiments, the material selected for the conductive bus layer 1000 may be opaque. In certain embodiments, the conductive bus layer 1000 has a width in a range between about 4 microns and about 10 microns measured in a direction that is perpendicular to the direction 903 in FIG. 10D.

In certain embodiments, a dielectric layer 906 is located between the conductive bus layer 1000 and the reflective surface layers 901. The dielectric layer 906 of certain such embodiments advantageously prevents contact between the conductive bus layer 1000 and the reflective surface layer 901 of the interferometric modulator.

In certain embodiments, locating the conductive bus layer 1000 below the reflective surface layer 901 may adversely impact the optical performance of the interferometric modulator by blocking at least a portion of the incoming and reflected light of the interferometric modulator. To reduce the visual impact of the conductive bus layer 1000 on the optical performance of the interferometric modulator, conductive bus layers 1000 with smaller widths measured in a direction that is perpendicular to the direction 903 in FIG. 10D can be utilized.

Figure 10E:
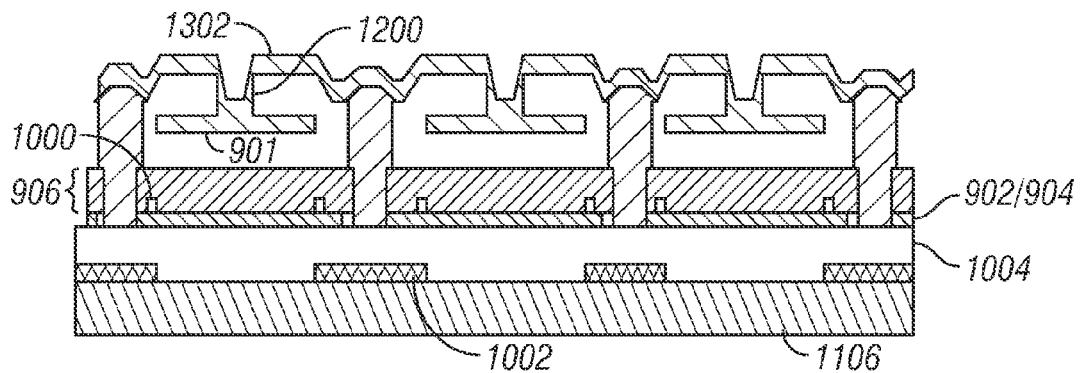
FIG. 10E shows a cross-sectional view of another embodiment of the 3×3 interferometric modulator display of FIG. 10C having a mask material aligned with the conductive bus and located between the conductive bus and the viewing side of the 3×3 interferometric modulator display.

FIG. 10E shows a cross-sectional view of another embodiment of the 3×3 portion of the interferometric modulator display of FIG. 10C. The interferometric modulators of the display illustrated by FIG. 10E have a mask material 1002 generally aligned with the conductive bus layers 1000 of the interferometric modulators and located between the conductive bus layers 1000 and the viewing side of the 3×3 interferometric modulator display. The mask material 1002 is a generally opaque and optically absorbing material with a sufficient width to block incoming light from impinging onto the conductive bus layers 1000. In the embodiment illustrated in FIG. 10E, the mask material 1002 is a generally coplanar in a layer 1004 with an optically transmissive material 1004 (e.g., comprising $SiO_2$) which transmits incoming light to the modulators and reflected light from the modulators.

Figure 11A:
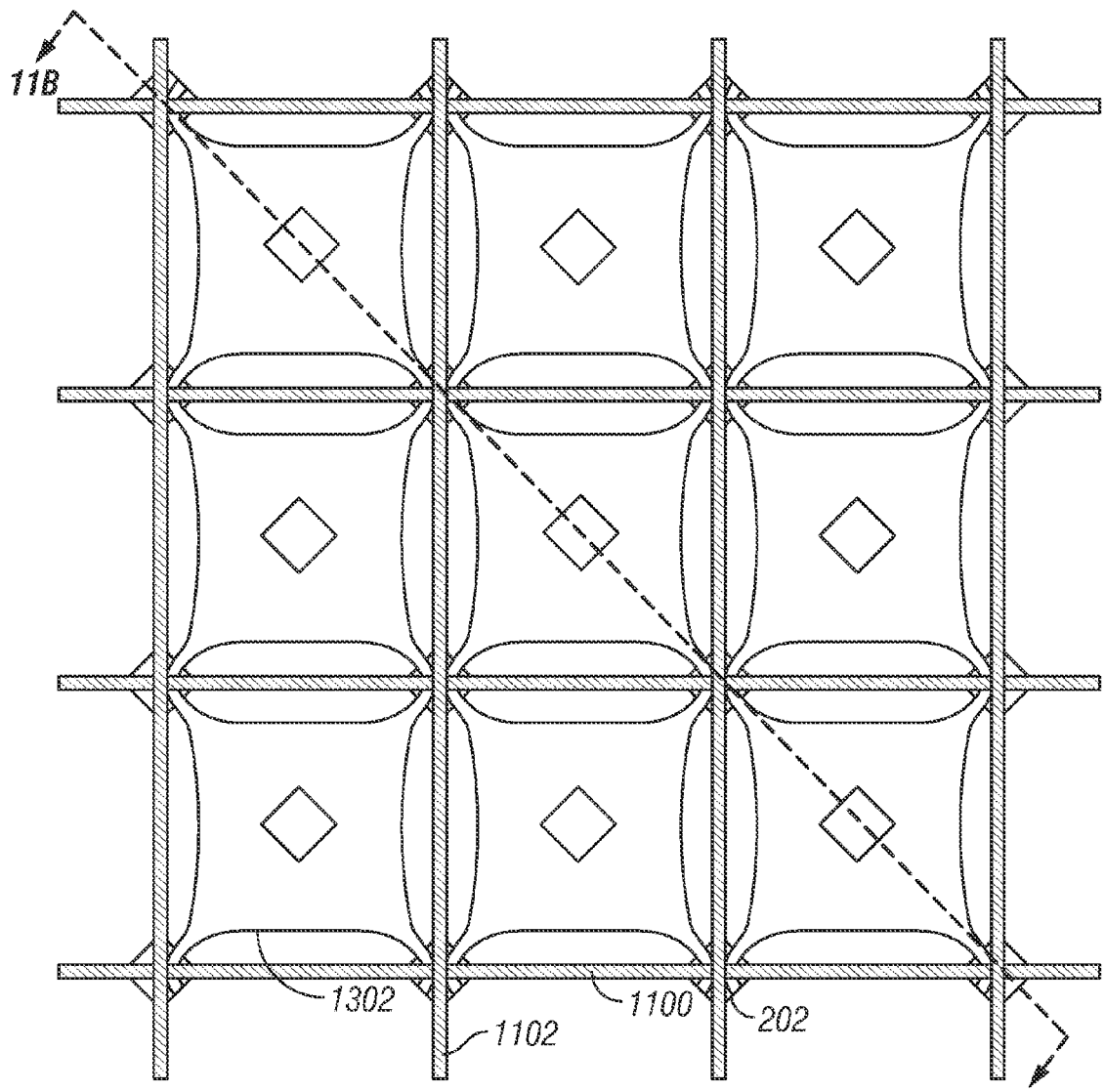
FIG. 11A schematically illustrates an example 3×3 interferometric modulator display having a first conductive bus located above the second electrode layer and electrically coupled to the first electrode layer and a second conductive bus located above the first conductive bus and electrically coupled to the second electrode layer.
Figure 11B:
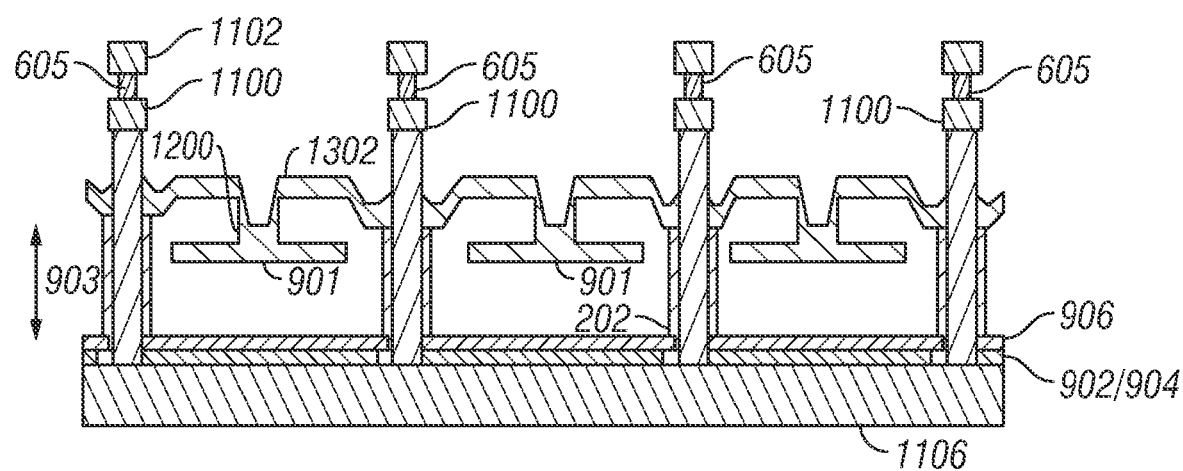
FIG. 11B shows a cross-sectional view of the 3×3 interferometric modulator display of FIG. 11A taken along line 11B-11B.

FIG. 11A schematically illustrates an exemplary 3×3 portion of an interferometric modulator display having interferometric modulators with a first conductive bus layer 1100 located over the second electrode layer 1302 and a second conductive bus layer 1102 located over the first conductive bus layer 1100. FIG. 11B shows a cross-sectional view of the 3×3 interferometric modulator display of FIG. 11A taken along line 11B-11B. The first conductive bus layer 1100 is electrically coupled through a conductive portion of at least one support post 202 to the first electrode layers 902 of a row of interferometric modulators. The second conductive bus layer 1102 is electrically coupled to the second electrode layers 1302 of a column of interferometric modulators. The first conductive bus layer 1100 is electrically isolated from the second conductive bus layer 1102 via insulating portions 605 of the support posts 202.

In FIG. 11B, the first conductive bus layer 1100 is electrically coupled to the first electrode layer 902 through a conductive portion of one or more support posts 202. The second conductive bus layer 1102 is electrically coupled to the second electrode layer 1302 at locations over one or more support posts 202.

In certain embodiments, the lower resistance path provided by the conductive bus layers advantageously reduces the RC time constant of the circuit. Exemplary RC times for a plurality of interferometric modulators having their first electrode layers 902 electrically coupled in series can range from about 5 microseconds to about 100 microseconds, depending on the number of interferometric modulators. This same plurality of interferometric modulators may have a resistance of as high as about 30-50 ohms per square centimeter ($\Omega/cm^2$). The use of the conductive bus layers 1100, 1102 to electrically connect row and column drivers to the corresponding first electrode layers 902 and second electrode layers 1302 of the plurality of interferometric modulators, respectively, can reduce the electrical resistance of the circuit, thereby reducing the RC time constant.

Method of Manufacture Conductive Bus Over the Mechanical Layer

Figure 12A:
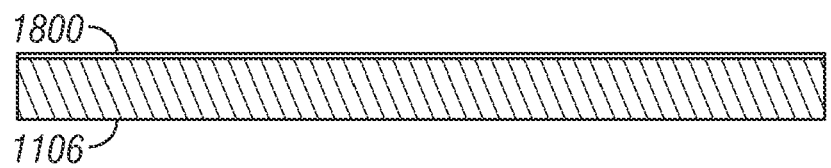
FIG. 12A-12Q schematically illustrate an example series of processing steps for forming a conductive bus structure above the second electrode layer.
Figure 12B:
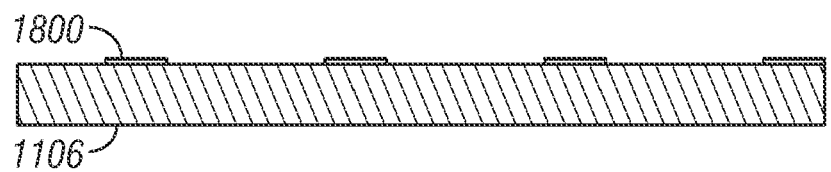
Figure 12C:
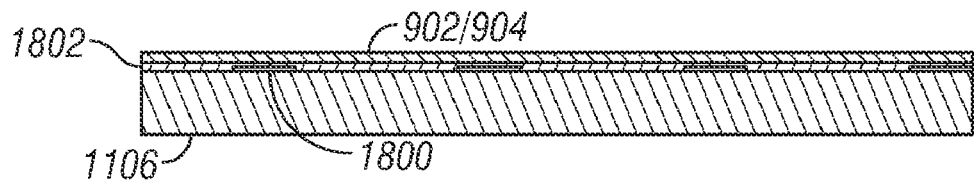
Figure 12D:
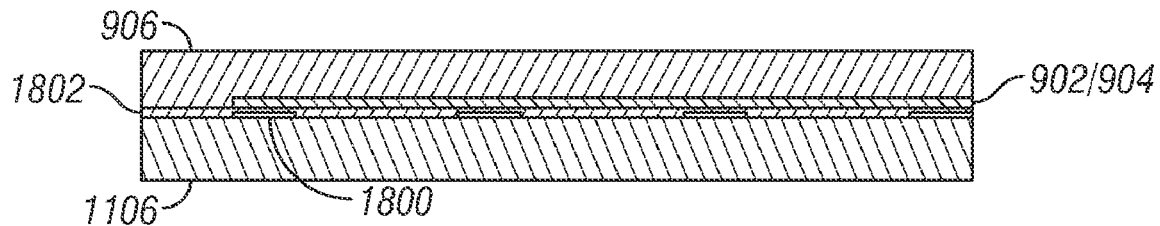
Figure 12E:
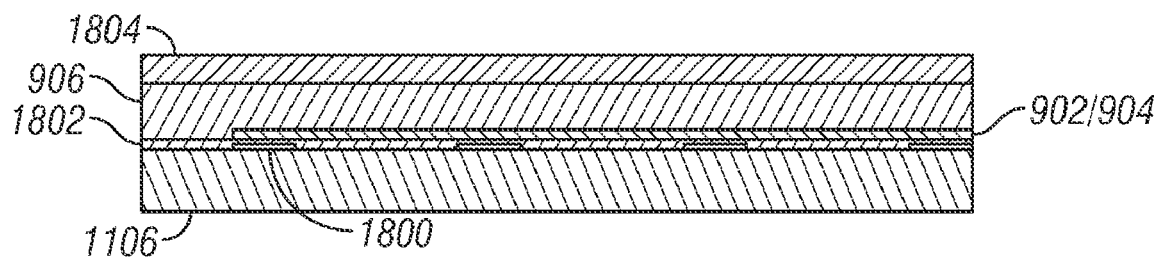
Figure 12F:
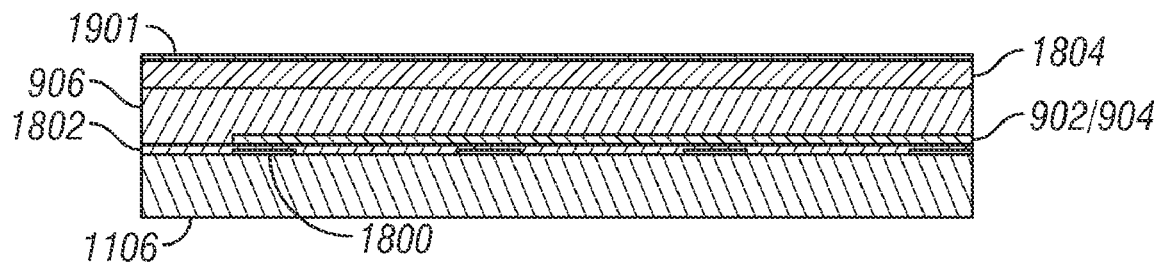
Figure 12G:
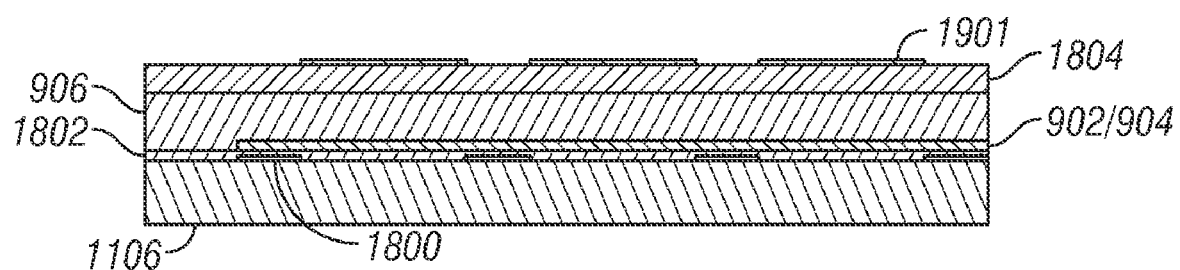
Figure 12H:
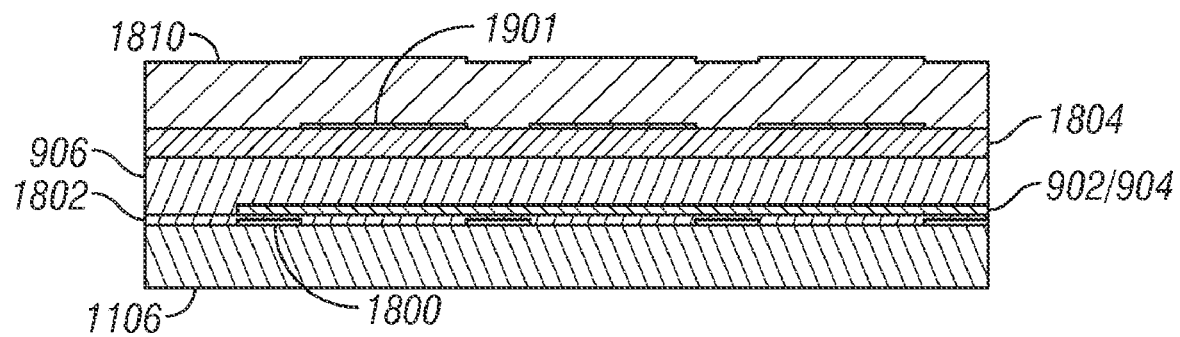
Figure 12I:
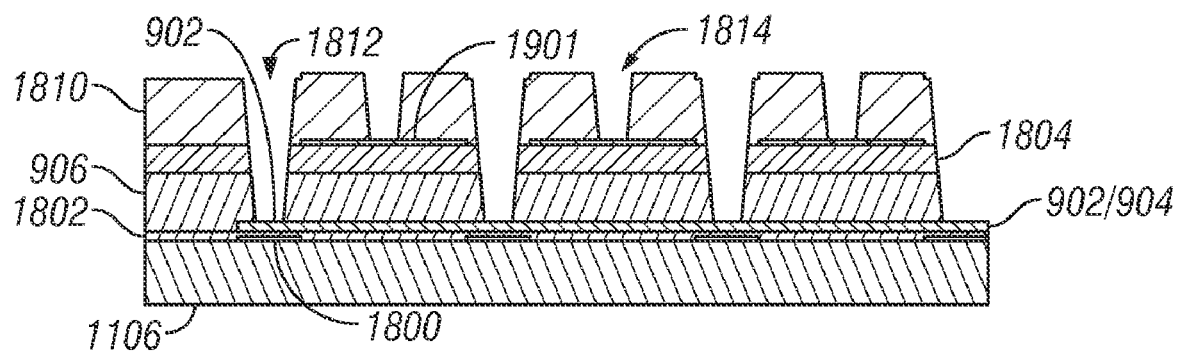
Figure 12J:
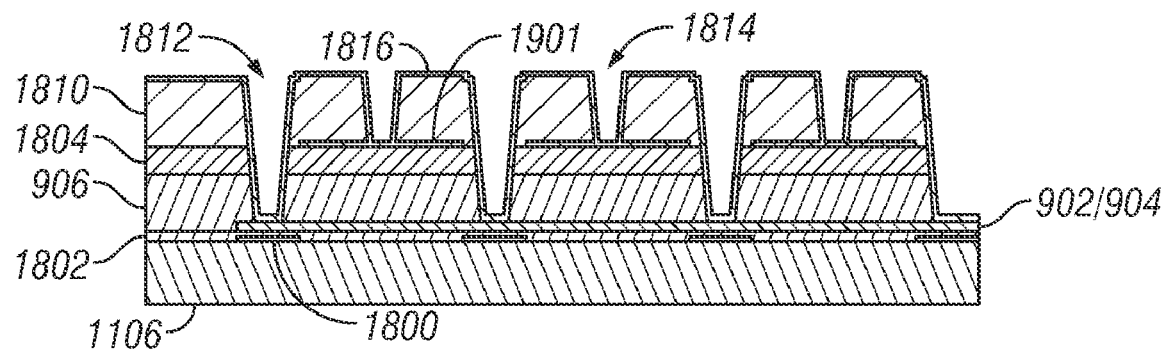
Figure 12K:
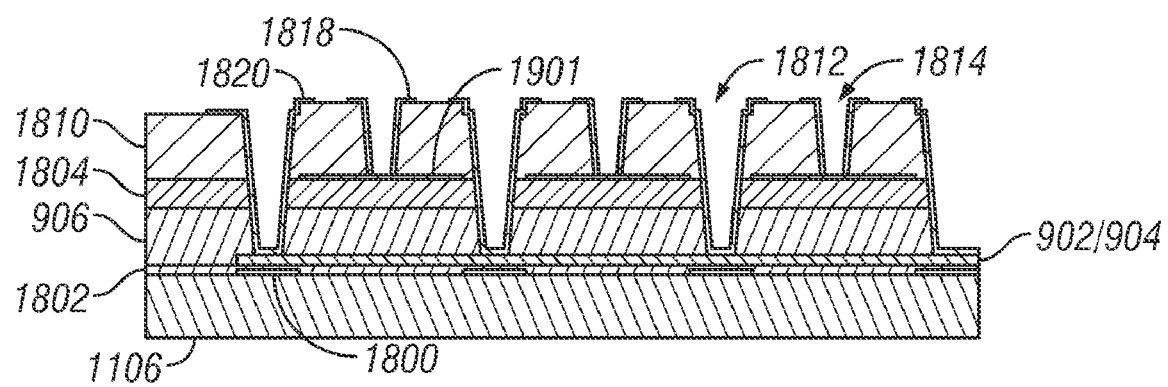
Figure 12L:
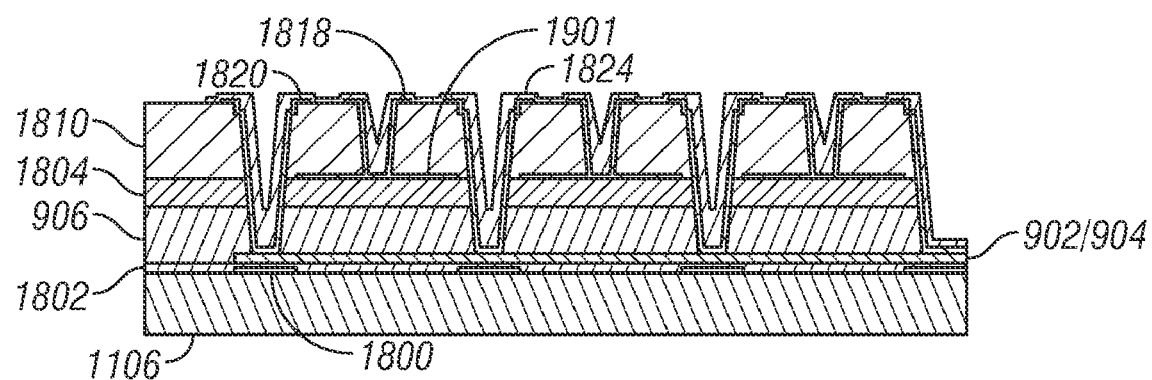
Figure 12M:
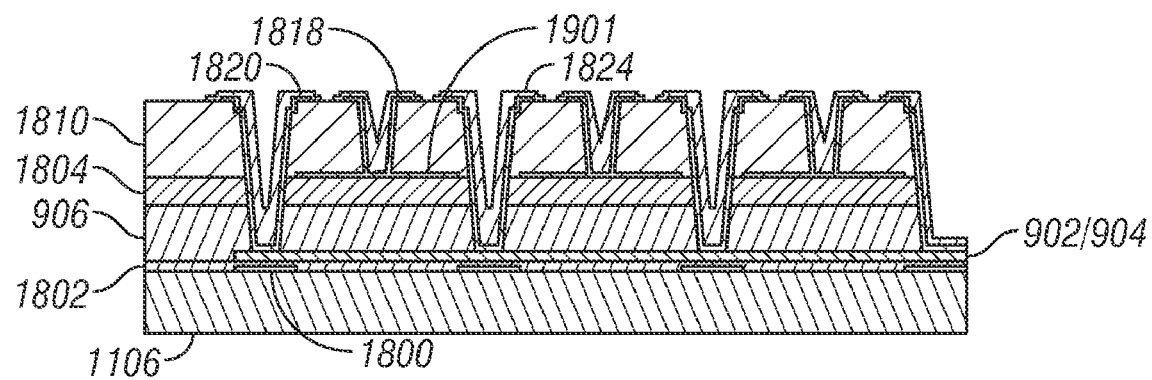
Figure 12N:
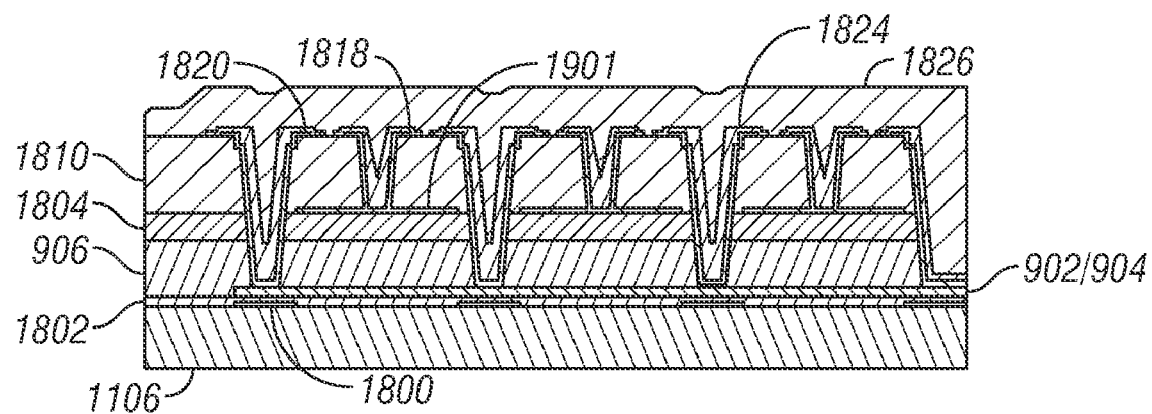
Figure 12O:
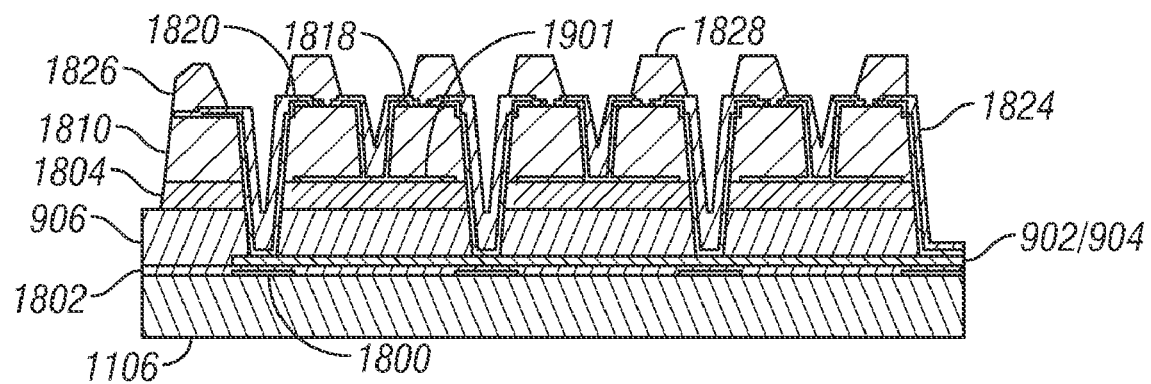
Figure 12P:
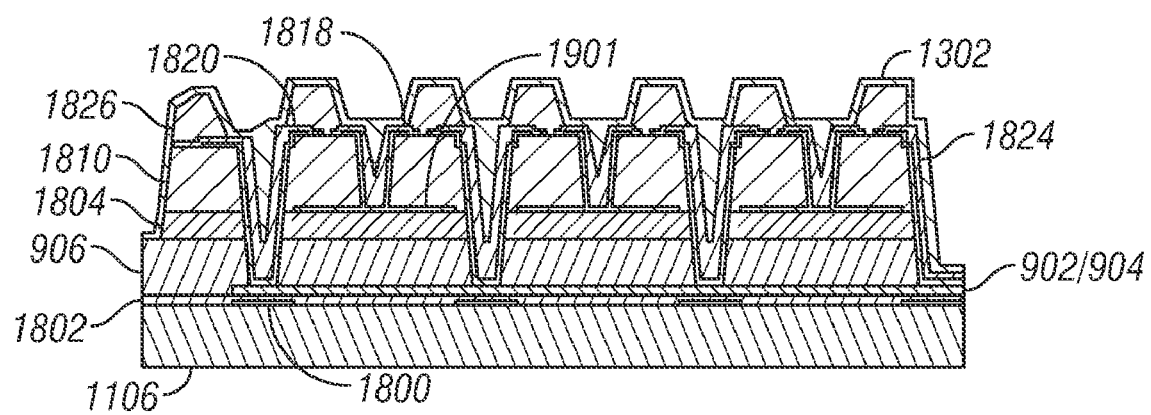
Figure 12Q:
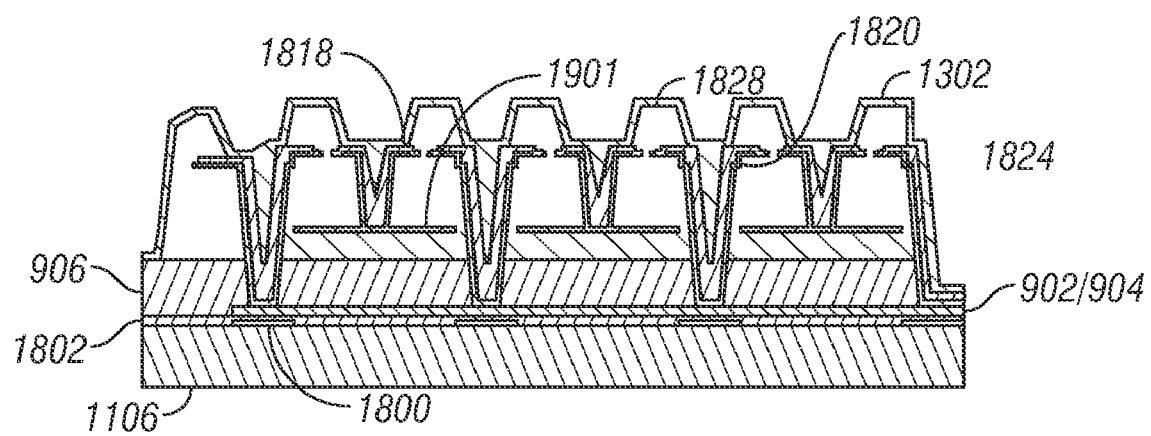

An exemplary series of processing steps for forming a conductive bus structure located above a second electrode layer 1302 is schematically illustrated in FIGS. 12A-12Q. FIG. 12A shows the deposition of a black mask 1800 over a substrate 1106. In certain embodiments, the black mask 1800 comprises molybdenum.

FIG. 12B shows the black mask 1800 patterned and etched to form islands on top of the substrate 1106. FIG. 12C shows the deposition of an oxide layer 1802 over the black mask 1800 and the substrate 1106, and the deposition of a metal layer 904 (or a "first reflective layer" 904, the reflective surface 901 being a "second reflective surface" 901) and a first electrode layer 902 over the oxide layer 1802. In certain embodiments, the metal layer 904 comprises chromium and the first electrode layer 902 comprises indium tin oxide (ITO). Black masks may also be used in other portions of the MEMS device 1300, for example to prevent undesired modulation of light and/or to minimize the reflectance of areas that do not modulate light, thereby improving contrast ratio.

FIG. 12D show the first electrode layer 902 and the metal layer 904 patterned and etched to form an electrode 902 compatible with interferometric modulator columns, rows, or other useful configurations in accordance with the display design. In the exemplary embodiment illustrated in FIGS. 12A-12Q, the first electrode layer 902 is usable as a column electrode.

A dielectric (e.g., silicon dioxide) layer 906 is formed over the metal layer 904, the first electrode layer 902, and the oxide layer 1802, as illustrated in FIG. 12D.

FIG. 12E shows the formation of a sacrificial layer 1804. In certain embodiments, the sacrificial layer 1804 determines the dimension of the cavity over which the reflective surface 901 is suspended. The interference properties of the cavities are directly affected by their depth. Certain embodiments having color interferometric modulators construct modulators having cavities of differing depths which provide the resultant quiescent colors of red, green, and blue. To produce these varying cavity dimensions, a different thickness of the sacrificial layer 1804 is deposited for each of the different colored interferometric modulators.

For example, in certain embodiments, a first sacrificial layer is deposited, masked and patterned, with the first sacrificial layer defining the area of a first modulator. A second sacrificial layer is then be deposited and patterned to define the combined area of the first modulator defined above and a second modulator. The combined thicknesses of the first sacrificial layer and the second sacrificial layer in the area of the first interferometric modulator is larger than the thickness of the second sacrificial layer in the area of the second interferometric modulator. Subsequently, in certain embodiments, a third sacrificial layer is formed over the second sacrificial layer defining the combined area of the first, second, and third interferometric modulator for each set of colored interferometric modulators. This third sacrificial layer need not be patterned in certain embodiments, since its thickness will be included in all three of the modulators of the set of colored interferometric modulators.

The three individual sacrificial layers described here may be of different thicknesses. In this way, the first modulator of the set of colored interferometric modulators would have a cavity depth equal to the combined thicknesses of the three sacrificial layers. The second modulator of the set of colored interferometric modulators would have a cavity depth equal to the combined thicknesses of two of the three sacrificial layers. The third modulator of the set of colored interferometric modulators would have a cavity depth equal to the thickness of one of the three sacrificial layers. When the sacrificial layers are removed, the cavity dimensions will vary according to the various combined thicknesses of the three sacrificial layers, resulting in three different colors such as red, green, and blue.

FIG. 12F illustrates the deposition of a reflective surface layer 1901 over the dielectric layer 906. In FIG. 12G, the reflective surface layer 1901 was patterned and etched to form islands of the reflective surface layer 1901.

FIG. 12H illustrates the deposition of a sacrificial layer 1810 over the reflective surface layer 1901 and the dielectric layer 906. In certain embodiments, the sacrificial layer 1810 comprises molybdenum.

In FIG. 12I, the sacrificial layer 1810 has been patterned and etched to form conductive bus holes 1812 and reflective surface layer holes 1814. The conductive bus holes 1812 extend through the sacrificial layer 1810 and intervening layers to the first electrode layer 902. The reflective surface layer holes 1814 extend through the sacrificial layer 1810 to the reflective surface layer 1901.

In FIG. 12J, a conductive layer 1816 is deposited over the sacrificial layer 1810 and in the conductive bus holes 1812 and the reflective surface layer holes 1814. The conductive layer 1816 is electrically coupled to the first electrode layer 902 through the conductive bus holes 1812. The conductive layer 1816 is electrically coupled to the reflective surface layer 1901 through the reflective surface layer holes 1814.

In FIG. 12K, the conductive layer 1816 is patterned and etched to form a conductive bus structure 1820 and reflective surface layer connectors 1818. The reflective surface layer connectors 1818 illustrated in FIG. 12K are electrically isolated from the conductive bus structure 1820.

In FIG. 12L, a dielectric layer 1824 is deposited. In FIG. 12M, the dielectric layer 1824 is patterned and etched to remove portions of the dielectric layer 1824 in regions located between the conductive bus structure 1820 and the reflective surface layer connectors 1818.

FIG. 12N illustrates the deposition of a sacrificial layer 1826. In FIG. 12O, the sacrificial layer 1826 is patterned and etched to form landings 1828 for a second electrode layer 1302. In FIG. 12P, the second electrode layer 1302 has been deposited, patterned, and etched. In FIG. 12Q, the sacrificial layers 1804, 1810, 1826 are removed, resulting in the interferometric modulator having the bus structure 1820.

Alone, or in combination with the features described above, the capacitance of the interferometric modulators can be reduced. Reducing the capacitance of the circuit reduces the RC time constant.

Refresh Rate

The time required to charge and discharge or change the applied voltage across the first electrode layer 902 and the second electrode layer 1302 can affect the refresh rate of the display. For example, a decrease in the reaction time of the second electrode layer 1302 to changes in the applied voltage allows the display to refresh in less time. A faster refreshing display can provide a less noticeable transition between subsequent frames.

Image Resolution

In certain embodiments, the use of a conductive bus structure comprising complex routing lines along the backside of an array of interferometric modulators improves grayscale display techniques. Techniques for displaying a grayscale image include subdividing the pixels into a plurality of interferometric modulators or smaller sub-pixels. By having more sub-pixels in each pixel, deeper grayscales can be achieved. However, increasing the number of sub-pixels increases the complexity of the required routing to the row and column drivers located at the perimeter of the display array.

In certain embodiments, the use of a conductive bus structure improves the grayscale display. In temporal modulation, each interferometric modulator of a grayscale image is pulsed or rapidly refreshed so that the viewer perceives the display to be exhibiting variations in intensity level. In certain embodiments, the refresh or modulation rate of the interferometric modulator is increased with the incorporation of one or more of the modifications described above. The refresh rate can be calculated by the following calculation:

$$\tau_{line} = \tau_{rc} + \tau_{interferometric\ modulator}$$

where, $\tau_{line}$ is the time to update one line; $\tau_{rc}$ is the RC time for the line; and $\tau_{interferometric\ modulator}$ is the mechanical response time of the interferometric modulator. Then:

$$\tau_{refresh} = n_{rows} \times \tau_{line}$$

where, $\tau_{refresh}$ is the time it takes to update the entire screen; and $n_{rows}$ is the number of rows on the display. Then:

$$\text{Screen Refresh Rate} = \frac{1}{\tau_{refresh}}$$

where: Screen Refresh Rate is the update rate of the entire display, typically in Hz.

Thus, as $\tau_{rc}$ is decreased with the use of the conductive bus, $\tau_{line}$ decreases and $\tau_{refresh}$ decreases. As $\tau_{refresh}$ decreases, the Screen Refresh Rate increases and enhances temporal modulation.

Referring back to FIGS. 8A and 8B, the first electrode layer 902 has an intrinsic conductivity depending on the material selected for the first electrode layer 902. The electrical circuit resistance of the interferometric modulator can be reduced by utilizing a material for the first electrode 902 that has a higher conductivity. In certain embodiments, the material selected for the first electrode layer 902 comprises zinc tin oxide (ZnTO) which has a higher conductivity as compared to indium tin oxide (ITO).

The thickness of the first electrode layer 902 may vary. In certain embodiments, the thickness may be between about 300 angstroms and about 2,000 angstroms measured in a direction that is parallel to the direction 903 in FIG. 8B. Other thicknesses of the first electrode layer 902 may be used.

A material with a low dielectric constant can be selected for the dielectric material 906 that separates the first electrode layer 902 from the second electrode layer 1302. The dielectric material 906 electrically insulates the second electrode layer 1302 from the first electrode layer 902, allowing a charge or voltage to be stored between the first and second electrode layers 902, 1302. The dielectric layer 906 further allows the voltage or charge to form an electro-static force that acts upon the second electrode layer 1302. A material for the dielectric layer 906 having a low dielectric constant advantageously reduces the RC time constant of the electrical circuit. For example, a low dielectric constant, k, material can have a lower dielectric constant than a dielectric made from silicon dioxide (3.8). In certain embodiments, the dielectric constant of the dielectric layer 906 is as low as about 2.0.

Reduce Capacitance

Different and additional materials can be added to reduce the capacitance of the electrical circuit. In certain embodiments, the material selected for the dielectric layer 906 can reduce the capacitance of the electrical circuit. These materials include spun-on-glass, SiN, $SiO_2$, $Al_2O_3$, and composites of one or more of these materials.

Figure 13:
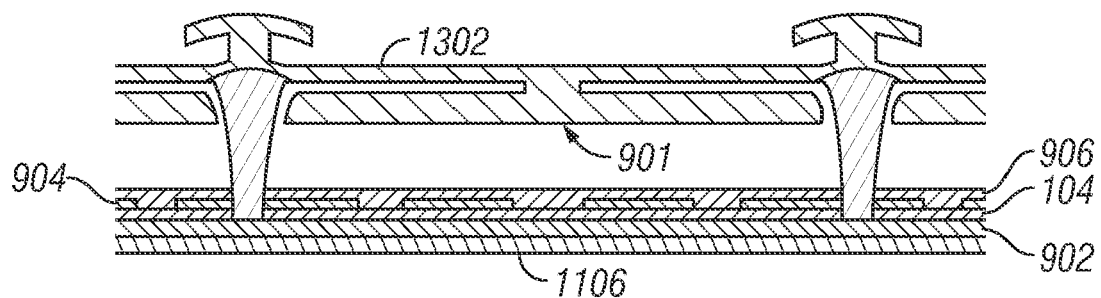
FIG. 13 shows a cross-sectional view of an embodiment of an interferometric modulator having an additional dielectric layer located within the optical stack layer.

In certain embodiments, as illustrated in FIG. 13, the second dielectric layer 104 is provided between the metal layer 904 and the first electrode layer 902. The second dielectric layer 104 is in addition to the dielectric or oxide layer 906. In such embodiments, the dielectric layer 104 separates the optical functions of the metal layer 904 from the electrical functions of the first electrode layer 902. In certain embodiments, this configuration does not adversely impact the image quality of the display.

In certain embodiments of interferometric modulators, the reduction in capacitance due to the addition of the second dielectric layer 104 is a function of the thicknesses of the dielectric layer 906 and the second dielectric layer 104 when the reflective surface 901 is in the "near" position. In certain embodiments, the two dielectric layers 906, 104 comprise the same material, while in other embodiments, the two dielectric layers 906, 104 comprise different materials. The capacitance of an interferometric modulator can be approximated by the equation below when the dielectric layer 906 and the second dielectric layer 104 are the same material.

$$\text{Capacitance} \approx \frac{(\text{Area of Reflective Surface 901}) \times (\text{Dielectric Constant}) \times (\text{Permittivity Constant})}{(\text{Thickness of Dielectric Layer 906}) + (\text{Thickness of Dielectric Layer 104})}$$

Figure 14:
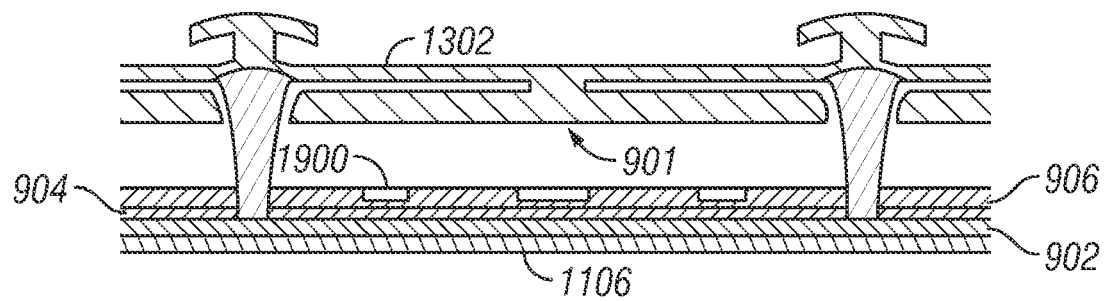
FIG. 14 shows a cross-sectional view of an embodiment of an interferometric modulator having air pockets located within the dielectric layer.

In certain embodiments, the thickness of the dielectric layer 906 may vary. For example, as illustrated in FIG. 14, the dielectric layer 906 may comprise one or more air gaps 1900 embedded within the dielectric layer 906.

Figure 15:
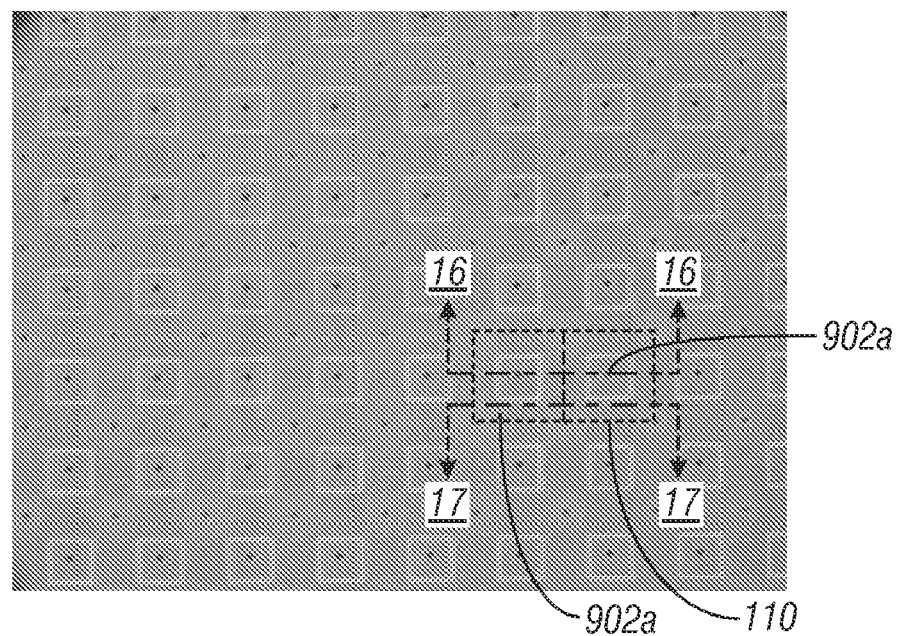
FIG. 15 shows an embodiment of a patterned electrode with a decreased electrically active area.
Figure 18:
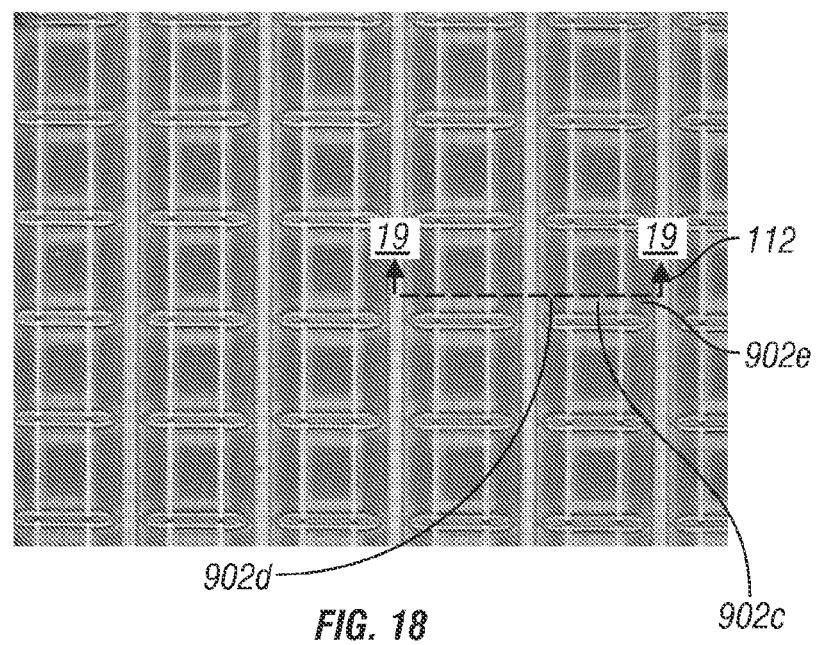
FIG. 18 shows an alternative embodiment of a patterned electrode.

FIGS. 15 and 18 illustrate an array of adjacent interferometric modulators 110 arranged in rows and columns, each having a center portion of the first electrode layer 902 that is electrically isolated from a peripheral portion of the first electrode layer 902. In certain embodiments, cuts in the first electrode layer 902 separate the center portion from the peripheral portion. In certain such embodiments, the area of the portion of the first electrode layer 902 participating in the driving of the interferometric modulator is 110 reduced, thereby reducing the capacitance of the circuit.

Figure 16:
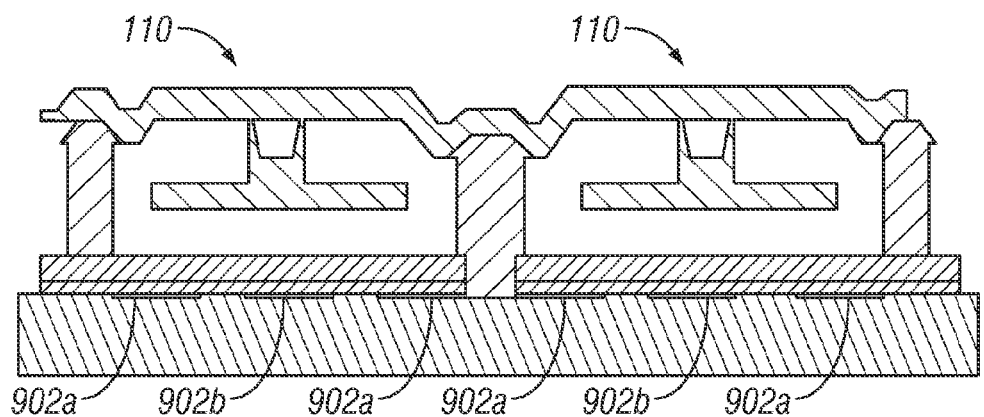
FIG. 16 is a cross-sectional view of an interferometric modulator corresponding to FIG. 15 in a plane through active and inactive areas taken along line 16-16.
Figure 17:
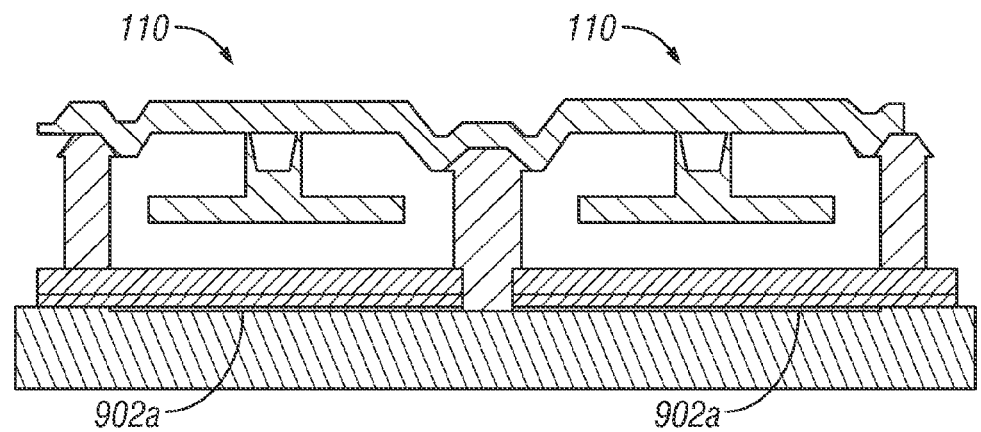
FIG. 17 is another cross-sectional view of an interferometric modulator corresponding to FIG. 15 in a plane through the active area only taken along line 17-17.

In certain embodiments, only the peripheral portion contributes to the electrically active area of the first electrode layer 902. In certain such embodiments, the peripheral portions are electrically connected to a conductive bus structure. In certain other embodiments, only the center portion contributes to the electrically active area of the first electrode layer 902. In certain such embodiments, the center portions are electrically connected to a conductive bus structure. FIGS. 16 and 17 are cross-sections of two adjacent interferometric modulators 110 taken along lines 16-16 and 17-17, respectively, of FIG. 15 and having an electrically active center portion 902a which is electrically isolated from a peripheral portion 902b of both interferometric modulators 110.

Figure 19:
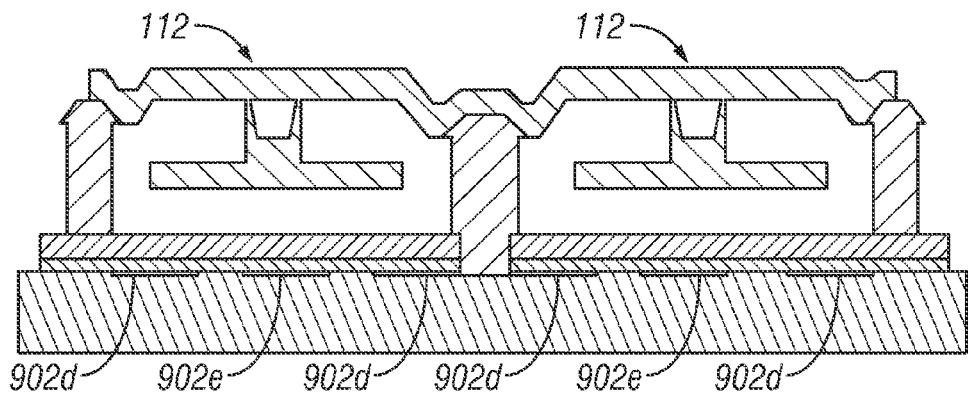
FIG. 19 is a cross-sectional view of the interferometric modulator corresponding to FIG. 18 taken along line 19-19.

FIG. 18 illustrates an array of interferometric modulators 112 arranged in rows and columns, each interferometric modulator 112 having a first electrode layer 902 with a column portion 902c that is electrically isolated from two peripheral portions 902d, 902e of the first electrode layer 902. In certain embodiments, one or more of the peripheral portions 902c, 902d, 902e contribute to the electrically active area of the first electrode layer 902 and one or more of the peripheral portions 902c, 902d, 902e do not contribute to the electrically active area of the first electrode layer 902. FIG. 19 is a cross-section view of two interferometric modulators 112 taken along line 19-19 of FIG. 18 and having electrically active peripheral portions 902d, 902e electrically isolated from non-electrically active column portions 902c of both interferometric modulators.

In certain embodiments, a MEMS device comprises a first reflective layer, a movable element over the first reflective layer, and an actuation electrode. The movable element comprises a deformable layer and a reflective element. As described above, in certain embodiments the optical properties of the movable element are separated from the mechanical properties of the movable element (e.g., by providing a deformable layer and a reflective element). In certain embodiments, the optical properties of the movable element are separated from the electrical properties of the movable element as well as the mechanical properties of the movable element by positioning the actuation electrode between the deformable layer and the reflective element.

Figure 20:
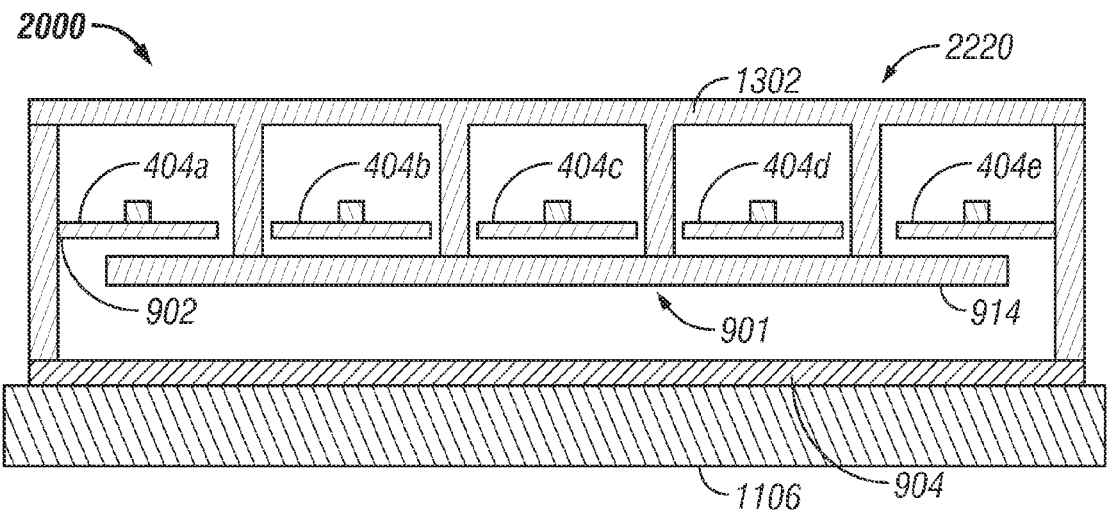
FIG. 20 shows an embodiment of an interferometric modulator having the area responsible for the electrostatic force decoupled from the reflective surface layer.
Figure 21:
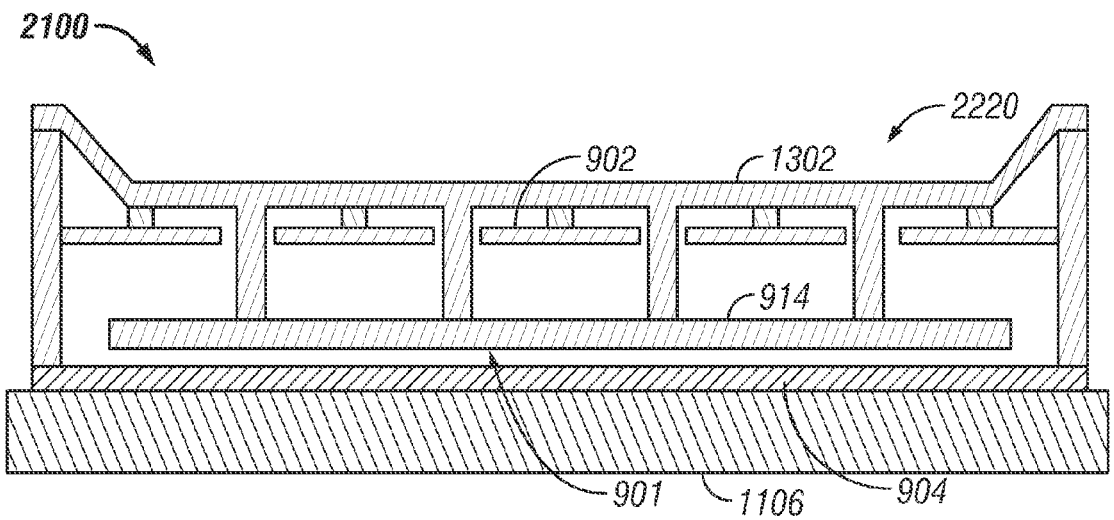
FIG. 21 shows an embodiment of the interferometric modulator of FIG. 20 in an "on" state.

FIGS. 20 and 21 illustrate an embodiment of a MEMS device in the unactuated (or "relaxed") and actuated states, respectively. The MEMS device comprises a movable element 2220 over a first reflective layer 904. The movable element 2220 comprises a deformable layer 1302 and a reflective element 914 having a reflective surface 901. The MEMS device further comprises an actuation electrode 902 comprising electrically active areas 404a, 404b, 404c, 404d, 404e between the deformable layer 1302 and the reflective element 914. In certain embodiments, the deformable layer 1302 is attracted towards the electrically active areas 404a-404e of the actuation electrode 902 by electrostatic forces, which pull the deformable layer 1302 towards the electrically active areas 404a-404e. The reflective element 914 is mechanically coupled to the deformable layer 1302 such that, as the deformable layer 1302 moves towards the electrically active areas 404a-404e, the reflective surface 901 of the reflective element 914 moves a corresponding distance relative to and towards the first reflective layer 904, and in some embodiments the substrate 1106. The movement of the reflective surface 901 turns the MEMS device "on" or "off," as described above. By decoupling the electrical function from the optical function, the area of the electrically active portion of the movable element 2220 can be reduced to be smaller than the area of the optical portion of the movable element 2220.

Figure 22A:
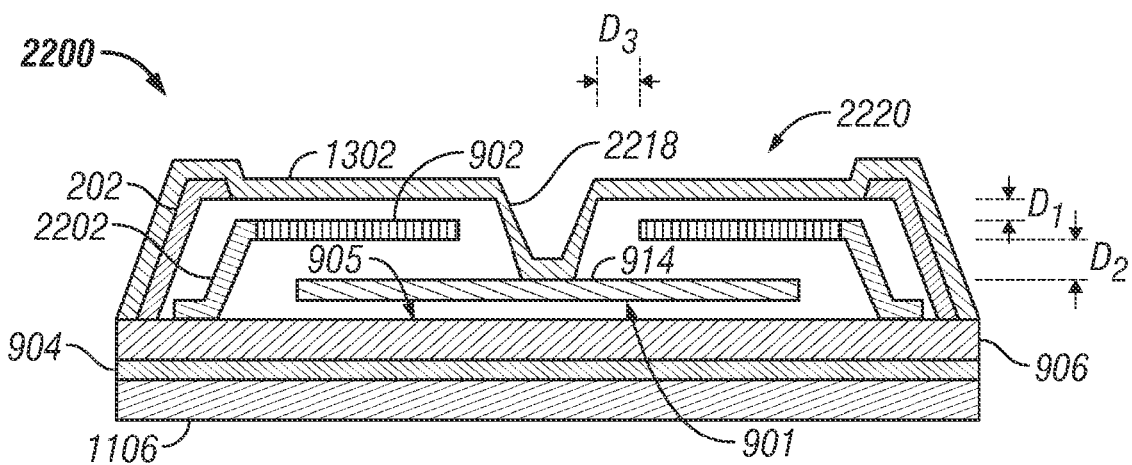
FIG. 22A is a cross-sectional view of an embodiment of a MEMS device having the optical function separated from the electrical function and the mechanical function.
Figure 22B:
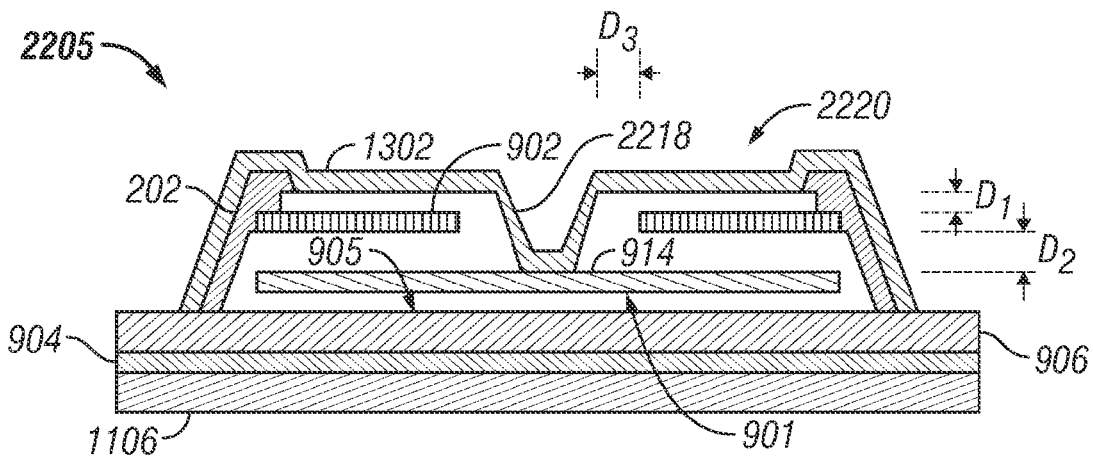
FIG. 22B is a cross-sectional view of yet another embodiment of a MEMS device having the optical function separated from the electrical function and the mechanical function.
Figure 22C:
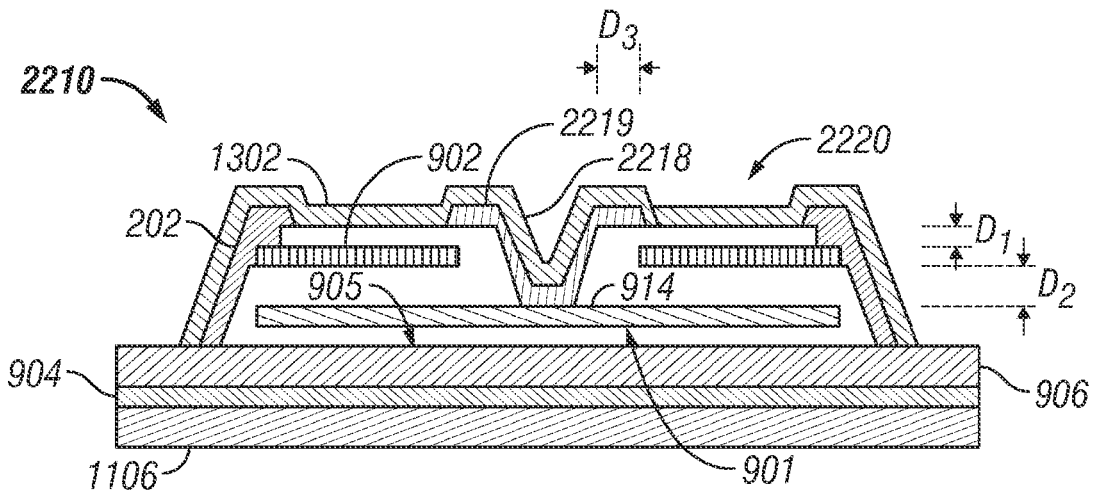
FIG. 22C is a cross-sectional view of still another embodiment of a MEMS device having the optical function separated from the electrical function and the mechanical function.

FIGS. 22A-22C illustrate example embodiments of MEMS devices 2200, 2205, 2210, respectively, comprising a first reflective layer 904, a movable element 2220 over the first reflective layer 904, and an actuation electrode 902. The movable element 2220 comprises a deformable layer 1302 and a reflective element 914 having a second reflective surface 901. The actuation electrode 902 is between the deformable layer 1302 and the reflective element 914. In certain embodiments, a horizontal distance (labeled $D_3$ in FIGS. 22A-22C) between the deformable layer 1302 and the actuation electrode 902 is between about 5 and 20 μm. In certain embodiments, a vertical distance (labeled $D_1$ in FIGS. 22A-22C) between the deformable layer 1302 and the actuation electrode 902 is between about 200 nm and 2 μm.

In the embodiments illustrated in FIGS. 22A-22C, the MEMS devices 2200, 2205, 2210 comprise support structure (or "post") 202 and an optional insulating layer 906, and are formed on a substrate 1106. Other configurations are also possible. In certain embodiments, as described below, the MEMS devices 2200, 2205, 2210 do not comprise an insulating layer 906. Although the embodiments illustrated in FIGS. 22A-22C have deformable layers 1302 supported by support structures 202, other embodiments are also possible (e.g., as illustrated in FIGS. 7C-7E, as described below).

As illustrated in FIGS. 22A-22C, in some embodiments, the first reflective layer 904 is between the movable elements 2220 and the substrate 1106. In certain such embodiments, the movable element 810 comprises a partially reflective and partially transmissive material and the first reflective layer 94 comprises a fully reflective material. In some embodiments, the movable elements 2220 of FIGS. 22A-22C are between the first reflective layer 904 and the substrate 1106. In certain such embodiments, the movable element 810 comprises a fully reflective material and the first reflective layer 94 comprises a partially reflective and partially transmissive material In FIG. 22A, the actuation electrode 902 is supported by support structures 2202. Certain such embodiments may be useful for embodiments in which the MEMS device 2200 does not comprise the support posts 202 with which to support the actuation electrode 902 (e.g., as depicted in FIGS. 7C and/or 24F). For example, such processes may be useful for simplification of the fabrication process. In FIGS. 22B and 22C, the actuation electrode 902 is supported by the support posts 202. Certain such embodiments can allow for larger reflective elements 914 (e.g., because the reflective element 914 can extend into areas occupied by support structures 2202 in FIG. 22A when all other dimensions are the same), thereby enhancing fill factor.

In the embodiments illustrated in FIGS. 22A-22C, the movable element 2220 further comprises a connecting element 2218 that mechanically couples the deformable layer 1302 and the reflective element 914 together. In embodiments in which the connecting element 2218 is electrically conductive and electrically couples the deformable layer 1302 and the reflective element 914 together, any potential that builds up on the reflective element 914 can discharge through the deformable layer 1302. Such discharge can reduce arcing that can result from two conductors at different potentials.

FIG. 22C illustrates an embodiment in which the movable element 2220 further comprises a connecting element 2219, which mechanically couples the deformable layer 1302 and the reflective element 914 together. The connecting element 2219 may be insulating (e.g., comprising $SiO_2$, $Al_2O_3$) or conductive (e.g., comprising nickel, aluminum, etc.). Certain embodiments in which the connecting element 2219 is conductive may advantageously decrease an amount of curvature and/or tilt of the reflective element 914 (e.g., in embodiments in which the materials for the deformable layer 1302 and the reflective element 914 have different internal stresses and/or coefficients of thermal expansion, the connecting element 2219 may decrease and/or absorb the stresses).

Electrostatic forces are due to electrical potential differences. In embodiments in which the movable element 2220 comprises an insulating connecting element 2219, the potential of the reflective element 914 can be about zero when the potential of the deformable layer 1302 is not zero. In certain such embodiments, the electrostatic forces acting on the deformable layer 1302 in response to voltages applied to the actuation electrode 902 may selectively be larger than the electrostatic forces acting on the reflective element 914 in response to voltages applied to the actuation electrode 902. Thus, the movable element 2220 may be configured to actuate towards first reflective layer 904 in response to voltages applied to the actuation electrode 902. Moreover, the area of a capacitor (e.g., between the actuation electrode 902 and deformable layer 1302) can be advantageously small, thereby taking less time to discharge than large capacitors (e.g., between reflective elements and actuation electrodes in the optical path), which can decrease response time. However, in embodiments in which the reflective element 914 is electrically insulated from the deformable layer 1302 or other structures, the reflective element 914 may become charged, thereby creating an electrostatic force itself In some embodiments, the reflective element 914 is coated (e.g., with plastic) to selectively dissipate electrostatic discharge.

In embodiments in which the deformable layer 1302 is in electrical communication with the reflective element 914 (e.g., due to a conductive connecting element 2218 and/or conductive connecting element 2219), the deformable layer 1302 and the reflective element 914 are at the same potential. In certain such embodiments, when a voltage is applied to the actuation electrode 902, a first attractive force in a first direction (e.g., towards the reflective element 914) acts on a first portion of the movable element 2220 (e.g., the deformable layer 1302) and a second attractive force in a second direction (e.g., away from the reflective element 914) acts on a second portion of the movable element 2220 (e.g., the reflective element 914). In certain other such embodiments, when a voltage is applied to the actuation electrode 902, a first attractive force in a first direction (e.g., away from the reflective element 914) acts on a first portion of the movable element 2220 (e.g., the reflective element 914) and a second attractive force in a second direction (e.g., towards the reflective element 914) acts on a second portion of the movable element 2220 (e.g., the deformable layer 1302). The second direction is substantially opposite to the first direction. In embodiments in which the first attractive force is greater than the second attractive force, the movable element 2220 is responsive to the first and second attractive forces by moving generally in the first direction, for example in a direction generally perpendicular to substrate 1106.

Other embodiments of MEMS devices comprising an actuation electrode 902 between a deformable layer 1302 and a reflective element 914 are also possible. For example, a MEMS device may comprise a connecting element 2219 as well as support structures 2202. Additionally, while not depicted in FIGS. 22A-22C, certain portions of the MEMS device may be in electrical communication with certain other portions. For example, the reflective element 914 and/or the deformable layer 1302 may be in electrical communication with the first reflective layer 904 (e.g., as depicted in FIGS. 22D and 22E).

Figure 22D:
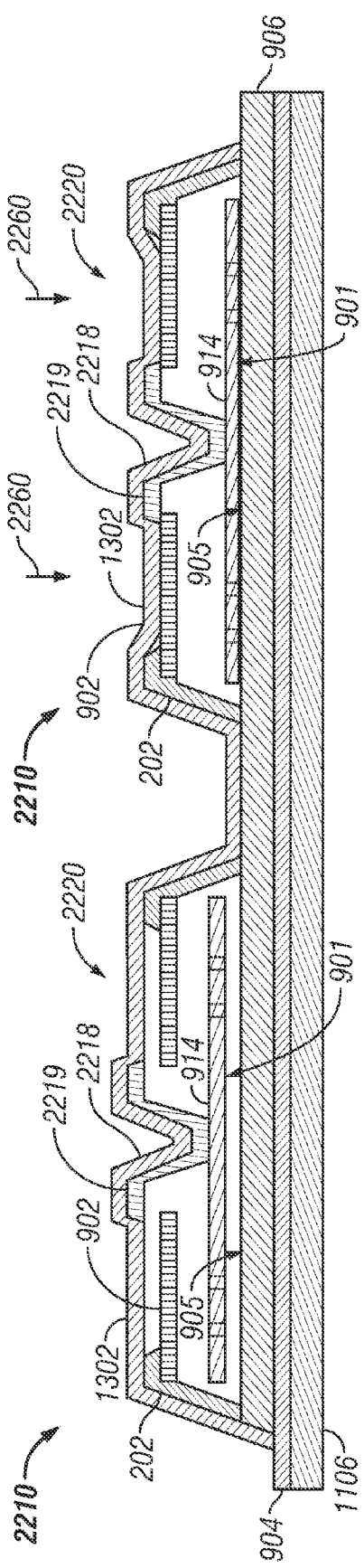
FIGS. 22D-22F are cross-sectional views of various embodiments of the MEMS device of FIG. 22C in actuated and relaxed states.

FIG. 22D illustrates an embodiment of the MEMS device 2210 of FIG. 22C in an unactuated state on the left and in an actuated state on the right. The first portion of the movable element 2220 acted on by the first attractive force comprises the deformable layer 1302 and the second portion of the movable element 2220 acted on by the second attractive force comprises the reflective element 914. The movable element 2220 is responsive to the first and second attractive forces by moving generally in the first direction, for example in a direction generally perpendicular to the substrate 1106 as illustrated by arrows 2260. The movable element 2220 is responsive to the attractive forces by moving generally in the direction of the arrows 2260 because the attractive forces acting on the deformable layer 1302 are greater than the attractive forces acting on the reflective element 914 (e.g., because the reflective element 914 is further away from the actuation electrode 902 than the deformable layer 1302, because the reflective element 914 is shielded from the actuation electrode 902). A lower surface of the deformable layer 1302 contacts a stationary portion of the MEMS device 2210 (e.g., the actuation electrode 902). In certain such embodiments, the reflective element 914 does not contact the top surface 905 of the substrate 1106 (e.g., the top surface 905 of the insulating layer 906 or the top surface 905 of the first reflective layer 904) in the actuated state.

Figure 22E:
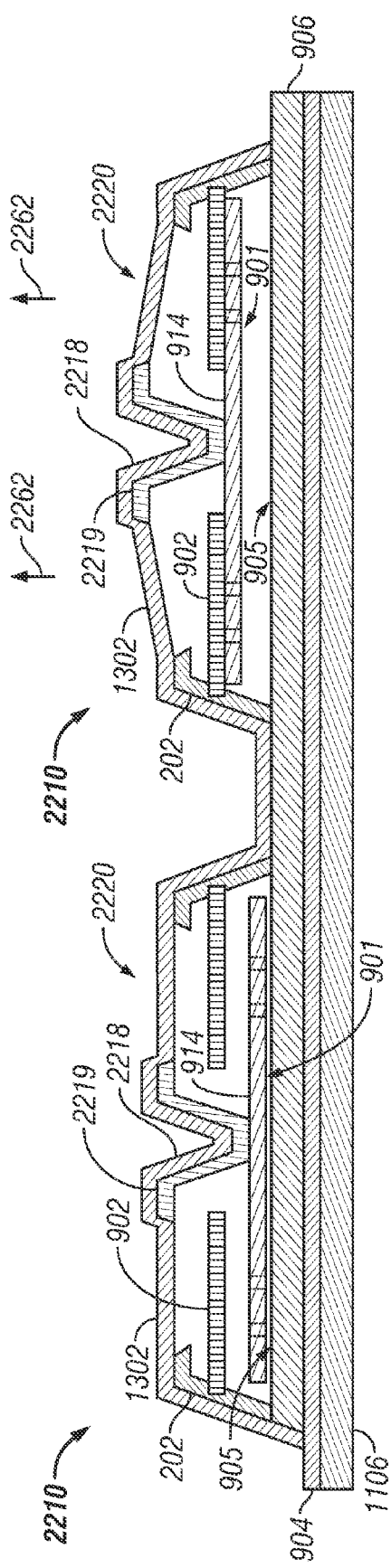

FIG. 22E illustrates another embodiment of the MEMS device 2210 of FIG. 22C in an unactuated state on the left and in an actuated state on the right. The first portion of the movable element 2220 acted on by the first attractive force comprises the reflective element 914 and the second portion of the movable element 2220 acted on by the second attractive force comprises the deformable layer 1302. The movable element 2220 is responsive to the first and second attractive forces by moving generally in the first direction, for example in a direction generally perpendicular to the substrate 1106 as illustrated by arrows 2262. The movable element 2220 is responsive to the attractive forces by moving generally in the direction of the arrows 2262 because the attractive forces acting on the reflective element 914 are greater than the attractive forces acting on the deformable layer 1302 (e.g., because the deformable layer 1302 is further away from the actuation electrode 902 than the reflective element 914, because the deformable layer 1302 is shielded from the actuation electrode 902). An upper surface of the reflective element 914 contacts a stationary portion of the MEMS device 2210 (e.g., the actuation electrode 902). In certain such embodiments, the reflective element 914 does not contact the top surface 905 of the substrate 1106 (e.g., the top surface 905 of the insulating layer 906 or the top surface 905 of the first reflective layer 904) in the relaxed state.

Figure 22F:
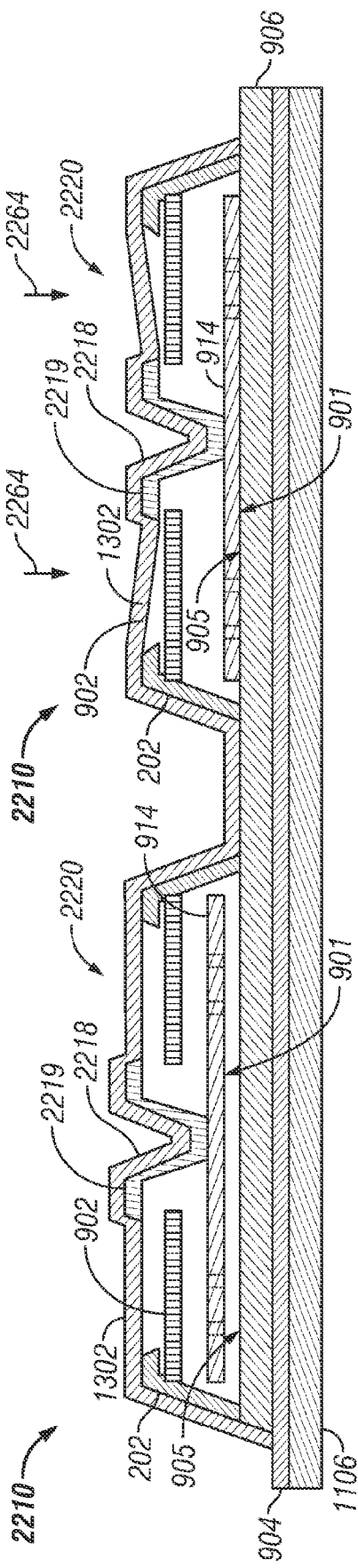

FIG. 22F illustrates yet another embodiment of the MEMS device 2210 of FIG. 22C in an unactuated state on the left and in an actuated state on the right. The first portion of the movable element 2220 acted on by the first attractive force comprises the deformable layer 1302 and the second portion of the movable element 2220 acted on by the second attractive force comprises the reflective element 914. The movable element 2220 is responsive to the first and second attractive forces by moving generally in the first direction, for example in a direction generally perpendicular to the substrate 1106 as illustrated by arrows 2264. In contrast to the embodiment illustrated in FIG. 22D, a lower surface of the deformable layer 1302 does not contact a stationary portion of the MEMS device 2210 (e.g., the actuation electrode 902). Instead, the reflective surface 901 of the reflective element 914 contacts the top surface 905 of the substrate 1106 (e.g., the top surface 905 of the insulating layer 906 or the top surface 905 of the first reflective layer 904) in the actuated state.

In certain embodiments described above in which the MEMS device comprises an actuation electrode 902 in the optical path and an insulating layer 906, and in which the reflective surface 901 of the reflective element 914 contacts the top surface 905 of the insulating layer 906 in the actuated state, the area of contact includes a dielectric layer. To avoid trapping charges in the dielectric layer, the polarity of the voltages applied to the actuation electrode 902 and the movable element can be alternately switched. Switching polarity dissipates charge, but consumes power. However, in certain embodiments in which the MEMS device 2210 does not comprise the insulating layer 906 and in which the reflective surface 901 of the reflective element 914 contacts the top surface 905 of the first reflective layer 904 in the actuated state, the contact is advantageously free of an electric field. As such, the voltages applied to the actuation electrode 902 and the movable element 2220 may remain the same, which advantageously saves power.

Referring again to FIGS. 22A-22C, in certain embodiments, in the relaxed state, the deformable layer 1302 is separated from the actuation electrode 902 by a distance $D_1$ and the reflective element 914 is separated from the actuation electrode 902 by a distance $D_2$ that is different than $D_1$. The electrostatic force between two conductive layers with a potential difference between the two conductive layers is inversely proportional to the distance between the two conductive layers. Thus, the smaller the distance between the actuation electrode 902 and a portion of the movable element 2220, the greater the magnitude of the electrostatic forces acting on that portion of the movable element 2220. If the distance $D_2$ is greater than the distance $D_1$, the electrostatic forces per unit area acting on the deformable layer 1302 are greater than the electrostatic forces acting per unit area on the reflective element 914. In certain such embodiments, application of voltages to the actuation electrode 902 will cause the movable element 2220 to move towards the substrate 1106. If the distance $D_1$ is greater than the distance $D_2$, the electrostatic forces per unit area acting on the reflective element 914 are greater than the electrostatic forces per unit area acting on the deformable layer 1302. In certain such embodiments, application of voltages to the actuation electrode 902 will cause the movable element 2220 to move away from the substrate 1106.

In certain embodiments, the percentage difference between the distances $D_1$, $D_2$ is greater than about 5%, greater than about 10%, greater than about 15%, or greater than about 20%. The difference between the distances $D_1$, $D_2$ should be balanced with certain other factors, for example the optical interference properties (e.g., the reflected color) and the thickness of the MEMS device, which also depend on the distances $D_1$, $D_2$. Once there is some amount of imbalance (i.e., a suitable difference between the distances $D_1$, $D_2$), application of voltages to the actuation electrode 902 will attract the portion of the movable element 2220 with the shorter distance towards the actuation electrode 902, thereby decreasing that distance while also increasing the distance from the portion of the movable element 2220 with the larger distance. Thus, even in embodiments having a small amount of imbalance (e.g., due to distance differences below about 10%), the electrostatic forces can suitably cause actuation of the movable element 2220.

Regardless of the distances between the actuation electrode 902 and the first and second portions of the movable element 2220, electrostatic forces may be at least partially reduced by a conductive layer that shields at least a portion of the voltage difference between the actuation electrode 902 and the movable element 2220. For example, shielding the first portion of the movable element 2220 from the actuation electrode 902 can cause the electrostatic forces to act more substantially on the second portion of the movable element 2220. If the first portion of the movable element 2220 that is at least partially shielded from the actuation electrode 902 comprises the reflective element 914, application of voltages to the actuation electrode 902 will cause the movable element 2220 to move towards the first reflective layer 904. If the first portion of the movable element 2220 that is at least partially shielded from the actuation electrode 902 comprises the deformable layer 1302, application of voltages to the actuation electrode 902 will cause the movable element 2220 to move away from the first reflective layer 904. In certain such embodiments, shielding can reduce the thickness of a display device comprising the MEMS device 2200 because there does not need to be a difference between the distances $D_1$, $D_2$, although shielding may also increase design complexity and fabrication costs.

As described above, insulating the reflective element 914 from the deformable layer 1302 with a connecting element 2219 (e.g., certain embodiments described with respect to FIG. 22C), allows the reflective element 914 and the deformable layer 1302 to be at different potentials. In certain such embodiments, if a voltage is applied between the deformable layer 1302 and the actuation electrode 902, and not between the reflective element 914 and the actuation electrode 902, the movable element 2220 will move towards the first reflective layer 904. In certain other embodiments, if a voltage difference is applied between the reflective element 914 and the actuation electrode 902, and not between the deformable layer 1302 and the actuation electrode 902, the movable element 2220 will move away from the first reflective layer 904.

In order to ensure that the displacement in response to voltages applied between the actuation electrode 902 and the movable element 2220 occurs substantially only in the movable element 2220 (e.g., due to deformation of the deformable layer 1302) and substantially not in the actuation electrode 902, the actuation electrode 902 is preferably stiff or rigid. The stiffness of a layer is proportional to the cube of the thickness of the layer. In certain embodiments, the actuation electrode 902 has a thickness such that it substantially does not deform. For example, in embodiments in which the actuation electrode 902 comprises aluminum, the actuation electrode may have a thickness greater than about 2.15 times the thickness of the deformable layer 1302. It will be appreciated that other dimensions (e.g., length and width) may also influence the rigidity of the actuation electrode 902.

Figure 23A:
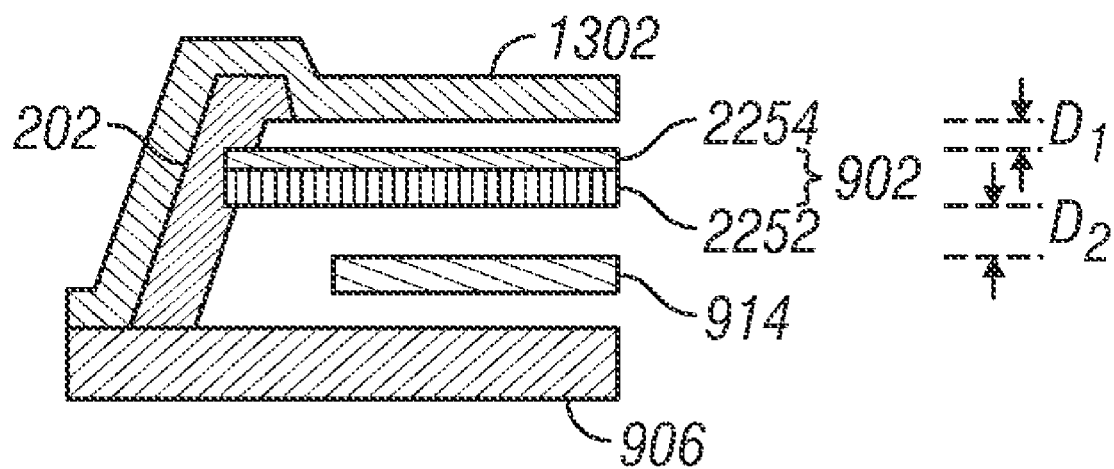
FIGS. 23A and 23B are blown up cross-sectional views of various embodiments of actuation electrodes for a MEMS device having the optical function separated from the electrical function and the mechanical function.

FIG. 23A illustrates a portion of an embodiment in which the actuation electrode 902 comprises a multi-layer stack including a conductive layer 2252 and an insulating layer 2254. In certain embodiments, the conductive layer 2252 comprises a conductive material to which voltages are applied, and the insulating layer 2254 provides the desired rigidity to the actuation electrode 902 and provides electrical insulation to inhibit shorts between the actuation electrode 902 and the movable element 2220. For example, a layer of SiO$_2$ greater than about 1,500 Å thick is sufficiently rigid. In certain alternative embodiments, the conductive layer 2252 comprises a conductive material to which voltages are applied and provides the desired rigidity to the actuation electrode 902, and the insulating layer 2254 provides electrical insulation to inhibit shorts between the actuation electrode 902 and the movable element 2220. In embodiments in which the MEMS device is designed such that the movable element 2220 moves towards the first reflective layer 904 upon actuation, the insulating layer 2254 is preferably above the conductive layer 2252 (e.g., as illustrated in FIG. 23A) because a lower surface of the deformable layer 1302 may contact the actuation electrode 902 when the MEMS device is in the actuated state. In embodiments in which the MEMS device is designed such that the movable element 2220 moves away from the first reflective layer 904 upon actuation, the insulating layer 2254 is preferably below the conductive layer 2252 because an upper surface of the reflective element 914 may contact the actuation electrode 902 when the MEMS device is in the actuated state. Other configurations of multi-layer actuation electrodes 902 are also possible. For example, the actuation electrode 902 may comprise a single rigid layer of conductive material and an insulating layer may be formed on a lower surface of the deformable layer 1302 and/or an upper surface of the reflective element 914.

The thickness of the insulating layer 2254 is included in the distance from the conductive portion 2252 of the actuation electrode 902 to the deformable layer 1302, $D_1$ (e.g., when formed over the conductive portion 2252, as depicted in FIG. 23A) or to the reflective element 914, $D_2$ (e.g., when formed under the conductive portion 2252). In certain embodiments, the insulating layer 2254 is selected to provide a desired dielectric permittivity to tailor the electrostatic force between the actuation electrode 902 and the movable element 2220.

Figure 23B:
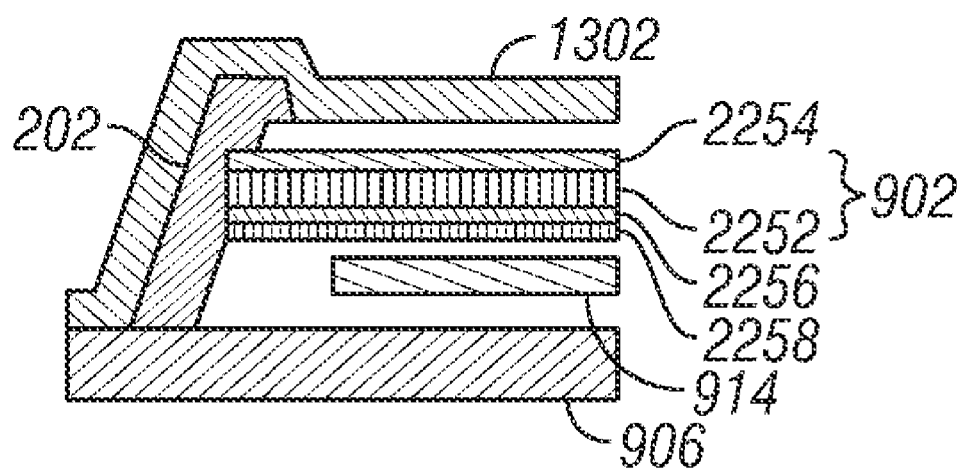

FIG. 23B illustrates another embodiment in which the actuation electrode 902 comprises a multi-layer stack. The actuation electrode 902 comprises a first conductive layer 2252 to which actuation voltages are applied, a first insulating layer 2254 that inhibits shorts between the actuation electrode 902 and the movable element 2220, a second conductive layer 2258 that shields a layer of the movable element 2220 from the electrostatic forces, and a second insulating layer 2256 that insulates the first conductive layer 2252 from the second conductive layer 2258. The second conductive layer 2258 is on an opposite side of the first conductive layer 2252 from the first insulating layer 2254. In embodiments in which the MEMS device is designed such that the movable element 2220 moves towards the first reflective layer 904 upon actuation, the first insulating layer 2254 is above the first conductive layer 2252 (e.g., as illustrated in FIG. 23B) because a lower surface of the deformable layer 1302 may contact the actuation electrode 902 when the MEMS device is in the actuated state, and the second conductive layer 2258 is below the first conductive layer 2252 because the reflective element 914 is at least partially shielded from the electrostatic forces by the second conductive layer 2258. In embodiments in which the MEMS device is designed such that the movable element 2220 moves away from the first reflective layer 904 upon actuation, the first insulating layer 2254 is below the first conductive layer 2252 because an upper surface of the reflective element 914 may contact the actuation electrode 902 when the MEMS device is in the actuated state, and the second conductive layer 2258 is above the first conductive layer 2252 because the deformable layer 1302 is at least partially shielded from the electrostatic forces by the second conductive layer 2258. In certain such embodiments, the dimensions (e.g., thickness) of the actuation electrode 902, comprising the layers 2252, 2254, 2256, 2258, is rigid enough that the actuation electrode 902 substantially does not deform. Other multi-layer stacks are also possible. For example, the actuation electrode 902 may further comprise a third insulating layer on a side of the second conductive layer 2258 opposite the first conductive layer 2252 to provide electrical insulation to inhibit shorts between the actuation electrode 902 and other portions of the movable element 2220.

Figure 24A:
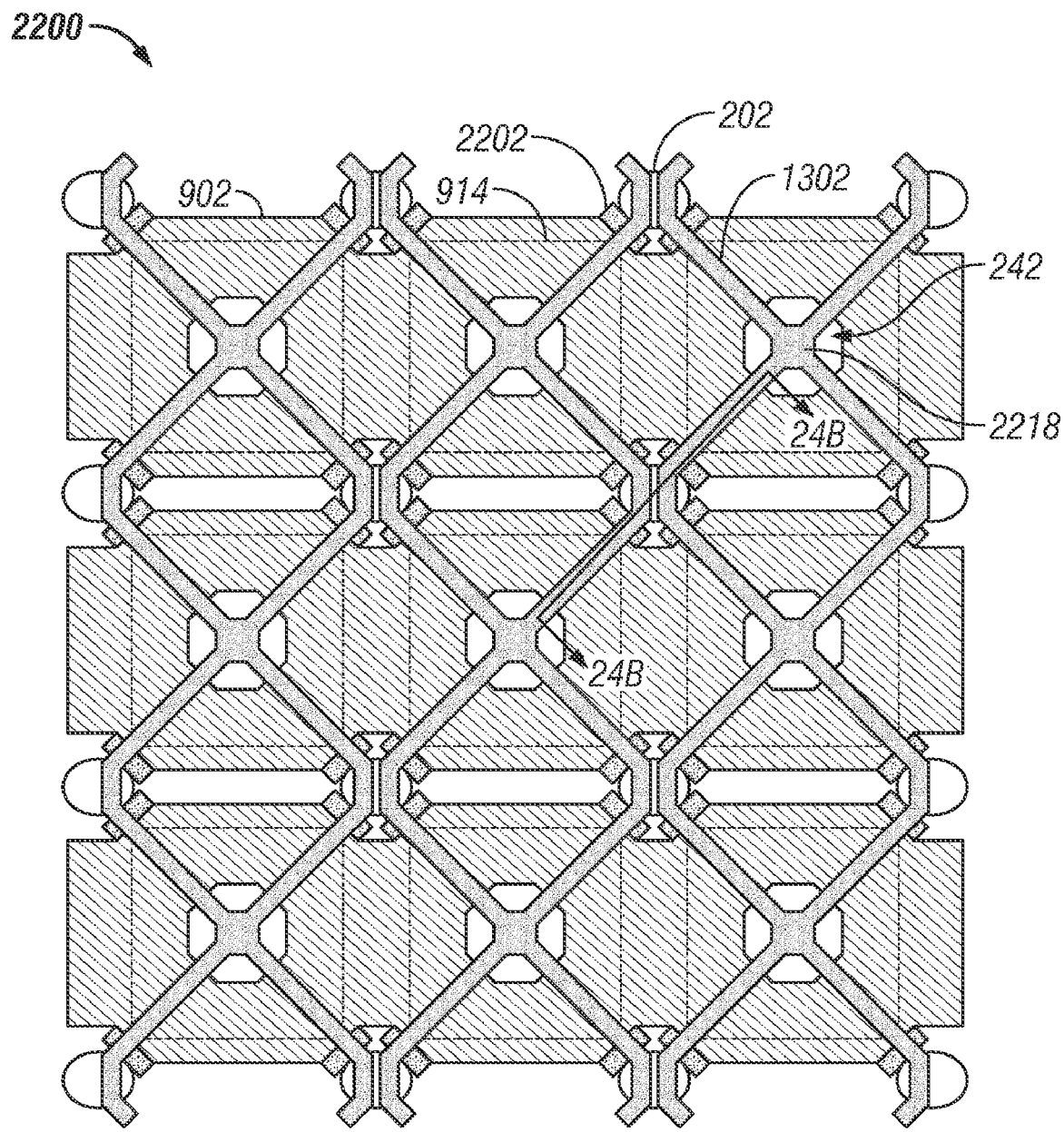
FIG. 24A schematically illustrates an example 3×3 array of MEMS devices having the optical function separated from the electrical function and the mechanical function.
Figure 24B:
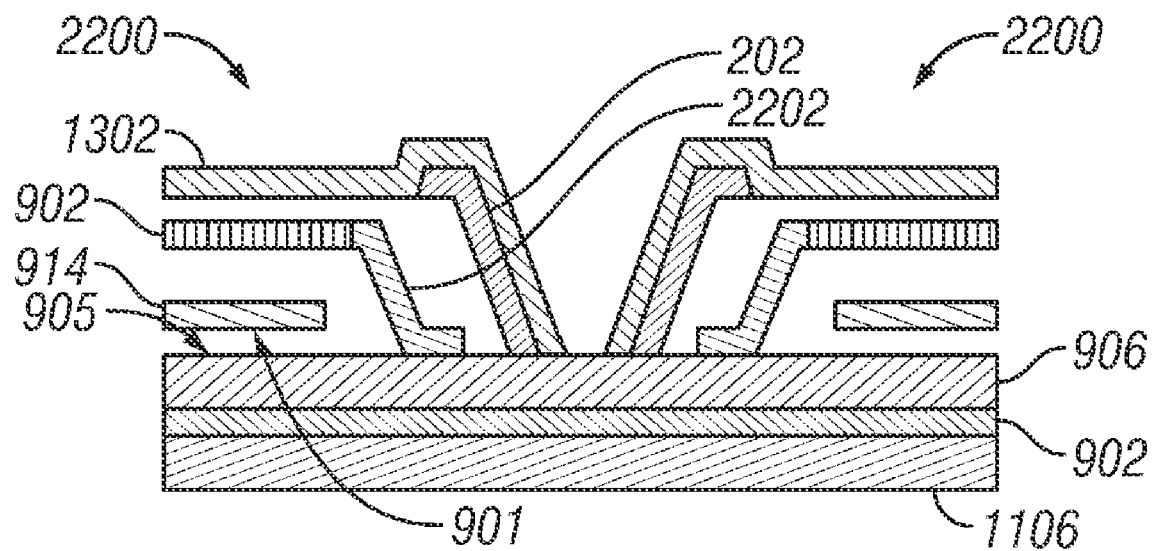
FIG. 24B is a cross-sectional view of the embodiment of FIG. 24A taken along the line 24B-24B.

FIG. 24A illustrates a top plan view of a 3×3 array of MEMS devices 2200. The actuation electrode 902 is disposed between the reflective element 914 (illustrated by the dashed line) and the deformable layer 1302. The actuation electrode 902 illustrated in FIG. 24A is substantially planar and extends between the reflective element 914 and the deformable layer 1302 in a row across a plurality of MEMS devices 2200 (e.g., as illustrated in the cross-sectional view of FIG. 24B). As illustrated, the deformable layer 1302 is mechanically coupled to the reflective element 914 by connecting element 2218 through an aperture 242 in the actuation electrode 902, although a connecting element 2219 or other configurations may also be used. The MEMS devices 2200 comprise support structures 202 below the deformable layer 1302 and supporting the deformable layer 1302. The MEMS devices 2200 further comprise a support structures 2202 below the actuation electrode 902 and supporting the actuation electrode 902 (e.g., as described above with respect to FIG. 22A). In certain alternative embodiments, the deformable layer 1302 is continuous along a row and the actuation electrode 902 is continuous along a column. As described above, when a potential difference is applied to a selected row and column, the capacitor formed at the intersection of the row and column electrodes at the corresponding MEMS device 2200 becomes charged. Accordingly, each of the MEMS devices 2200 is individually addressable.

Figure 24C:
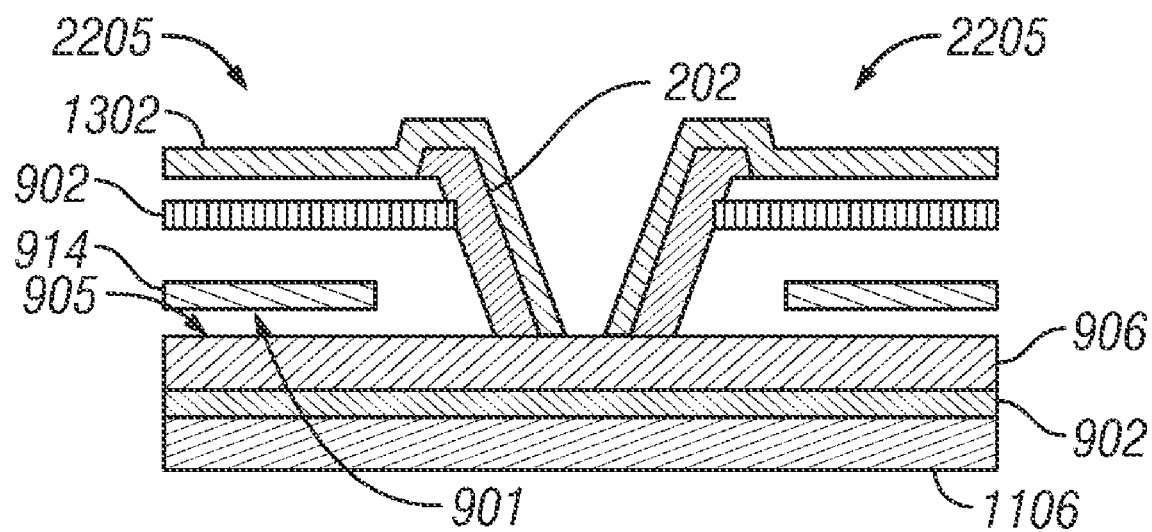
FIG. 24C is a cross-sectional view of another example of portion of a plurality of MEMS devices having the optical function separated from the electrical function and the mechanical function.
Figure 24D:
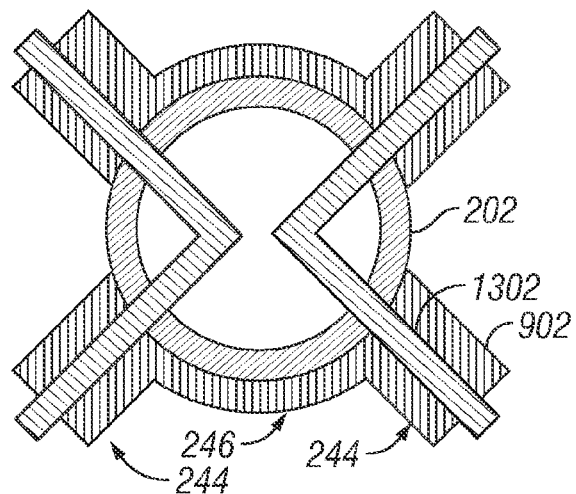
FIG. 24D is a top plan view of a portion of the MEMS devices of FIG. 24C.
Figure 24E:
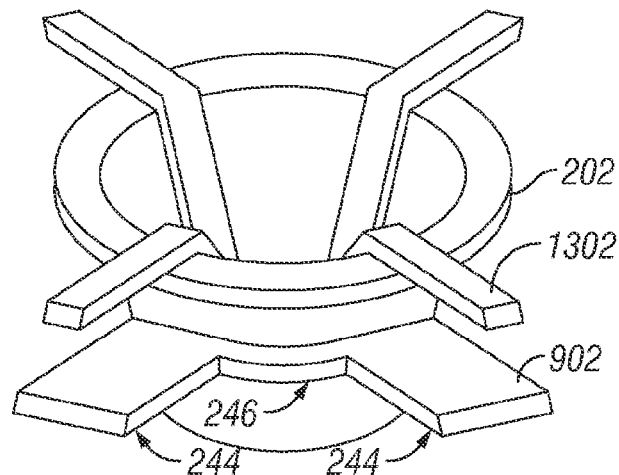
FIG. 24E is a perspective view of a portion of the MEMS devices of FIG. 24C.

FIG. 24C illustrates a cross-sectional view of a portion of a plurality of MEMS devices 2205. The actuation electrode 902 is disposed between the reflective element 914 and the deformable layer 1302. The MEMS devices 2205 comprise support structures 202 below the deformable layer 1302 and supporting the deformable layer 1302 and the actuation electrodes 902 (e.g., as described above with respect to FIG. 22B). The actuation electrode 902 comprises a plurality of cantilevers 244 that extend from the support structure 202 below the deformable layer 1302, as illustrated in FIGS. 24C-24E, and above the reflective element 914, as illustrated in FIG. 24C. The actuation electrodes 902 extend in a row across a plurality of MEMS devices 2205 via conductive element 246. In certain alternative embodiments, the deformable layer 1302 is continuous along a row and the actuation electrode 902 is continuous along a column. As described above, when a potential difference is applied to a selected row and column, the capacitor formed at the intersection of the row and column electrodes at the corresponding MEMS device 2205 becomes charged. Accordingly, each of the MEMS devices 2205 is individually addressable.

Combinations of the illustrated MEMS devices 2200, 2205 are also possible. For example, the actuation electrode 902 of the MEMS device 2200 may comprise a plurality of cantilevers extending from the support structures 2202. For another example, the actuation electrode 902 of the MEMS device 2205 may be substantially planar and include the aperture 242. Other configurations in which the actuation electrode 902 is connected in rows are also possible (e.g., comprising planar strips supported by support structures 902 and having a gap therebetween through which the deformable layer 1302 may be mechanically coupled to the reflective element 914).

Figure 24F:
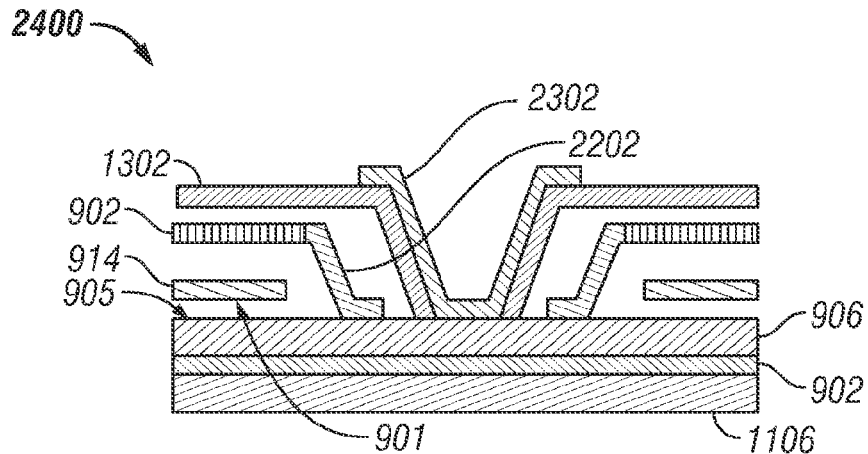
FIG. 24F is a cross-sectional view of yet another example of a portion of a plurality of MEMS devices having the optical function separated from the electrical function and the mechanical function.

FIG. 24F illustrates a cross-sectional view of a portion of a plurality of MEMS device 2400 comprising a support structure 2302 over the deformable layer 1302, which may be called a "rivet." In such embodiments, the actuation electrode 902 can be supported by the support structure 2202. The actuation electrode 902 may comprise cantilevers 244, may be planar, or may be otherwise connected between MEMS devices 2400. Other support structure configurations and combinations are also possible (e.g., a MEMS device comprising a rivet 2302 and a support structure 202, which supports the deformable layer 1302 and/or the actuation electrode 902).

As described above, the response time of a MEMS device is proportional to a product of the resistance of the conductors and the capacitance. A MEMS device comprising an actuation electrode 902 between the deformable layer 1302 and the reflective element 914 may advantageously reduce resistance and/or and capacitance, thereby reducing response time. Reducing the response time can increase the screen refresh rate and enhance temporal modulation. In addition to decreasing response time, reducing the capacitance of the MEMS device can decrease the power consumption of the MEMS device.

In embodiments in which the actuation electrode 902 is in the optical path of the MEMS device (e.g., as depicted in FIGS. 8B, 9B, 10B, 10D, 10E, and 11B), it comprises a material that is transparent to light, for example, but not limited to, ITO, ZnTO, indium zinc oxide (IZO), and indium oxide (IO). In general, transparent conductors have poor electrical resistance compared to non-transparent conductors, which can result in poor power dissipation and high electrical time constants for MEMS devices comprising transparent actuation electrodes 902. However, an actuation electrode 902 between the deformable layer 1302 and the reflective element 914 is not in the optical path, which allows the actuation electrode 902 to comprise non-transparent conductors such as aluminum, copper, silver, gold, etc., as well as transparent conductors. Certain MEMS devices comprising a non-transparent actuation electrode 902 can advantageously have lower power dissipation and/or shorter electrical response times than MEMS devices comprising a transparent actuation electrode 902 because non-transparent conductors can have a lower resistance than transparent conductors.

Certain transparent conductors such as ITO are sensitive to high temperature processes, such that the maximum processing temperature of the MEMS device is limited after formation of the actuation electrode 902. For example, ITO degrades at temperatures around 350° C. and higher, increasing the resistivity of an actuation electrode 902 comprising ITO. As such, certain processes (e.g., chemical vapor deposition (CVD) greater than 350° C.) are not typically performed on structures comprising ITO. However, MEMS devices comprising an actuation electrode 902 between the deformable layer 1302 and the reflective element 914 may have an actuation electrode 902 comprising a variety of conductors that can withstand high temperature processing, which increases process flexibility for components of the MEMS device. For example, certain depositions (e.g., deposition of the support structures 202) can be performed at high temperatures. For another example, certain deposition processes may be CVD rather than physical vapor deposition (PVD) (e.g., sputter), which can enhance deposition conformality and uniformity.

The thickness of an actuation electrode 902 in the optical path is limited in order to avoid adversely impacting the optical properties of the MEMS device, but an actuation electrode 902 between the deformable layer 1302 and the reflective element 914 may have a variety of thicknesses because it is not in the optical path. Increasing the thickness of the actuation electrode 902 can, for example, advantageously increase conductivity, thereby reducing response time and/or power consumption of the MEMS device. Moreover, thick actuation electrodes 902 enable the use of alternative deposition methods (e.g., coating, inkjet printing, printable conductors), which can lower manufacturing costs.

In embodiments in which the actuation electrode 902 is in the optical path of the MEMS device such that it pulls the reflective element 914 towards the first reflective layer 904, the reflective element 914 generally contacts the top surface 905 of the substrate 1106 (e.g., the top surface 905 of an insulating layer 906 on the substrate 1106) because the top surface 905 of the substrate 1106 acts as a "stop" for movement of the movable element 2220. In embodiments in which the reflective surface 901 of the reflective element 914 and the top surface 905 of the substrate 1106 are flat (e.g., to enhance color gamut), stiction (static friction) between the surfaces may disadvantageously affect operation of MEMS devices in which they contact. Certain features, such as surface roughening and anti-stiction layers, may be used to reduce such stiction, but those features can adversely impact the optical performance of the MEMS device. However, an actuation electrode 902 between the deformable layer 1302 and the reflective element 914 allows configuration of the MEMS device such that a portion of the movable element 2220 contacts the actuation electrode 902 (i.e., the actuation electrode 902 acts as the stop for movement of the movable element 2220 rather than the top surface 905 of the substrate 1106). The interface where the portion of the movable element 2220 contacts the actuation electrode 902 can be advantageously adapted to reduce stiction without impacting optical performance because it is not in the optical path. For example, the surface topography of the insulating layer 2254 may be roughened to reduce the number of contact points or an anti-stiction layer may be formed on the actuation electrode 902.

Transparent actuation electrodes 902 are generally under the entire reflective surface 901 of the reflective element 914 (e.g., as depicted in FIGS. 8B, 9B, 10B, 10D, 10E, and 11B) such that the electrostatic forces created by applying voltages to the actuation electrode 902 are sufficient to actuate the MEMS device. Thus, in embodiments in which a capacitor of the MEMS device comprises the reflective surface 901 of the reflective element 914 and the actuation electrode 902, the area of the capacitor and the capacitance of the MEMS device is high. In embodiments employing larger reflective elements 914 (e.g., to enhance fill factor), the MEMS device can have even higher capacitances. A MEMS device in which the capacitor comprises the actuation electrode 902 and either portions of a lower surface the deformable layer 1302 or portions of an upper surface of the reflective element 914 (e.g., as depicted in FIGS. 20-22C) can advantageously reduce the area of the capacitor and decrease the capacitance of the MEMS device.

A MEMS device in which the capacitor comprises the actuation electrode 902 and either portions of a lower surface of the deformable layer 1302 or portions of an upper surface of the reflective element 914 (e.g., as depicted in FIGS. 20-22C) can also advantageously decrease a mechanical force used to operate the MEMS device and decrease certain dimensions of the deformable layer 1302 because the mechanical function is at least partially separated from the optical function. In certain embodiments in which the actuation electrode 902 of the MEMS device is between the deformable layer 1302 and the reflective element 914 and acts a stop for the deformable layer 1302 or for the reflective element 914, the area of contact can be smaller than the area of the reflective surface 901. The smaller area of contact results in less stiction, so lower mechanical forces may be used, allowing the dimensions of the deformable layer 1302 to be reduced. In embodiments in which the capacitor comprises the deformable layer 1302 and the actuation electrode 902, reduced dimensions of the deformable layer 1302 decrease the area of the capacitor, and thus advantageously reduce the capacitance of the MEMS device. In embodiments in which the capacitor comprises portions of an upper surface of the reflective element 914 and the actuation electrode 902, the area of the capacitor can be reduced, for example by reducing the area of the connecting element 2218 and/or the connecting element 2219 and the horizontal distance of the actuation electrode 902 from the movable element 2220, thus reducing the capacitance and power consumption of the MEMS device.

In certain embodiments, the MEMS device can be configured to produce black by contacting the insulating layer 906 having a thickness of between about 90 and 110 nm (e.g., about 100 nm) with the reflective surface 901 of the reflective element 914. However, high reflectivity broadband white, in which the distance between the first and second reflective layers of a MEMS device is negligible (e.g., less than about 100 Å), is not possible in embodiments in which the actuation electrode 902 is in the optical path because electrical shorts may occur between the actuation electrode 902 and the reflective element 914 when the insulating layer 906 is that thin.

In the embodiments illustrated in FIGS. 8B, 9B, 10B, 10D, 10E, and 11B, the reflective element 914 is electrically insulated from the actuation electrode 902, and the reflective element 914 is electrically insulated from the first reflective layer 904 by the insulating layer 906, as described above. In certain embodiments in which the MEMS device comprises an actuation electrode 902 between the deformable layer 1302 and the reflective element 914, the insulating layer 906 may optionally be eliminated from the MEMS device, for example in embodiments in which the reflective element 914 does not contact the top surface 905 of the substrate 1106 (e.g., because the actuation electrode 902 acts as a stop for the movable element 2220) and embodiments in which the reflective element 914 contacts the first reflective layer 904. Elimination of the insulating layer 906 allows the reflective surface 901 of the reflective element 914 and the first reflective layer 904 to be separated by a negligible distance (e.g., by less than about 100 Å or touching). Each interface of reflective MEMS devices causes some reflectance, so embodiments without an insulating layer 906 may produce better colors (e.g., better black) than embodiments including an insulating layer 906. Gray may also be produced without temporal modulation by spacing the reflective surface 901 of the reflective element 914 from the first reflective layer 904 by between about 100 Å and 100 nm.

In embodiments in which the MEMS device is configured such that the reflective element 914 and the first reflective layer 904 contact or nearly contact so as to produce broadband white, the reflective element 914 and the first reflective layer 904 are preferably at the same potential in order to decrease any electrostatic forces or electric field therebetween that may cause arcing. In certain embodiments, the reflective element 914 is in electrical communication with the first reflective layer 904 through the deformable layer 1302 such that they are at the same potential. In certain embodiments, the reflective element 914 is electrically insulated from the deformable layer 1302 (e.g., using a dielectric connecting element 2219) and the first reflective layer 904 is also electrically insulated, such that they are at the same potential.

In order to reduce stiction between the reflective element 914 and the first reflective layer 904 in embodiments in which they contact, conductive features (e.g., bumps) may be applied to the first reflective layer 904 and/or the reflective surface 901, although such features may negatively impact optical performance of the MEMS device.

In certain embodiments in which actuation of the MEMS device causes the reflective element 914 to move away from the first reflective layer 904 (e.g., as depicted in FIG. 22E), the deformable layer 1302 may be configured such that the movable element 2220 "launches" negatively (e.g., towards the substrate 1106) in the relaxed state. For example, the residual stresses between the deformable layer 1302 and the support structure 202 may be designed such that the deformable layer 1302 deflects downward upon removal of sacrificial layers. In certain such embodiments, the relaxed state produces high reflectivity broadband white (e.g., by touching the first reflective layer 904 or being spaced less than about 100 Å from the first reflective layer 904), low reflectivity black (e.g., by being spaced from the first reflective layer 904 by about 100 nm), gray (e.g., by being spaced from the first reflective layer 904 by between about 100 Å and 100 nm), or a color (e.g., yellow, red, blue, etc.).

FIGS. 25A-25G illustrate an example embodiment of a method of manufacturing the MEMS device 2200 of FIG. 22A. The MEMS structure 2500 illustrated in FIG. 25A includes a substrate 1106 (e.g., comprising glass, plastic), a first reflective layer 904 (e.g., comprising chromium), an optional insulating layer 906 (e.g., comprising $SiO_2$ and/or $Al_2O_3$), a first sacrificial layer 2502, and a reflective element 914 (e.g., comprising aluminum) having a reflective surface 901. As discussed above, the insulating layer 906 may be omitted in some embodiments. In certain embodiments, one or more apertures 2504 are formed through the reflective element 914 to allow for easier etching of the first sacrificial layer 2502.

The amount of distance between the reflective element 914 and the top surface 905 of the substrate 1106 is proportional to the amount of fluid (e.g., air) in the cavity between the reflective element 914 and the top surface 905 of the substrate 1106. In certain embodiments of the MEMS device 2200 in which first portion of the movable element 2220 comprises the deformable layer 1302 and in which the reflective element 914 does not contact the top surface 905 of the substrate 1106 in the actuated state (e.g., because a lower surface of the deformable layer 1302 stops the movement of the movable element 2220), the distance between the reflective element 914 and the top surface 905 of the substrate 1106 becomes very small. For example, the distance is typically small in embodiments that can produce high reflectivity broadband white (e.g., because the distance is less than about 100 Å). Certain such small distances can affect the flow of the fluid (e.g., air) around the reflective element 914 during movement (e.g., actuation) because some fluid may not have sufficient space to move around the sides of the reflective element 914 and may instead may become compressed between the reflective element 914 and the top surface 905 of the substrate 1106. In certain embodiments, the apertures 2504 in the reflective element 914 provide an additional path for the fluid occupying the cavity between the reflective element 914 and the top surface 905 of the substrate 1106 to flow from below the reflective element 914 to above the reflective element 914 during movement (e.g., actuation). Thus, the at least one aperture 2504 can increase the speed of the MEMS device 2200. However, the portion of the reflective element 914 comprising the at least one aperture 2504 is not reflective, which reduces the fill factor of the MEMS device 2200.

In embodiments in which the reflective element 914 does not contact the top surface 905 of the substrate 1106, the reflective surface 901 of the reflective element 914 is preferably substantially smooth and flat, for example to increase color gamut. In some embodiments, the reflective surface 901 is made substantially smooth and flat by forming the reflective element 914 on a smooth and flat sacrificial layer 2502 (e.g., comprising photoresist) or by polishing a sacrificial layer 2502 (e.g., comprising molybdenum) prior to formation of the reflective element 914. The reflective surface 901 of the reflective element 914 may also be smooth and flat in embodiments in which the reflective element 914 contacts the top of the substrate 1106 (e.g., the top surface 905 of a 100 nm thick insulating layer 906 to create black or the top surface 905 of the first reflective layer 904 to create broadband white), although the possible effects of stiction are considered in such embodiments (e.g., by adding insulating or conductive bumps).

In some embodiments (e.g., as depicted in FIG. 22D), the thickness of the first sacrificial layer 2502 influences the color of the MEMS device in the relaxed state. In embodiments in which the movable element 2220 is configured to move away from the first reflective layer 904 upon actuation, an upper surface of the reflective element 914 may be roughened to reduce the number of contact points in order to decrease stiction with the actuation electrode 902. In embodiments in which the movable element 2220 is configured to move away from the first reflective layer 904 upon actuation, an insulating layer (not shown) and/or other layers (e.g., an anti-stiction layer, not shown) may be deposited on an upper surface of the reflective element 914.

Figure 25A:
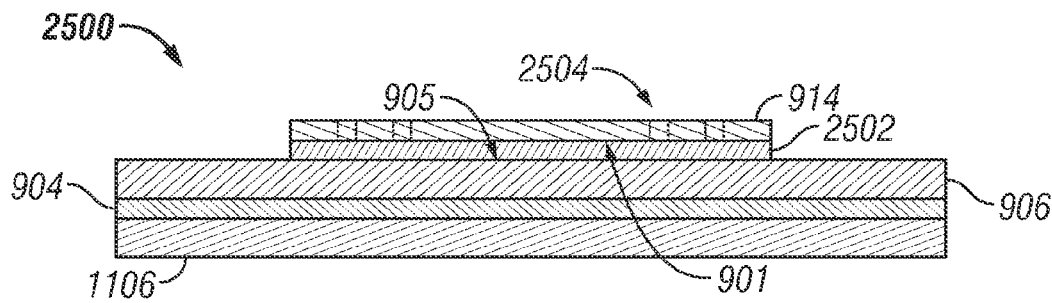
FIGS. 25A-25G schematically illustrate an example series of processing steps for forming an embodiment of a MEMS device having the optical function separated from the electrical function and the mechanical function.
Figure 25B:
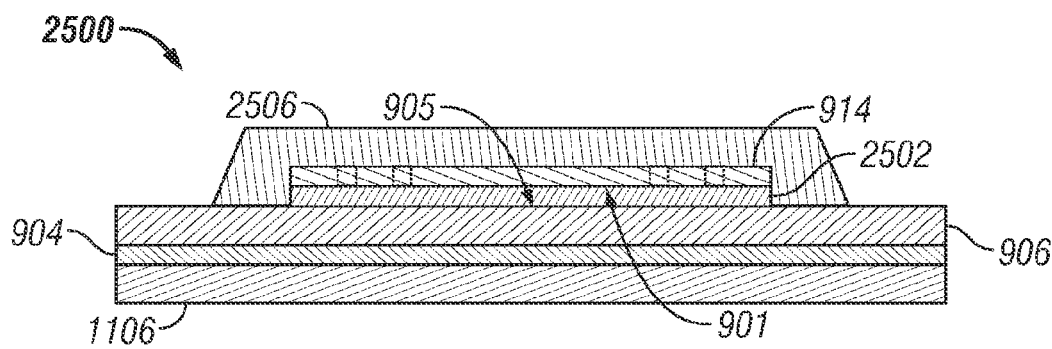

FIG. 25B illustrates the MEMS structure 2500 of FIG. 25A after a second sacrificial layer 2506 (e.g., comprising molybdenum) has been formed over the reflective element 914. The second sacrificial layer 2506 spaces the reflective element 914 from the actuation electrode 902. The second sacrificial layer 2506 may comprise the same material as the first sacrificial layer 2502 or a different material than the first sacrificial layer 2502.

Figure 25C:
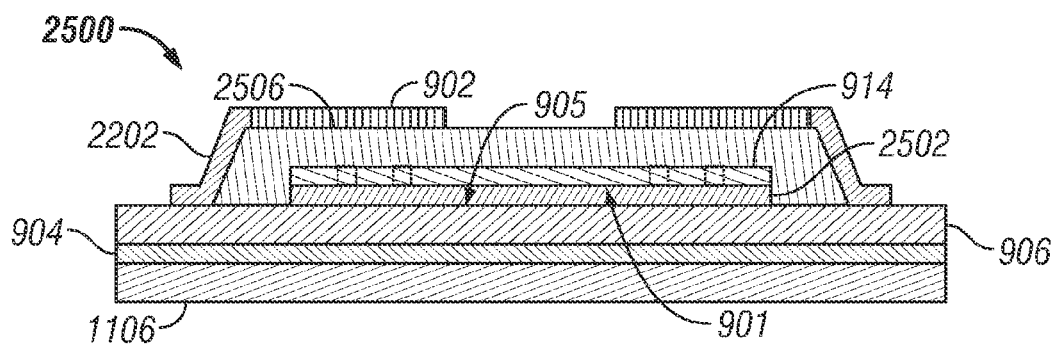

FIG. 25C illustrates the MEMS device 2500 of FIG. 25B after the formation of a support structure 2202 and an actuation electrode 902 over the second sacrificial layer 2506. As described above, the actuation electrode 902 may comprise a multi-layer stack. In such embodiments, formation of the actuation electrode 902 may comprise a series of patterning steps (e.g., for each layer of the multi-layer stack, deposition, mask formation, etch, and mask removal) or a single patterning step comprising multiple etches (e.g., deposition of each layer of the multi-layer stack, mask formation, etch of each layer of the multi-layer stack, mask removal). Other sequences are also possible (e.g., deposition of each layer of the multi-layer stack, mask formation, etch of the top layer of the multi-layer stack, and use one or more upper layers as a mask for one or more lower layers). The thicknesses of the layers of the multi-layer stack may vary, although the resulting actuation electrode 902 is preferably rigid enough that it does not substantially deform.

In embodiments in which the movable element 2220 is configured to move towards the first reflective layer 904 upon actuation, an insulating layer 2254 may be formed on the top of the conductive portion 2252 of the actuation electrode 902 (e.g., as depicted in FIG. 23A) where contact is made with a lower surface of the deformable layer 1302. In certain such embodiments, the top surface of the actuation electrode 902 may be roughened to reduce the number of contact points in order to decrease stiction with the deformable layer 1302. Other layers (e.g., an anti-stiction layer) may be also be formed on the top of the actuation electrode 902.

In embodiments in which the movable element 2220 is configured to move away from the first reflective layer 904 upon actuation, an insulating layer 2254 may be formed on the bottom of the conductive portion 2252 of the actuation electrode 902 where contact is made with an upper surface of the reflective element 914. In certain such embodiments, the bottom surface of the actuation electrode 902 may be roughened to reduce the number of contact points in order to decrease stiction with the reflective element 914. Other layers (e.g., an anti-stiction layer) may also be formed on the bottom of the actuation electrode 902.

The support structure 2202 preferably comprises a rigid material. For example, in some embodiments, one or more of the layers 2252, 2254 of the actuation electrode 902 (e.g., as illustrated in FIG. 23A) is used to form the support structure 2202. In some alternative embodiments, the support structure 2202 comprises one or more different layers. In certain embodiments, the support structure 2202 comprises a conductive portion (not shown) to allow routing of voltages to the actuation electrode 902. In certain embodiments, the support structure 2202 holds up an actuation electrode 902 that is continuous across a row (e.g., as shown in FIG. 24A) or a column to allow rouging of voltages to the actuation electrode 902.

Figure 25D:
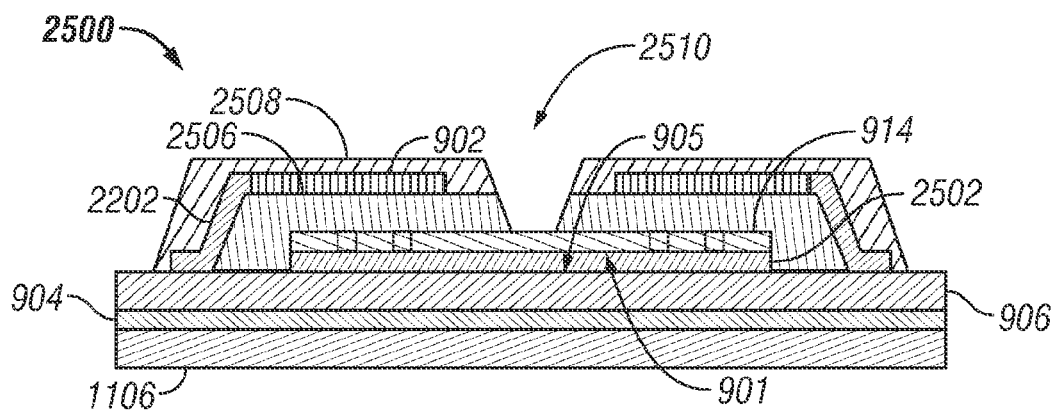

FIG. 25D illustrates the MEMS structure 2500 of FIG. 25C after a third sacrificial layer 2508 (e.g., comprising molybdenum) has been formed over the actuation electrode 902 and the support structure 2202. The third sacrificial layer 2508 spaces the deformable layer 1302 from the actuation electrode 902. The third sacrificial layer 2508 may comprise the same material as one or both of the first and second sacrificial layers 2502, 2506 or a different material than one or both of the first and second sacrificial layers 2502, 2506. In some embodiments, formation of the third sacrificial layer 2508 forms an aperture 2510 through the second and third sacrificial layers 2506, 2508. In certain alternative embodiments, a portion of the aperture 2510 is formed during formation of the second sacrificial layer 2506.

In embodiments in which an insulating or other layer has been formed on the top surface of the reflective element 914, the aperture 2510 may allow for removal of such layers without additional patterning. For example, in embodiments in which the movable element 2220 is configured to move away from the first reflective layer 904 upon actuation, and an insulating layer is deposited on an upper surface of the reflective element 914, the aperture 2510 may be used as a mask to remove the portion of the insulating layer therebelow (e.g., to allow electrical connection to a connecting element 2218). It will be appreciated that care should be taken to protect the reflective element 914 during etching of the actuation electrode 902 where appropriate (e.g., in embodiments in which the reflective element 914 is exposed during such formation).

In certain embodiments, along with any insulating layers 2254 as described above, the thicknesses of the second sacrificial layer 2506 defines the distance $D_2$, and the thickness of the third sacrificial layer 2508 defines the distance $D_1$. Thus, the thicknesses $D_1$, $D_2$ may be adjusted so as to cause the movable element 2220 to towards or away from the first reflective layer 904. The thicknesses of the sacrificial layers 2502, 2506, 2508 may also be configured such that a portion of the movable element 2220 does or does not contact the top of the substrate 1106 during the actuated or relaxed states.

Figure 25E:
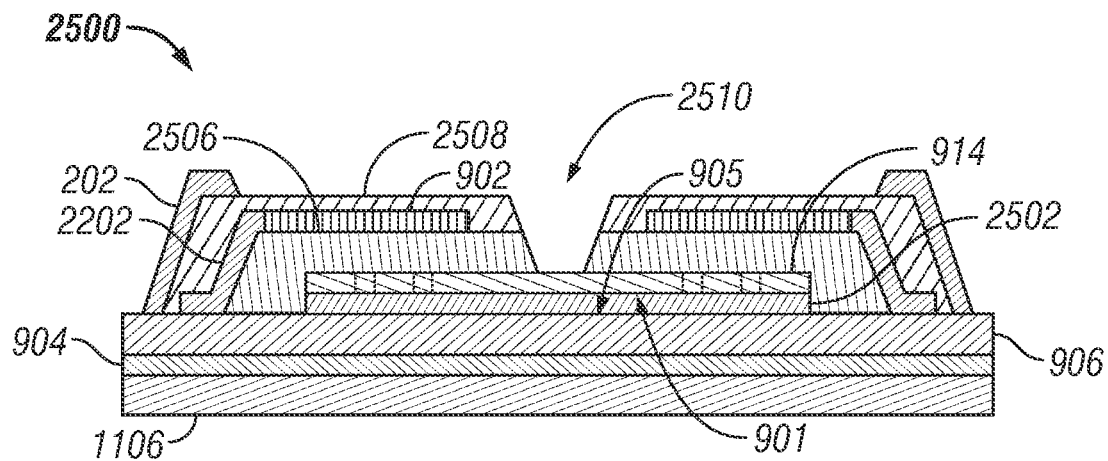

FIG. 25E illustrates the MEMS structure 2500 of FIG. 25D after the support structure 202 (e.g., comprising $SiO_2$) has been formed over the third sacrificial layer 2508. In embodiments in which an insulating layer is formed on the an upper surface of the reflective element 914, patterning of the support structure 202 may also be used to remove the insulating layer through the aperture 2510.

Figure 25F:
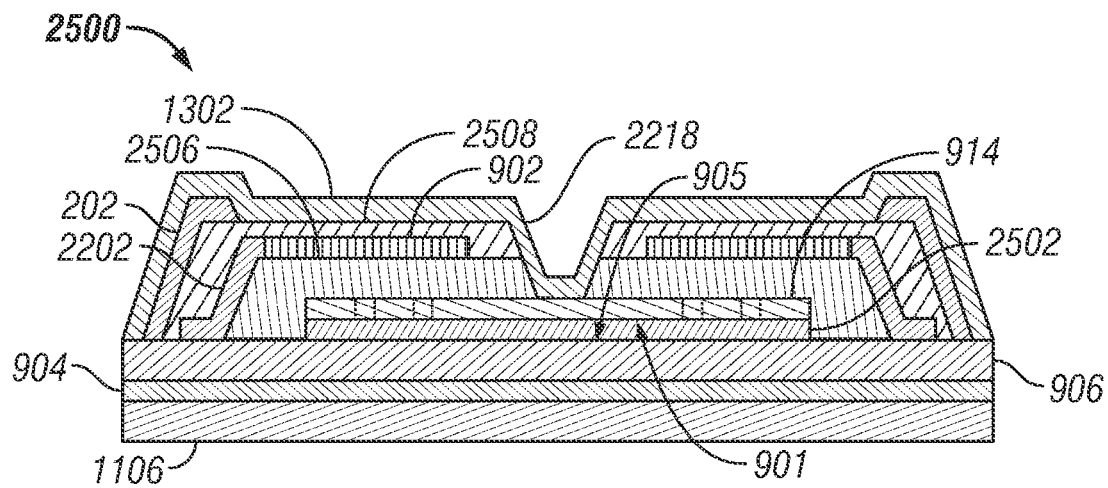

FIG. 25F illustrates the MEMS structure 2500 of FIG. 25E after the deformable layer 1302 (e.g., comprising nickel) has been formed over the support structure 202 and the third sacrificial layer 2508. The deformable layer 1302 is mechanically coupled to the reflective element 914 by the connecting element 2218.

Figure 25G:
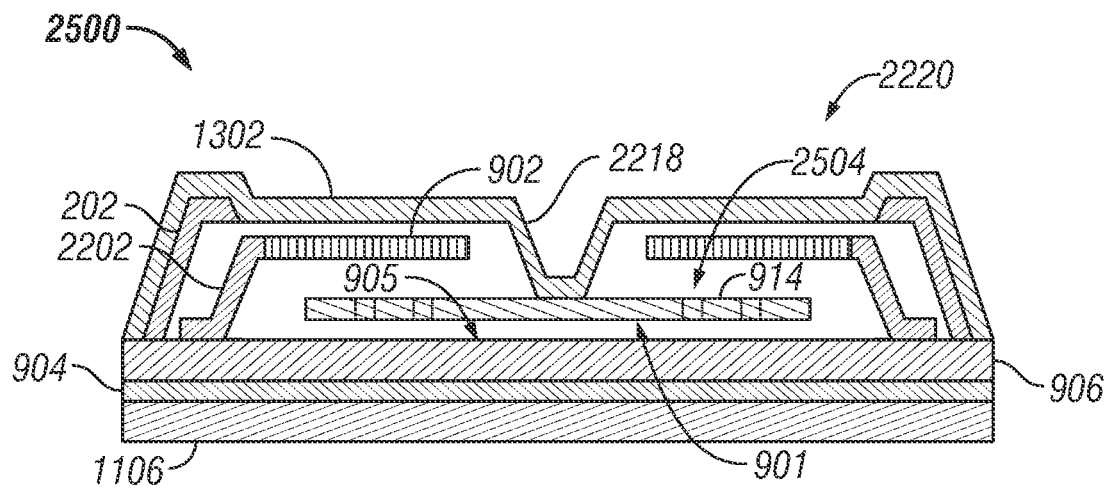

FIG. 25G illustrates the MEMS structure 2500 of FIG. 25F after the first, second, and third sacrificial layers 2502, 2506, and 2508, respectively, have been removed, resulting in the MEMS device 2200 of FIG. 22A. In embodiments in which the sacrificial layers 2502, 2506, 2508 each comprise molybdenum, they may be removed, for example, by etching with xenon difluoride ($XeF_2$). In embodiments in which a sacrificial layer comprises photoresist, it may be removed, for example, by ashing (e.g., by etching with $O_2$ and/or $H_2O$). The apertures 2504 illustrated in FIG. 25A help the etchant to remove the first sacrificial layer 2502 under the reflective element 914. Upon removal of the sacrificial layers, the movable element 2220 can move in response to voltages applied to the actuation electrode 902.

Figure 26A:
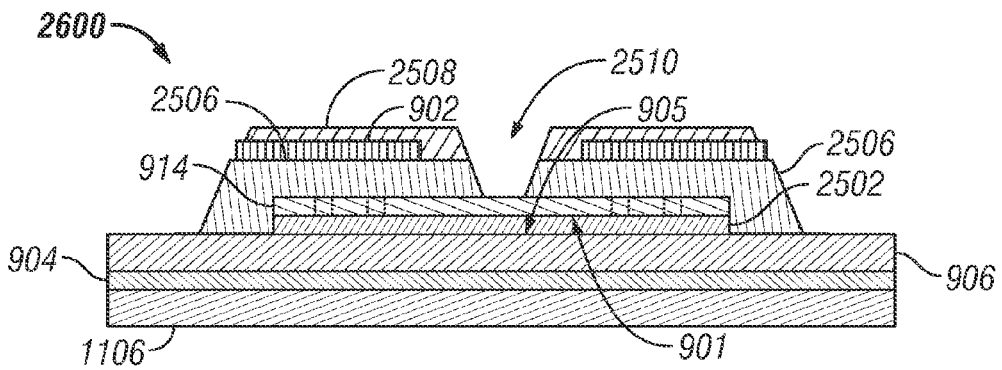
FIGS. 26A-26D schematically illustrate an example series of processing steps for forming another embodiment of a MEMS device having the optical function separated from the electrical function and the mechanical function.

FIGS. 26A-26D illustrate an example embodiment of a method of manufacturing the MEMS device 2205 of FIG. 22B. FIG. 26A illustrates a MEMS structure 2600 after the formation of an actuation electrode 902 over a second sacrificial layer 2506, as described above with respect to FIG. 25C. The reflective element 914 of the MEMS device 2205 may be larger than the reflective element 914 of the MEMS structure 2200 because the support structure 202 supporting the actuation electrode 902 does not occupy space below the deformable layer 1302 (e.g., in contrast with the support structure 2202). As described above, formation of the third sacrificial layer 2508 preferably creates an aperture 2510 to the reflective element 914. Additionally, formation of the third sacrificial layer 2508 in the MEMS device 2600 leaves a portion of the actuation electrode 902 exposed such that it can be mechanically coupled to the support structure 202.

Figure 26B:
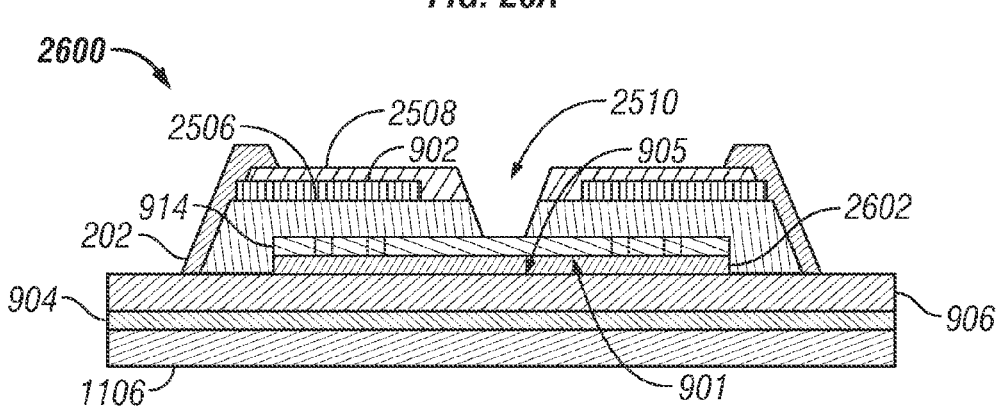

FIG. 26B illustrates the MEMS structure 2600 after a support structure 202 (e.g., comprising $SiO_2$) has been formed over the second sacrificial layer 2506, the actuation electrode 902, and the third sacrificial layer 2508. The support structure 202 preferably comprises a conductive portion to allow routing of voltages to the actuation electrode 902, but that is electrically insulated from the deformable layer 1302. In certain embodiments, one or more of the layers 2252, 2254 of the actuation electrode 902 (e.g., as illustrated in FIG. 23A) is used to form a portion of the support structure 202 (not shown).

Figure 26C:
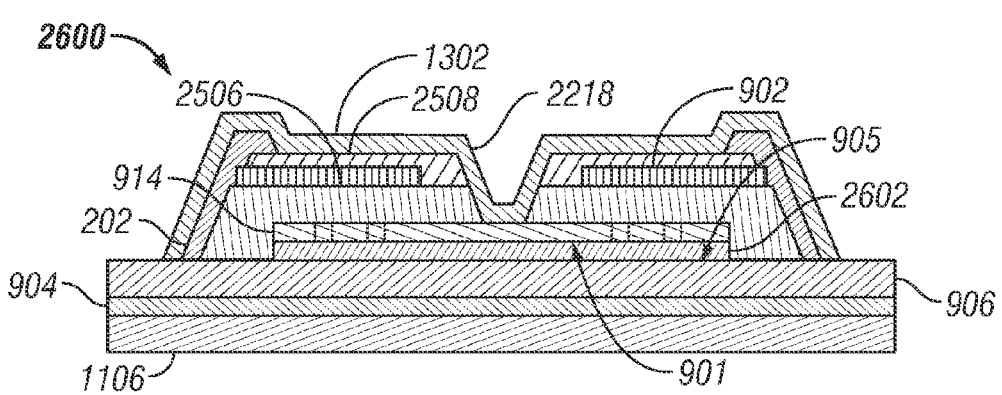
Figure 26D:
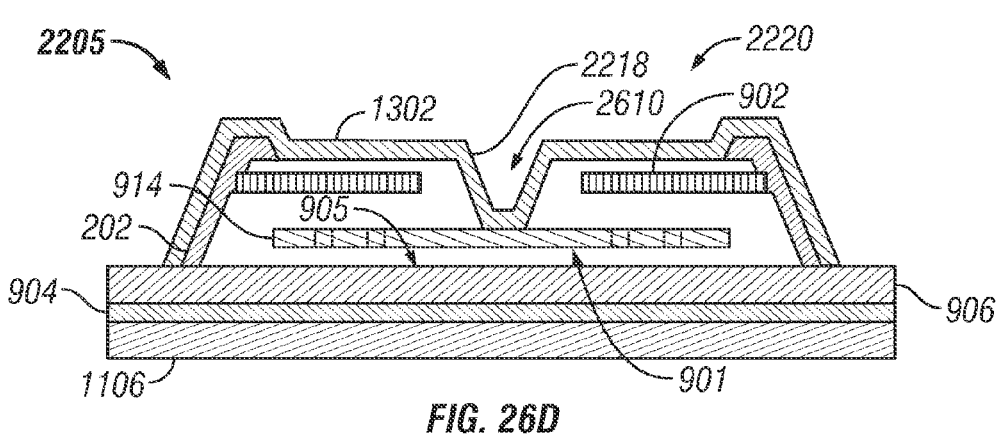

FIG. 26C illustrates the MEMS structure 2600 of FIG. 26B after a deformable layer 1302 (e.g., comprising nickel) has been formed over the support structure 202 and the third sacrificial layer 2508. The deformable layer 1302 is mechanically coupled to the reflective element 914 by a connecting element 2218. FIG. 26D illustrates the MEMS structure 2600 of FIG. 26C after the first, second, and third sacrificial layers 2502, 2506, and 2508, respectively, have been removed, resulting in the MEMS device 2205 of FIG. 22B.

Figure 27A:
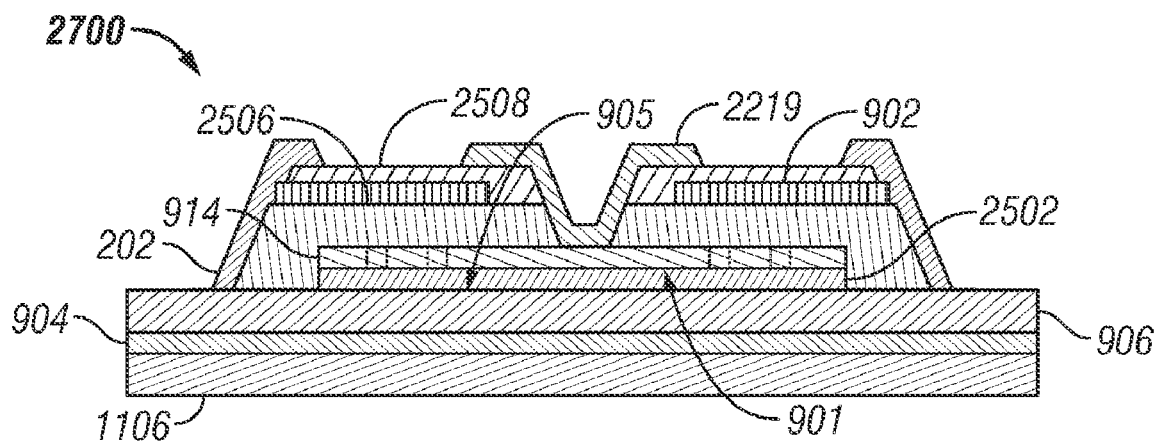
FIGS. 27A-27C schematically illustrate an example series of processing steps for forming yet another embodiment of a MEMS device having the optical function separated from the electrical function and the mechanical function.
Figure 27B:
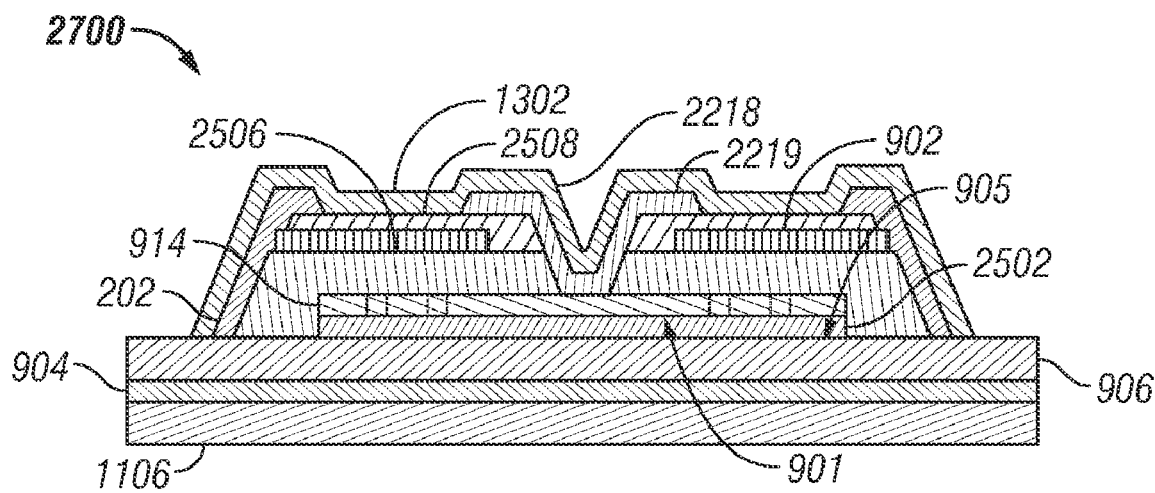
Figure 27C:
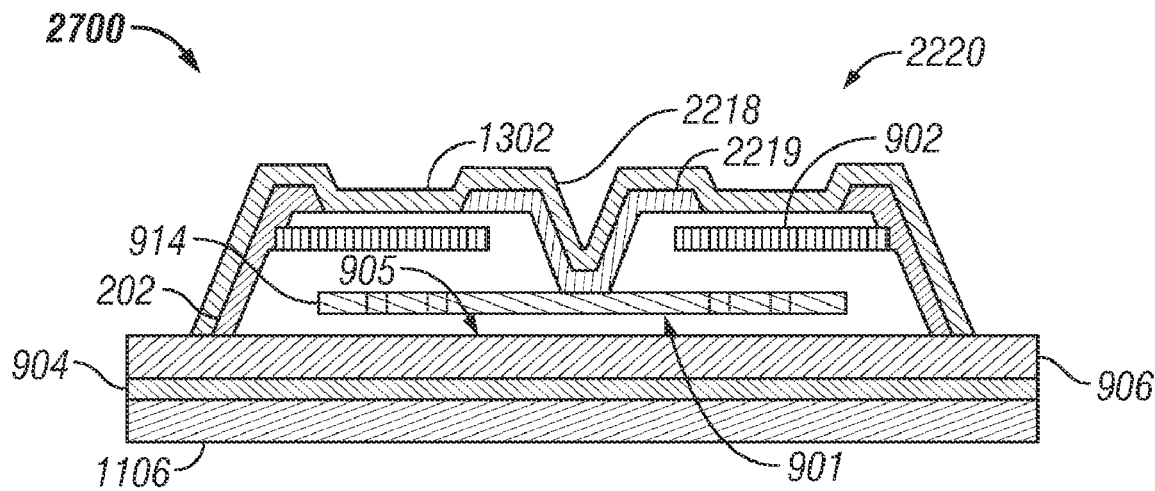

FIGS. 27A-27C illustrate an example embodiment of a method of manufacturing the MEMS device 2210 of FIG. 22C. FIG. 27A illustrates a MEMS structure 2700 after the formation of a support structure 202, as described above with respect to FIG. 26B. Additionally, a connecting element 2219 has been formed over the third sacrificial layer 2508 an at least partially in the aperture 2510. As described above, the connecting element 2219 may be insulating or conductive.

FIG. 27B illustrates the MEMS structure 2700 of FIG. 27C after the deformable layer 1302 (e.g., comprising nickel) has been formed over the support structure 202, the third sacrificial layer 2508, and the connecting element 2219. The deformable layer 1302 is mechanically coupled to the reflective element 914 by the connecting element 2218 via the connecting element 2219. FIG. 27C illustrates the MEMS structure 2700 of FIG. 27B after the first, second, and third sacrificial layers 2502, 2506, and 2508, respectively, have been removed, resulting in the MEMS device 2210 of FIG. 22C.

FIGS. 28A-29C illustrate example embodiments of MEMS devices comprising a second actuation electrode. The movable element 2220 is responsive to voltages applied to the actuation electrode 902 between the deformable layer 1302 and the reflective element 902 by moving generally in a first direction, as described above. The movable element 2220 is further responsive to voltages applied to the second actuation electrode 2808 or 908 by moving generally in a second direction that is substantially opposite the first direction. The MEMS devices 2800, 2805, 2810, 2900, 2905, 2910 are thus capable of stably producing at least three colors: a first color in the relaxed state, a second color in the actuated state in the first direction, and a third color in the actuated state in the second direction.

Figure 28A:
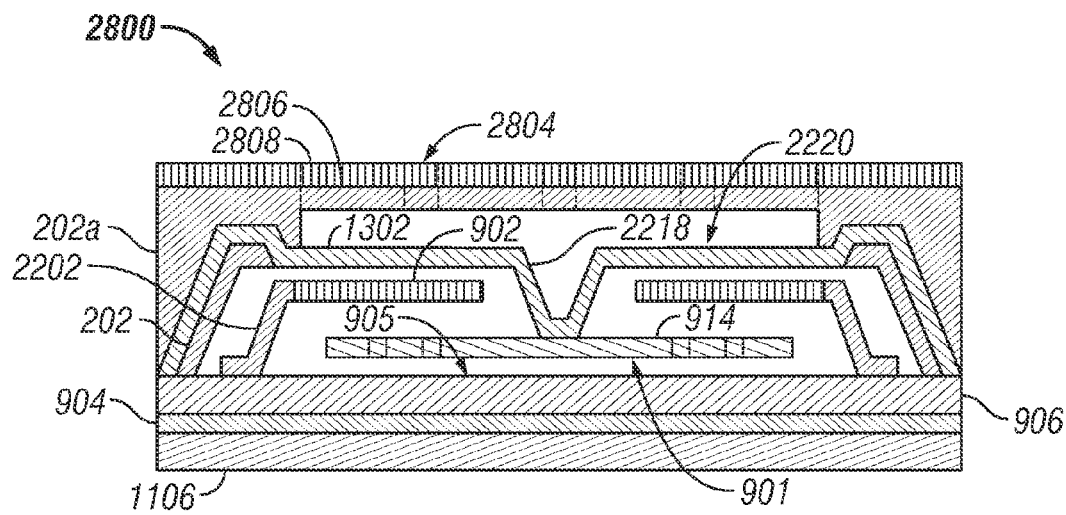
FIG. 28A is a cross-sectional view of an embodiment of the MEMS device of FIG. 22A including a second actuation electrode.
Figure 28B:
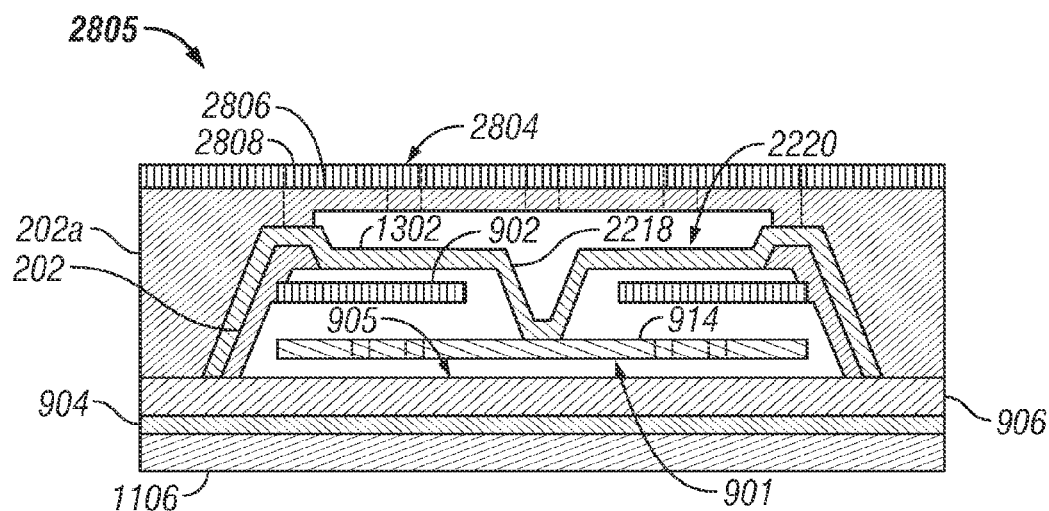
FIG. 28B is a cross-sectional view of an embodiment of the MEMS device of FIG. 22B including a second actuation electrode.
Figure 28C:
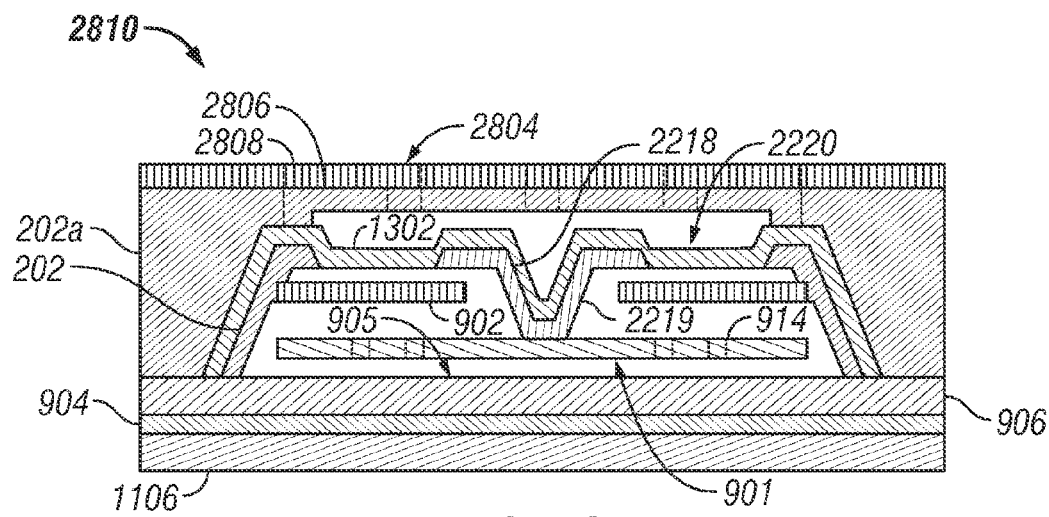
FIG. 28C is a cross-sectional view of an embodiment of the MEMS device of FIG. 22C including a second actuation electrode.

In the embodiments illustrated in FIGS. 28A-28C, the second actuation electrode 2808 is above the movable element 2220. The MEMS device 2800 of FIG. 28A illustrates the second actuation electrode 2808 formed over the movable element 2220 of the MEMS device 2200 of FIG. 22A. The MEMS device 2805 of FIG. 28B illustrates the second actuation electrode 2808 formed over the movable element 2220 of the MEMS device 2205 of FIG. 22B. The MEMS device 2810 of FIG. 28C illustrates the second actuation electrode 2808 formed over the movable element 2220 of the MEMS device 2210 of FIG. 22C. The MEMS devices 2800, 2805, 2810 further comprise a support structure 202a, which supports the second actuation electrode 2808, and an optional insulating layer 2806.

When voltages are applied to the second actuation electrode 2808, electrostatic forces act on the movable element 2220. In response, the deformable layer 1302 flexes towards the second actuation electrode 2808. The reflective element 914 is mechanically coupled to the deformable layer 1302 such that, as the deformable layer 1302 moves towards the second actuation electrode 2808, the reflective element 914 moves a corresponding distance relative to and away from the first reflective layer 904. A stationary portion of the MEMS device acts as a stop for movement of the movable element 2220.

In certain embodiments (e.g., embodiments in which an upper surface of the reflective element 914 contacts the actuation electrode 902), the actuation electrode 902 comprises the stationary portion (e.g., as illustrated on the right side of FIG. 22E). In certain such embodiments, an insulating layer 2806 is optional because the movable element 2220 does not physically or electrically contact the second actuation electrode 2808.

In certain alternative embodiments (e.g., in which an upper surface of the deformable layer 1302 acts as a stop), the second actuation electrode 2808 or an insulating layer 2806 comprises the stationary portion. In some embodiments, an insulating layer 2806 insulates the movable element 2220 from the second actuation electrode 2808. In some embodiments, an insulating layer formed on an upper surface of the deformable layer 1302 (not shown) insulates the movable element 2220 from the second actuation electrode 2808.

The movable element 2220 is responsive to voltages applied to the actuation electrode 902 by moving generally in a first direction, as described above. In embodiments in which the second actuation electrode 2808 provides the forces to move the movable element 2220 away from the first reflective layer 904, the actuation electrode 902 is configured such that the movable element 2220 moves towards the first reflective layer 904 when voltages are applied to the actuation electrode 902 (e.g., by positioning the actuation electrode 902 closer to the deformable element 1302 than the reflective element 914, by shielding the reflective element 914 with a conductive layer 2258, etc.).

The second actuation electrode 2808 preferably comprises a non-transparent conductive material, for example for the electrical properties described above. The second actuation electrode 2808 is positioned above the reflective surface 901 of the reflective element 914 such that the second actuation electrode 2808 is not in the optical path of the MEMS device, so it may comprise a non-transparent conductive material. As such, the MEMS devices 2800, 2805, 2810 are capable of producing high-reflectivity colors including broadband white.

An example embodiment of a method of manufacturing the MEMS devices of FIGS. 28A-28C comprises forming a fourth sacrificial layer over the deformable layer 1302, forming the support structure 202a over the deformable layer 1302, forming the insulating layer 2806 over the fourth sacrificial layer, and forming the second actuation electrode 2808 over the support structure 202a. For example, such steps may be performed on the structures illustrated in FIGS. 25F, 26C, and 27B, followed by removing the first, second, third, and fourth sacrificial layers. In certain such embodiments, the second actuation electrode 2808 and the insulating layer 2806 comprise at least one aperture 2804 to allow for easier etching of the sacrificial layers. In some embodiments, the support structure 202a is formed while forming the insulating layer 2806 (e.g., by depositing $SiO_2$ and patterning the $SiO_2$).

Figure 29A:
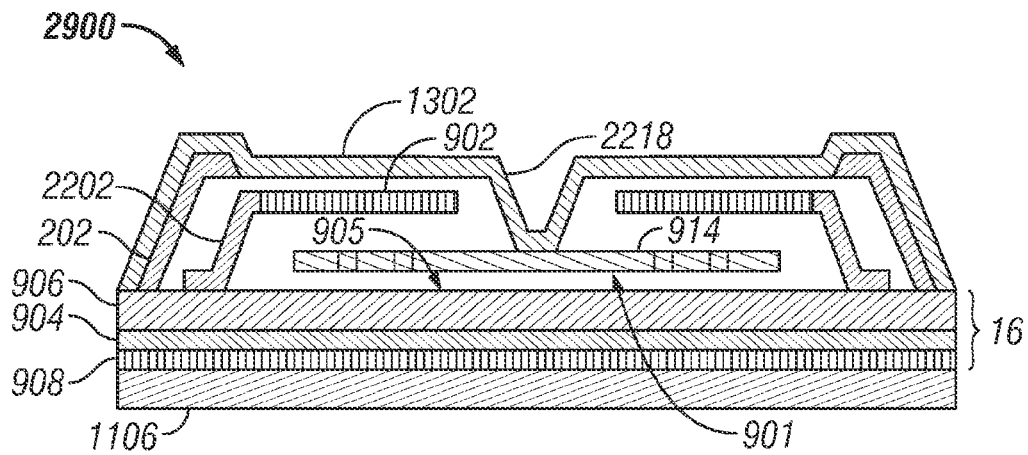
FIG. 29A is a cross-sectional view of another embodiment of the MEMS device of FIG. 22A including a second actuation electrode.
Figure 29B:
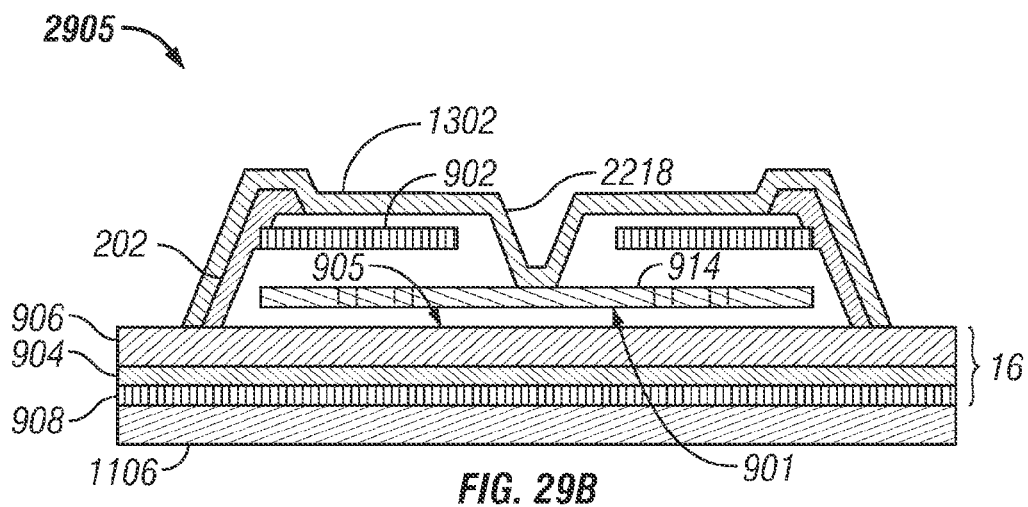
FIG. 29B is a cross-sectional view of another embodiment of the MEMS device of FIG. 22B including a second actuation electrode.
Figure 29C:
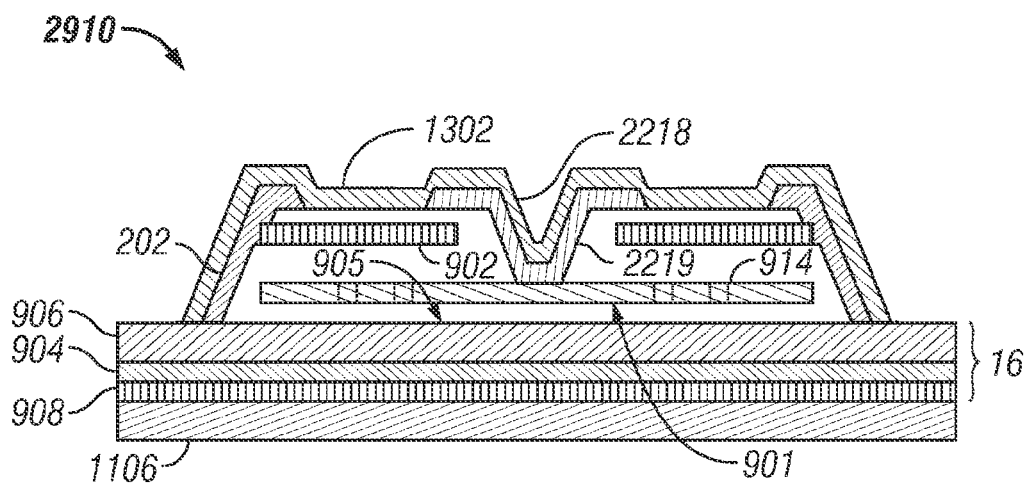
FIG. 29C is a cross-sectional view of another embodiment of the MEMS device of FIG. 22C including a second actuation electrode.

In the embodiments illustrated in FIGS. 29A-29C, the optical stack 16 comprises the second actuation electrode 908 (e.g., the second actuation electrode 908 is formed on the substrate 1106). The MEMS device 2900 of FIG. 29A illustrates the actuation electrode 908 formed over the substrate 1106 of the MEMS device 2200 of FIG. 22A. The MEMS device 2905 of FIG. 29B illustrates the actuation electrode 908 formed over the substrate 1106 of the MEMS device 2205 of FIG. 22B. The MEMS device 2910 of FIG. 29C illustrates the actuation electrode 908 formed over the substrate 1106 of the MEMS device 2210 of FIG. 22C. In certain embodiments, the second actuation electrode 908 is in electrical communication with the first reflective layer 904.

When voltages are applied to the second actuation electrode 908, electrostatic forces act on the movable element 2220. In response, the deformable layer 1302 flexes towards the actuation electrode 908. The reflective element 914 is mechanically coupled to the deformable layer 1302 such that, as the deformable layer 1302 moves towards the actuation electrode 2808, the reflective element 914 moves a corresponding distance relative to and towards the first reflective layer 904. A stationary portion of the MEMS device acts as a stop for movement of the movable element 2220.

In certain embodiments (e.g., embodiments in which a lower surface of the deformable layer 1302 contacts the actuation electrode 902), the actuation electrode 902 comprises the stationary portion (e.g., as illustrated on the right side of FIG. 22D). In certain such embodiments, an insulating layer 906 is still optional because the movable element 2220 does not physically or electrically contact the second actuation electrode 908. In certain alternative embodiments (e.g., in which the top surface 905 of the substrate 1106 acts as a stop), the insulating layer 906 comprises the stationary portion. In some embodiments, an insulating layer 2806 insulates the movable element 2220 from the second actuation electrode 908.

The movable element 2220 is responsive to voltages applied to the actuation electrode 902 by moving generally in a first direction, as described above. In embodiments in which the second actuation electrode 908 provides the forces to move the movable element 2220 towards the first reflective layer 904, the actuation electrode 902 is configured such that the movable element 2220 moves away from the first reflective layer 904 when voltages are applied to the actuation electrode 902 (e.g., by positioning the actuation electrode 902 closer to the reflective element 914 than the deformable element 1302, by shielding the deformable element 1302 with a conductive layer 2258, etc.).

An example embodiment of a method of manufacturing the MEMS devices of FIGS. 29A-29C comprises forming the second actuation electrode 908 over the substrate 1106. In such embodiments, the second actuation electrode 908 comprises a transparent conductor (e.g., ITO, IZO, etc., as described above) because it is in the optical path of the MEMS device. However, such embodiments allow the movable element 2220 to not contact the top of the substrate 1106, which can provide advantages such as larger reflective elements 914, as described above.

Reduce Power Consumption

An additional benefit of reducing the resistance or capacitance of the circuit is a reduction in power consumption. For example, to charge and discharge an array of interferometric modulators, the column and row drivers use power to apply voltages. By reducing the capacitance of the individual interferometric modulators, the row and column drivers can apply a lower voltage when activating each interferometric modulator. In certain embodiments, a reduction in the actuation voltage is achieved by changing the mechanical stiffness of the interferometric modulator and/or affecting the strength of the electrostatic force within the interferometric modulator.

For example, geometric changes of the interferometric modulator can reduce the mechanical stiffness of the second electrode layer 1302. Exemplary geometric changes include increasing the spacing between adjacent support posts 202 or changing the shape of the second electrode layer 1302. In certain embodiments, increasing the nominal spacing between support posts 202 increases the flexibility of the second electrode layer 1302 attached thereto. This increase in flexibility allows the second electrode layer 1302 and the reflective surface 901 to more easily change states in response to the column or row driver applying a lower actuation voltage.

Figure 30:
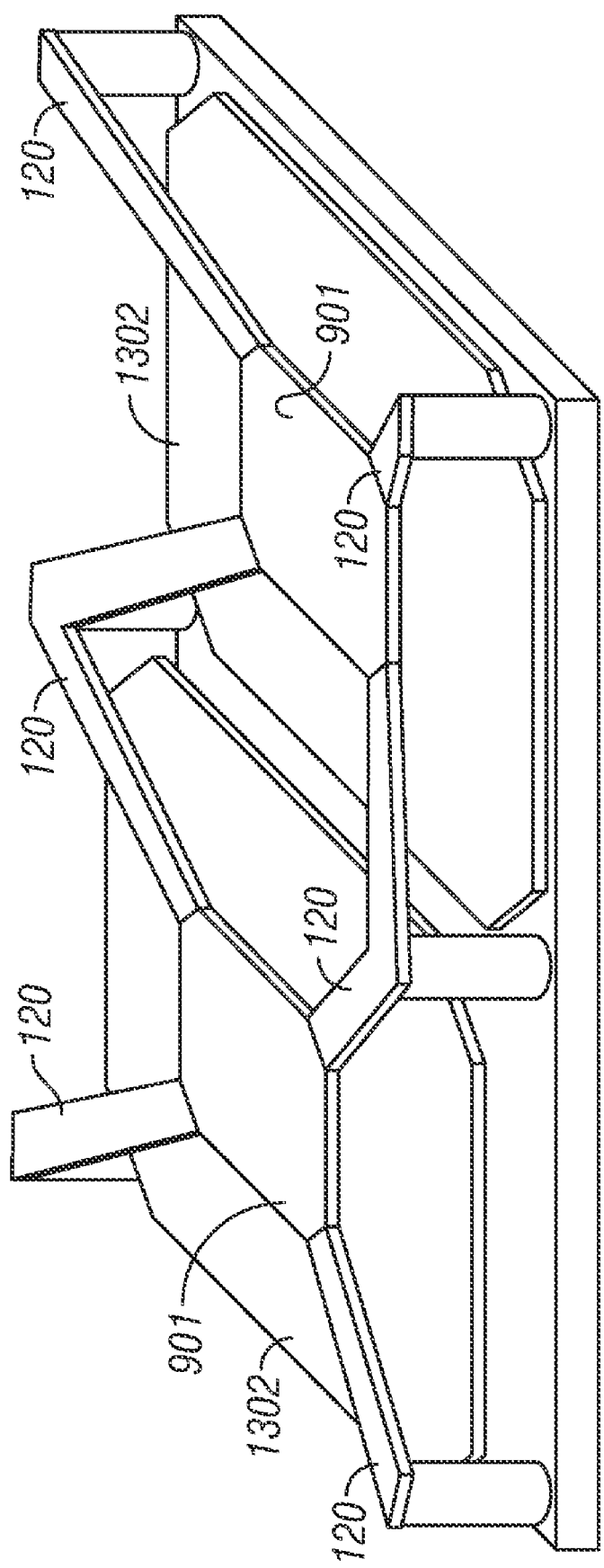
FIG. 30 shows a perspective view of an embodiment of an interferometric modulator having a spring design for the second electrode layer.

In certain embodiments, as shown in FIG. 30, the geometry of the second electrode layer 1302 can be changed so as to simulate a mechanical spring. The mechanical spring design de-couples the reflective surface 901 from the second electrode layer 1302. Tethers 120 constitute a spring portion while the reflective surface 901 moves up and down. In certain embodiments, the reflective surface 901 comprises a portion of a rigid body, such as a reflective surface layer. In this way, the tethers 120 and reflective surface 901 are decoupled in that movement of one does not substantially affect the other.

The selection of the material for the second electrode layer 1302 can affect the actuation voltage. Selecting a more compliant material increases the flexibility of the second electrode layer 1302. In this way, in certain embodiments, the row and column drivers apply a lower actuation voltage and still achieve the desired reflective surface layer 901 displacement. In certain embodiments, the second electrode layer 1302 comprises a more compliant material such as aluminum to allow the reflective surface layer 901 to respond to a lower actuation voltage than does a second electrode layer 1302 comprising nickel. Other exemplary materials that could be used for the second electrode layer 1302 include, but are not limited to, Cr, Cu, composites made of oxides and metal (for example, Silicon Nitride encased by aluminum), and organic films reinforced by metal (for example, photoresist plated with any of the metal examples). The mechanical stiffness of the second electrode layer 1302 can be further decreased by reducing the thickness of the second electrode layer 1302. In certain embodiments, the second electrode layer 1302 has a thickness of about 500 angstroms.

Another technique in certain embodiments for reducing the actuation voltage is to change the strength of the electric field created between the first electrode layer 902 and the second electrode layer 1302. The strength of the electric field can be increased by patterning the first electrode layer 902 to reduce the amount of electrically active area. In this way, the area of the interferometric modulator which forms the electrically active portion is reduced. Patterning the electrode layer 902 by decreasing the electrically active area as illustrated in FIGS. 15-19 has the effect of increasing the actuation voltage assuming all other parameters are held constant.

The actuation voltage can be further reduced in certain embodiments by selecting materials for the one or more dielectric layers 906 that have higher dielectric constants. The relationship between dielectric constant, k, and actuation voltage, V, is:

$$V \propto \frac{1}{\sqrt{k}}$$

The voltage, V, is inversely proportional to the square root of the dielectric constant, k. Thus, as the dielectric constant, k, is increased, it takes less voltage, V, to pull the second electrode layer 1302 towards the first electrode layer 902. Materials with higher dielectric constants increase the resulting electrostatic attraction between the first and second electrode layers 902, 1302.

Figure 31:
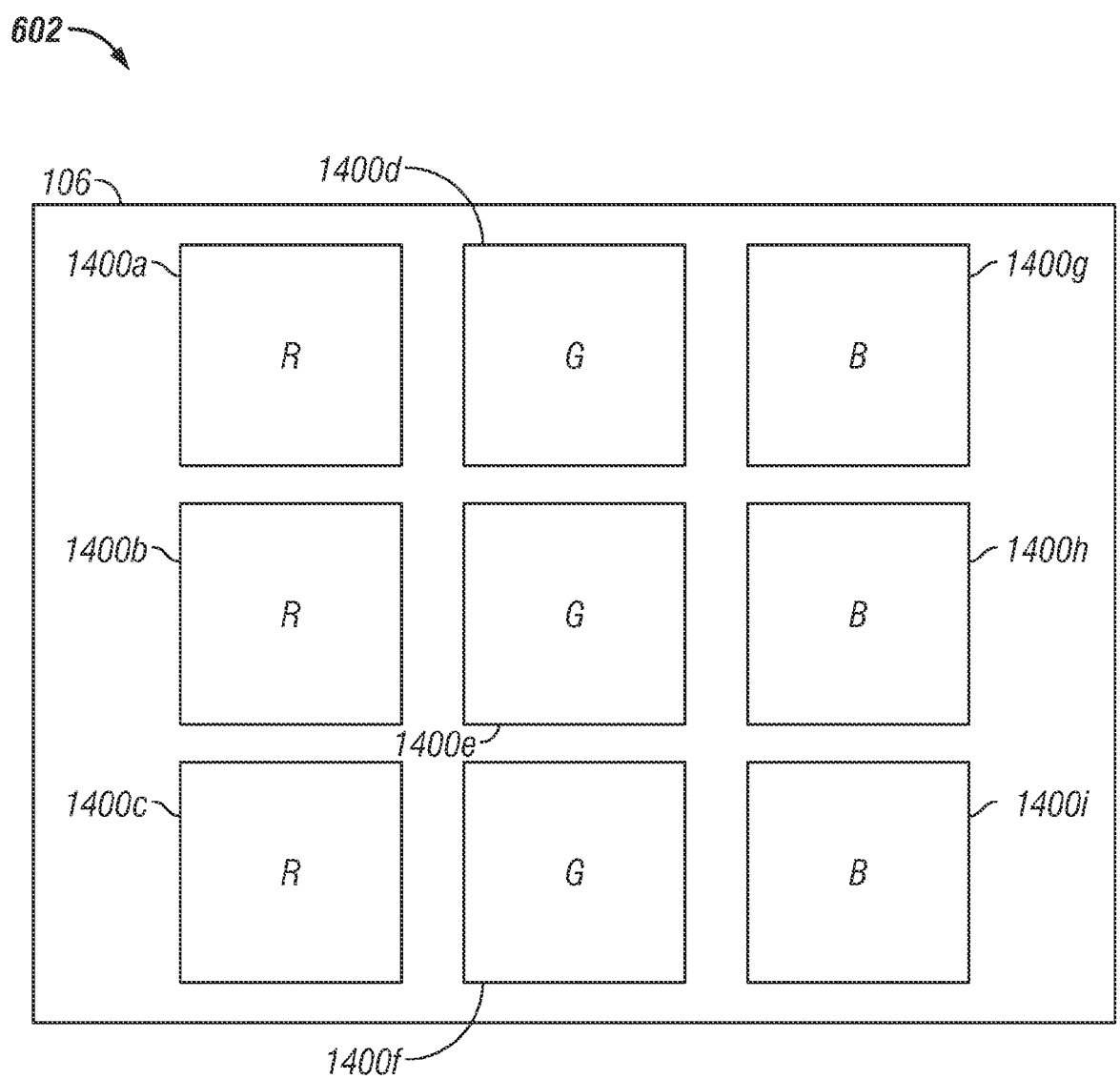
FIG. 31 shows a layout view of a pixel comprising a 3×3 array of interferometric modulators.

One possible pixel configuration 602 in accordance with certain embodiments is shown in FIG. 31. This view is as seen by the viewer from the front surface of a substrate 106, and comprises nine elements, three for each of the colors red, green, and blue. The modulators 1400a, 1400b, 1400c correspond to red, the modulators 1400d, 1400e, 1400f correspond to green, and the modulators 1400g, 1400h, 1400i correspond to blue, as shown. The array of interferometric modulators 1400a-1400i in the embodiment schematically illustrated by FIG. 31 is arranged in an N×N matrix so as to provide a display surface for an image.

Figure 32:
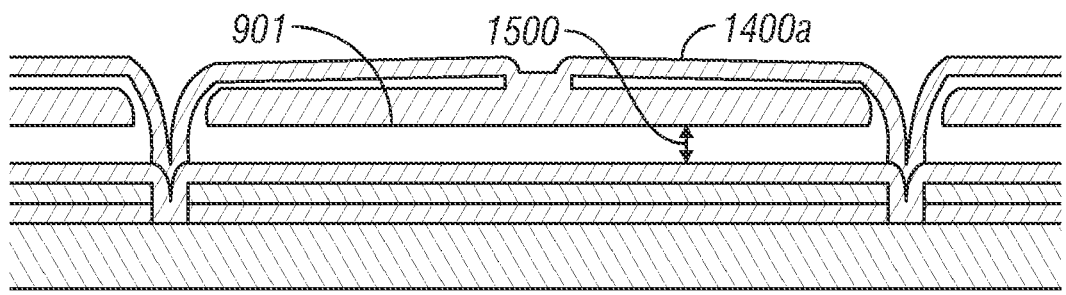
FIG. 32 shows a cross-sectional view of an embodiment of a red interferometric modulator from the array in FIG. 31.
Figure 33:
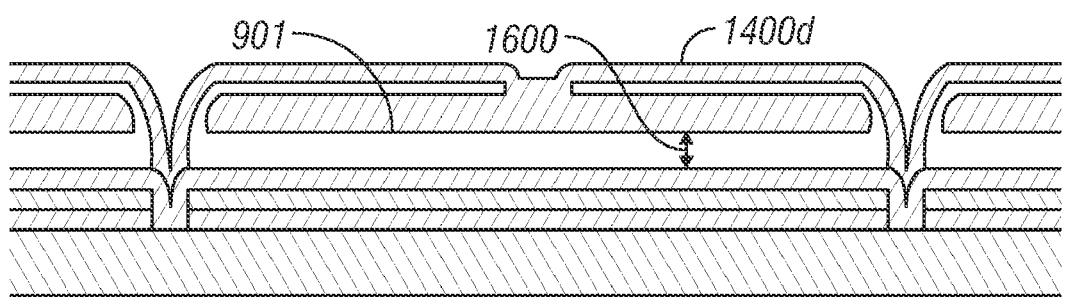
FIG. 33 shows a cross-sectional view of an embodiment of a green interferometric modulator from the array in FIG. 31.
Figure 34:
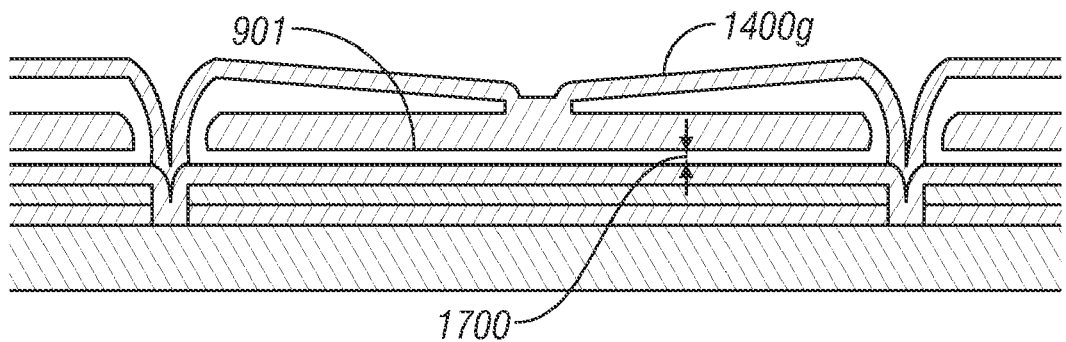
FIG. 34 shows a cross-sectional view of an embodiment of a blue interferometric modulator from the array in FIG. 31.

The three different colors (red, green, and blue) may be achieved in certain embodiments by varying the distance between the mirror and the optical stack. When a voltage is applied to the modulators, they may all move a uniform distance towards the electrode or they may all move different distances toward the electrode. Indeed, all nine modulators may traverse the entire cavity and move to a "near" position that brings them into direct contact with the substrate 106. The dimensions of the cavities in the quiescent state are shown by the vertical dimensions 1500, 1600, and 1700, in FIGS. 32, 33, and 34, respectively. In one embodiment, the vertical dimensions 1500, 1600, and 1700 are about 4,000 angstroms, about 3,000 angstroms, and about 2,000 angstroms, respectively.

Interferometric modulators are minuscule, typically 25-60 microns on a side (400-1,000 dots per inch). Therefore, in certain embodiments, many interferometric modulators elements can be ganged and driven together as a pixel or subpixel in a monochrome, color, or grayscale display. For example, each interferometer modulator can correspond to a single display pixel in a monochrome display. For color or grayscale displays, the color or intensity of each interferometric modulator in certain embodiments is determined by the size of the air gap between the optical and mechanical layers. Multiple sub-elements having different intensities or colors form a grayscale or color pixel. To create a flat panel display, a large array of interferometric modulators are fabricated in the desired format (for example, 5" full color VGA) and packaged.

The reflective surface 901 of modulator 1400a in certain embodiments may have back supports, a flex layer, and support post interfaces designed to cause the reflective surface 901 to settle at a distance 1500. The reflective surface 901 of modulator 1400d in certain embodiments may have back supports, a flex layer, and support post interfaces designed to cause the reflective surface layer to settle at a distance 1600 that is less than distance 1500. Finally, the reflective surface layer 901 of modulator 1400g in certain embodiments may have back supports, a flex layer and support post interfaces designed to cause the reflective surface layer to settle at a distance 1700 that is less than the distance 1600. In this way, controlling the mechanical properties and/or the physical restraints of the supports in certain embodiments results in three different cavity dimensions, and thus three different pixel colors are created.

Alternatively, the differing characteristics of the flex layer and supports could be manipulated to cause the reflective surface layer 901 to move different distances upon application of the same voltage. As yet another alternative, the modulators 1400a-1400i could all have the same structures, but differing voltages applied for differing colors.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. Methods for incorporating the features described above with the interferometric modulators will be readily apparent to one having ordinary skill in the art. Further, one or more of these features may be adapted to work with any of the embodiments, as well as other configurations of the interferometric modulators. As will be recognized, the present invention may be embodied within a form that does not provide all of the features and benefits set forth herein, as some features may be used or practiced separately from others.

What is claimed is:

1. A microelectromechanical (MEMS) device comprising:
    a first reflective layer;
    a movable element over the first reflective layer, the movable element comprising a deformable layer and a reflective element; and an actuation electrode between the deformable layer and the reflective element, wherein a voltage applied to the actuation electrode generates a first attractive force in a first direction on a first portion of the movable element and generates a second attractive force in a second direction on a second portion of the movable element, the second direction substantially opposite the first direction, the first attractive force greater than the second attractive force, the movable element responsive to the first and second attractive forces by moving generally in the first direction.

2. The MEMS device of claim 1, wherein the first portion of the movable element comprises the deformable layer.

3. The MEMS device of claim 1, wherein the first portion of the movable element comprises the reflective element.

4. The MEMS device of claim 1, wherein a distance between the actuation electrode and the second portion of the movable element is greater than a distance between the actuation electrode and the first portion of the movable element.

5. The MEMS device of claim 1, wherein a distance between the actuation electrode and the second portion of the movable element is at least about 10% greater than a distance between the actuation electrode and the first portion of the movable element.

6. The MEMS device of claim 1, further comprising a conductive layer between the actuation electrode and the second portion.

7. The MEMS device of claim 1, further comprising a second actuation electrode.

8. The MEMS device of claim 7, wherein the movable element is responsive to voltages applied to the second actuation electrode by moving generally in the second direction.

9. The MEMS device of claim 1, wherein the first reflective layer is spaced from the reflective element when an actuation voltage is applied to the actuation electrode.

10. The MEMS device of claim 1, further comprising:
a display;
a processor that is configured to communicate with said display, said processor being configured to process image data; and
a memory device that is configured to communicate with said processor.

11. The MEMS device of claim 10, further comprising a driver circuit configured to send at least one signal to the display.

12. The MEMS device of claim 11, further comprising a controller configured to send at least a portion of the image data to the driver circuit.

13. The MEMS device of claim 10, further comprising an image source module configured to send said image data to said processor.

14. The MEMS device of claim 13, wherein the image source module comprises at least one of a receiver, transceiver, and transmitter.

15. The MEMS device of claim 10, further comprising an input device configured to receive input data and to communicate said input data to said processor.

16. The MEMS device of claim 1, wherein the first reflective layer is partially reflective and partially transparent.

17. A microelectromechanical (MEMS) device comprising:
a first reflective layer;
a movable element over the first reflective layer, the movable element comprising a deformable layer and a reflective element; and
an actuation electrode between the deformable layer and the reflective element, wherein a lower surface of the deformable layer contacts a stationary portion of the device when an actuation voltage is applied to the actuation electrode.

18. The MEMS device of claim 17, wherein a voltage applied to the actuation electrode generates a first attractive force in a first direction on a first portion of the movable element and generates a second attractive force in a second direction on a second portion of the movable element, the second direction substantially opposite the first direction, the first attractive force greater than the second attractive force, the movable element responsive to the first and second attractive forces by moving generally in the first direction.

19. The MEMS device of claim 18, wherein the first portion of the movable element comprises the deformable layer.

20. The MEMS device of claim 18, wherein a distance between the actuation electrode and the second portion of the movable element is greater than a distance between the actuation electrode and the first portion of the movable element.

21. The MEMS device of claim 18, wherein a distance between the actuation electrode and the second portion of the movable element is at least about 10% greater than a distance between the actuation electrode and the first portion of the movable element.

22. The MEMS device of claim 18, further comprising a conductive layer between the actuation electrode and the second portion.

23. The MEMS device of claim 17, further comprising a second actuation electrode.

24. The MEMS device of claim 23, wherein the movable element is responsive to voltages applied to the actuation electrode between the deformable layer and the reflective element by moving generally in a first direction and wherein the movable element is responsive to voltages applied to the second actuation electrode by moving generally in a second direction, the second direction substantially opposite the first direction.

25. The MEMS device of claim 17, wherein the first reflective layer is spaced from the reflective element when an actuation voltage is applied to the actuation electrode.

26. The MEMS device of claim 17, wherein the first reflective layer is partially reflective and partially transparent.

27. A microelectromechanical (MEMS) device comprising:
a first reflective layer;
a movable element over the first reflective layer, the movable element comprising a deformable layer and a reflective element; and
an actuation electrode between the deformable layer and the reflective element, wherein an upper surface of the reflective element contacts a stationary portion of the device when an actuation voltage is applied to the actuation electrode.

28. The MEMS device of claim 27, wherein a voltage applied to the actuation electrode generates a first attractive force in a first direction on a first portion of the movable element and generates a second attractive force in a second direction on a second portion of the movable element, the second direction substantially opposite the first direction, the first attractive force greater than the second attractive force, the movable element responsive to the first and second attractive forces by moving generally in the first direction.

29. The MEMS device of claim 28, wherein the first portion of the movable element comprises the reflective element.

30. The MEMS device of claim 28, wherein a distance between the actuation electrode and the second portion of the movable element is greater than a distance between the actuation electrode and the first portion of the movable element.

31. The MEMS device of claim 28, wherein a distance between the actuation electrode and the second portion of the movable element is at least about 10% greater than a distance between the actuation electrode and the first portion of the movable element.

32. The MEMS device of claim 28, further comprising a conductive layer between the actuation electrode and the second portion.

33. The MEMS device of claim 27, further comprising a second actuation electrode.

34. The MEMS device of claim 33, wherein the movable element is responsive to voltages applied to the actuation electrode between the deformable layer and the reflective element by moving generally in a first direction and wherein the movable element is responsive to voltages applied to the second actuation electrode by moving generally in a second direction, the second direction substantially opposite the first direction.

35. The MEMS device of claim 27, wherein the first reflective layer is spaced from the reflective element when an actuation voltage is applied to the actuation electrode.

36. The MEMS device of claim 27, wherein the first reflective layer is partially reflective and partially transparent.

* * * * *

UNITED STATES PATENT AND TRADEMARK OFFICE
CERTIFICATE OF CORRECTION

| | |
|---|---|
| PATENT NO. | : 7,612,932 B2 |
| APPLICATION NO. | : 11/772730 |
| DATED | : November 3, 2009 |
| INVENTOR(S) | : Clarence Chui et al. |

It is certified that error appears in the above-identified patent and that said Letters Patent is hereby corrected as shown below:

On the Title Page at Item (75) Inventors, Line 6, change "Hsin-Chu" for Chih-Wei Chiang to --Hsin-Chu City--.

On the Title Page at Item (56), Line 9, under U.S. Patent Documents, change "Zahowski" to --Zayhowski--.

On the Title Page at Item (56), Page 2, Line 10, under U.S. Patent Documents, change "Kaeiyama" to --Kaeriyama--.

On the Title Page at Item (56), Page 2, Line 13, under U.S. Patent Documents, change "Goosen" to --Goossen--.

On the Title Page at Item (56), Page 2, Line 17, under U.S. Patent Documents, change "Goosen" to --Goossen--.

On the Title Page at Item (56), Page 3, Line 35, under Other Publications, change "Transcucers" to --Transducers--.

On the Title Page at Item (56), Page 3, Line 35, under Other Publications, change "1991,," to --1991,--.

On the Title Page at Item (56), Page 3, Line 25, under Other Publications, after "2008," delete "2008".

At Column 22, Line 48, after "material" insert --.--.

At Column 23, Line 39, change "itself In" to --itself. In--.

At Column 34, Line 1, change "may be also be" to --may also be--.

At Column 35, Line 1, change "on the an" to --on the--.

Signed and Sealed this

Fifteenth Day of June, 2010

David J. Kappos
*Director of the United States Patent and Trademark Office*

CERTIFICATE OF CORRECTION (continued)
U.S. Pat. No. 7,612,932 B2

At Column 39, Line 40, after " $V \propto \dfrac{1}{\sqrt{k}}$ " insert --.--.